US012593474B2

(12) United States Patent
Song et al.

(10) Patent No.: US 12,593,474 B2
(45) Date of Patent: Mar. 31, 2026

(54) SEMICONDUCTOR DEVICE INCLUDING CHANNEL STRUCTURE COMPRISING DIFFERENT COMPOSITIONS

(71) Applicant: Samsung Electronics Co., Ltd., Suwon-si (KR)

(72) Inventors: Junhwa Song, Suwon-si (KR); Changsik Kim, Suwon-si (KR); Jaewon Na, Suwon-si (KR); Deokhwan Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 287 days.

(21) Appl. No.: 18/300,579

(22) Filed: Apr. 14, 2023

(65) Prior Publication Data

US 2024/0072175 A1 Feb. 29, 2024

(30) Foreign Application Priority Data

Aug. 30, 2022 (KR) ........................ 10-2022-0108992

(51) Int. Cl.
*H10D 30/67* (2025.01)
*H10B 12/00* (2023.01)

(52) U.S. Cl.
CPC ....... *H10D 30/6755* (2025.01); *H10B 12/315* (2023.02); *H10D 30/6728* (2025.01)

(58) Field of Classification Search
CPC ........... H10D 30/6728; H10D 30/6757; H10D 30/6755; H10D 86/423; H10B 12/05;
(Continued)

(56) References Cited

U.S. PATENT DOCUMENTS 9,837,470 B2 12/2017 Oh
9,998,034 B2 6/2018 Kwon et al.
(Continued)

FOREIGN PATENT DOCUMENTS

CN 111162074 A 5/2020
CN 113056829 A 6/2021
(Continued)

OTHER PUBLICATIONS

Extended European Search Report corresponding to EP Patent Application No. 23187286.2 (10 pages) (Feb. 7, 2024).
(Continued)

*Primary Examiner* — Didarul A Mazumder
(74) *Attorney, Agent, or Firm* — Wolf, Greenfield & Sacks, P.C.

(57) ABSTRACT

A semiconductor device includes an upper conductive line on a substrate, a channel structure adjacent the upper conductive line, a gate dielectric film between the channel structure and the upper conductive line, and a conductive contact pattern electrically connected to the channel structure. The channel structure includes a main channel portion including an oxide semiconductor layer having a first composition, and a channel contact portion between the main channel portion and the conductive contact pattern. The channel contact portion is in contact with the conductive contact pattern and includes a material having a second composition that is different from the first composition.

20 Claims, 52 Drawing Sheets

(58) Field of Classification Search
   CPC .. H10B 12/315; H10B 12/0335; H10B 12/30;
                                     H10B 12/50
   USPC ........................ 257/43; 438/85, 86, 104, 754
   See application file for complete search history.

(56)                   References Cited

U.S. PATENT DOCUMENTS

| | | | |
|---|---|---|---|
| 11,398,571 | B2 | 7/2022 | Ramaswamy et al. |
| 2012/0153379 | A1 | 6/2012 | Kim et al. |
| 2018/0294353 | A1* | 10/2018 | Cantoro ............... H10D 62/292 |
| 2020/0111917 | A1* | 4/2020 | Ramaswamy ..... H10D 30/6757 |
| 2021/0183864 | A1 | 6/2021 | Ramaswamy |
| 2022/0028903 | A1* | 1/2022 | Lee ........................ H10D 86/60 |
| 2022/0068722 | A1* | 3/2022 | Calabrese ............ H10D 30/025 |
| 2022/0223732 | A1* | 7/2022 | Ryu ....................... H10B 12/05 |
| 2022/0223734 | A1 | 7/2022 | Yoon |

FOREIGN PATENT DOCUMENTS

| | | |
|---|---|---|
| KR | 101407489 B1 | 6/2014 |
| KR | 101411337 B1 | 6/2014 |
| KR | 10-2015-0053628 A | 5/2015 |
| KR | 10-2019-0032718 A | 3/2019 |
| KR | 10-2022-0102242 A | 7/2022 |
| KR | 20220101861 A | 7/2022 |

OTHER PUBLICATIONS

Fujiwara et al. "Surrounding Gate Vertical-Channel FET With a Gate Length of 40 nm Using BEOL-Compatible High-Thermal-Tolerance In—Al—Zn Oxide Channel" IEEE Transactions on Electron Devices 67(12):5329-5335 (Dec. 2020).
Sato et al. "Source/Drain Contact Engineering of InGaZnO Channel BEOL Transistor for Low Contact Resistance and Suppressing Channel Shortening Effect" 2021 20th International Workshop on Junction Technology (IWJT) (Jun. 2021).

* cited by examiner

B – B'

A – A'

B – B'

A – A'

110H

106G — 120L
106F — BL
— SL
106E — P3
106D — M2
106C — P2
— M1
106B — P1
— 106A
— C2 } 104
— C1
PCA
— 102

B − B'

Z
Y ⊗ → X

B – B'

A – A'

B – B'

A – A'

A – A'

A – A'

A – A'

SEMICONDUCTOR DEVICE INCLUDING CHANNEL STRUCTURE COMPRISING DIFFERENT COMPOSITIONS

CROSS-REFERENCE TO RELATED APPLICATION

This application is based on and claims priority under 35 U.S.C. § 119 to Korean Patent Application No. 10-2022-0108992, filed on Aug. 30, 2022, in the Korean Intellectual Property Office, the disclosure of which is incorporated by reference herein in its entirety.

FIELD

The inventive concept relates to a semiconductor device, and more particularly, to a semiconductor device including a channel structure.

BACKGROUND

Due to the development of electronics technology, the downscaling of semiconductor devices has rapidly progressed. Thus, a transistor including a channel layer adopting an oxide semiconductor material has been proposed to reduce leakage current through a channel region.

SUMMARY

The inventive concept provides a semiconductor device of which reliability is improved by reducing contact resistance between a channel structure and a conductive contact pattern in contact with the channel structure in a transistor including the channel structure adopting an oxide semiconductor material.

According to an aspect of the inventive concept, there is provided a semiconductor device includes an upper conductive line on a substrate, a channel structure adjacent the upper conductive line, a gate dielectric film between the channel structure and the upper conductive line, and a conductive contact pattern electrically connected to the channel structure. The channel structure includes a main channel portion including an oxide semiconductor layer having a first composition, and a channel contact portion between the main channel portion and the conductive contact pattern. The channel contact portion is in contact with the conductive contact pattern and includes a material having a second composition that is different from the first composition.

According to another aspect of the inventive concept, there is provided a semiconductor device including a plurality of lower conductive lines extending in parallel on a substrate; a mold insulating pattern on the plurality of lower conductive lines, the mold insulating pattern defining a transistor region extending along a first lateral direction; a plurality of channel structures aligned along the first lateral direction in the transistor region, each of the plurality of channel structures comprising a vertical channel portion extending along a sidewall of the mold insulating pattern; an upper conductive line on the plurality of channel structures in the transistor region, the upper conductive line having a sidewall facing the vertical channel portion of each of the plurality of channel structures, the upper conductive line extending along the first lateral direction; a gate dielectric film between the plurality of channel structures and the upper conductive line; and a plurality of conductive contact patterns electrically connected to the vertical channel portions of the plurality of channel structures, respectively. The vertical channel portions of the plurality of channel structures respectively comprise a main channel portion in contact with a respective lower conductive line among the plurality of lower conductive lines, the main channel portion comprising an oxide semiconductor layer having a first composition; and a channel contact portion between the main channel portion and a respective conductive contact pattern among the plurality of conductive contact patterns, wherein the channel contact portion is in contact with the respective conductive contact pattern and comprises a material having a second composition that is different from the first composition.

According to another aspect of the inventive concept, there is provided a semiconductor device including a peripheral circuit region on a substrate, the peripheral circuit region including a plurality of peripheral circuits, a lower conductive line on the peripheral circuit region, the lower conductive line being electrically connected to the plurality of peripheral circuits, a mold insulating pattern on the lower conductive line, the mold insulating pattern having a sidewall defining a transistor region, a channel structure in the transistor region, the channel structure including a bottom surface in contact with a top surface of the lower conductive line and a vertical channel portion adjacent the sidewall of the mold insulating pattern, a gate dielectric film on the channel structure in the transistor region, an upper conductive line on the gate dielectric film in the transistor region, the upper conductive line having a sidewall adjacent the vertical channel portion, and a conductive contact pattern electrically connected to the vertical channel portion, wherein the vertical channel portion of the channel structure includes a main channel portion spaced apart from the conductive contact pattern, the main channel portion including an oxide semiconductor layer having a first composition, and a channel contact portion in contact with the conductive contact pattern and including a material having a second composition that is different from the first composition.

BRIEF DESCRIPTION OF THE DRAWINGS

Embodiments of the inventive concept will be more clearly understood from the following detailed description taken in conjunction with the accompanying drawings in which:

FIGS. 11A to 19B are diagrams of a process sequence of a method of manufacturing a semiconductor device, according to embodiments, wherein FIGS. 11A, 12A, 13A, 14A, and 15A are plan layout diagrams of some components, which illustrate a process sequence of the method of manufacturing the semiconductor device, FIGS. 16B, 17B, 18B, and 19B are respectively enlarged cross-sectional views of portions "EX1" of FIGS. 16A, 17A, 18A, and 19A;

FIGS. 20A to 24B are diagrams of a process sequence of a method of manufacturing a semiconductor device, according to embodiments, wherein FIG. 20A is a plan layout diagram of the method of manufacturing the semiconductor device, FIGS. 21B, 22B, 23B, and 24B are respectively enlarged cross-sectional views of portions "EX3" of FIGS. 21A, 22A, 23A, and 24A; and FIGS. 25A to 26B are diagrams of a process sequence of a method of manufacturing a semiconductor device, according to embodiments, wherein FIGS. 25A and 26A are cross-sectional views of a region corresponding to a cross-section taken along line A-A' of FIG. 1, according to the process sequence, and FIGS. 25B and 26B are respectively enlarged cross-sectional views of portions "EX4" of FIGS. 25A and 26A.

DETAILED DESCRIPTION OF EMBODIMENTS

Figure 1:
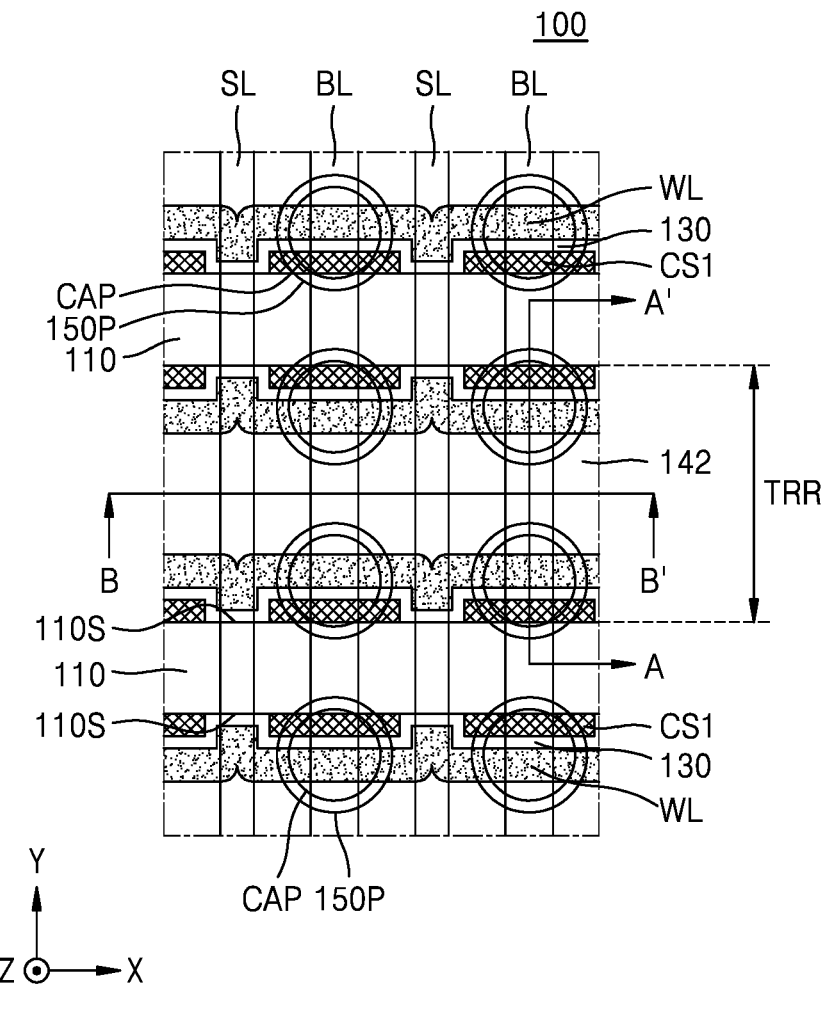
FIG. 1 is a plan layout diagram of some components of a semiconductor device according to embodiments.

Hereinafter, embodiments will be described in detail with reference to the accompanying drawings. The same reference numerals are used to denote the same elements in the drawings, and repeated descriptions thereof are omitted.

Figure 2A:
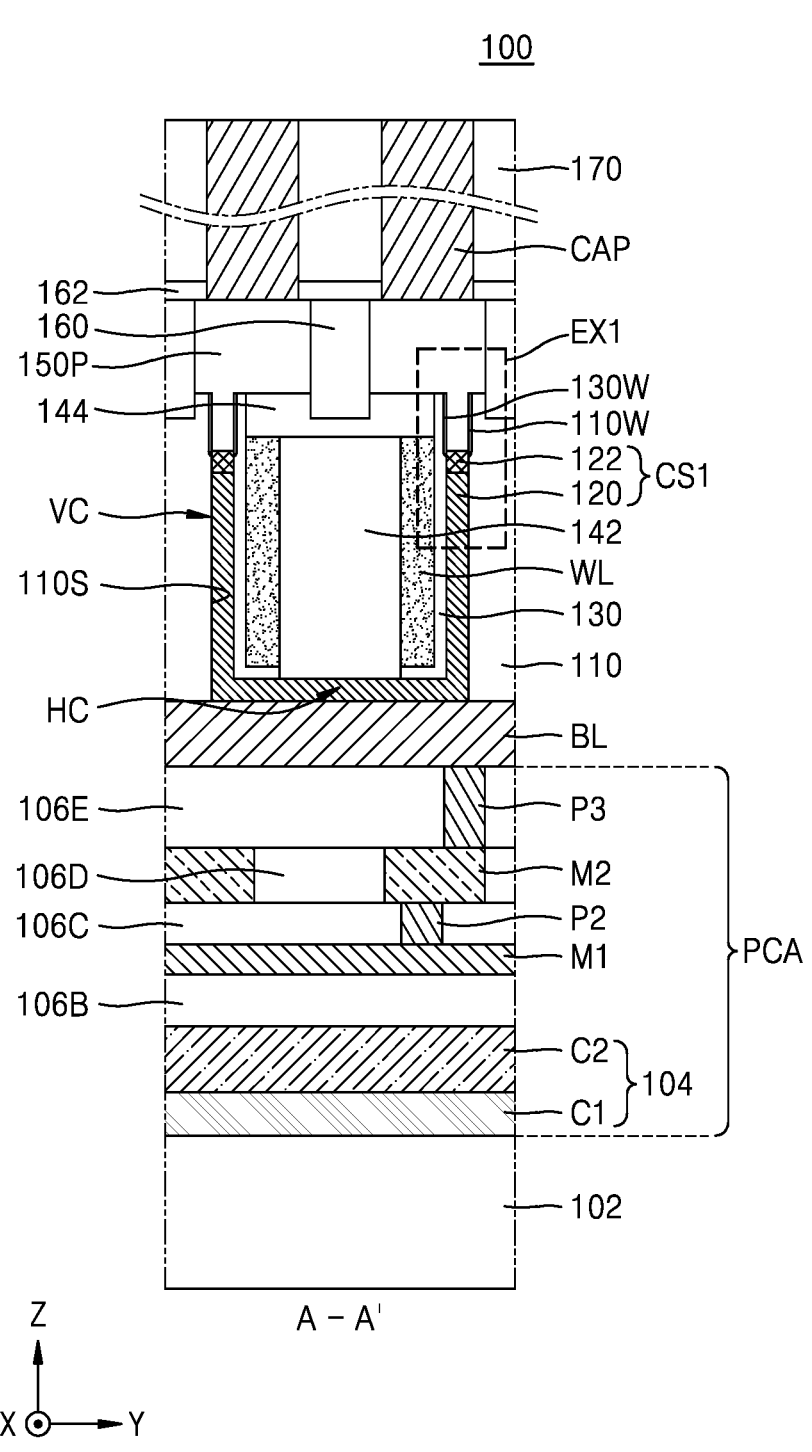
FIG. 2A is a cross-sectional view taken along line A-A' of FIG. 1.
Figure 2B:
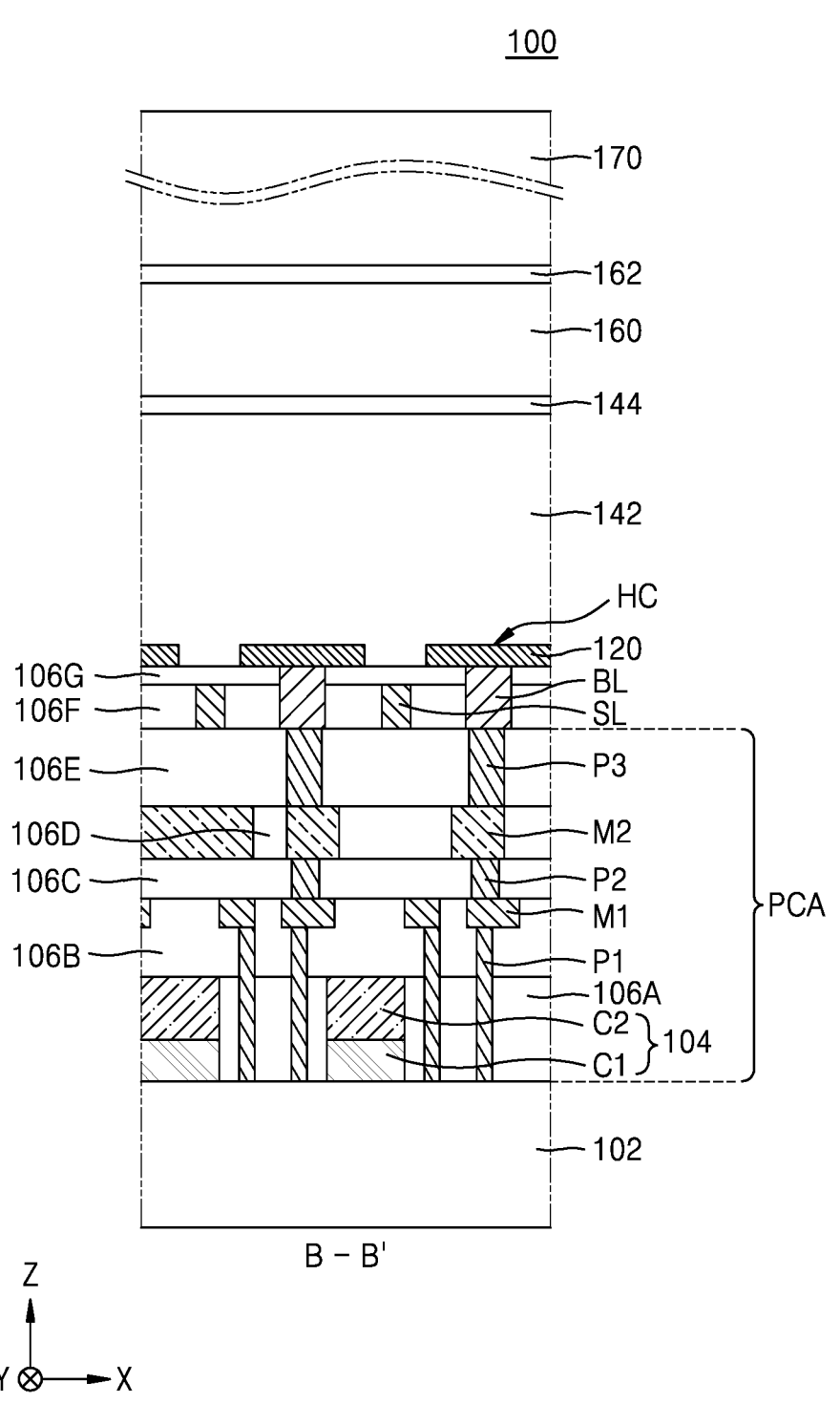
FIG. 2B is a cross-sectional view taken along line B-B' of FIG. 1.
Figure 2C:
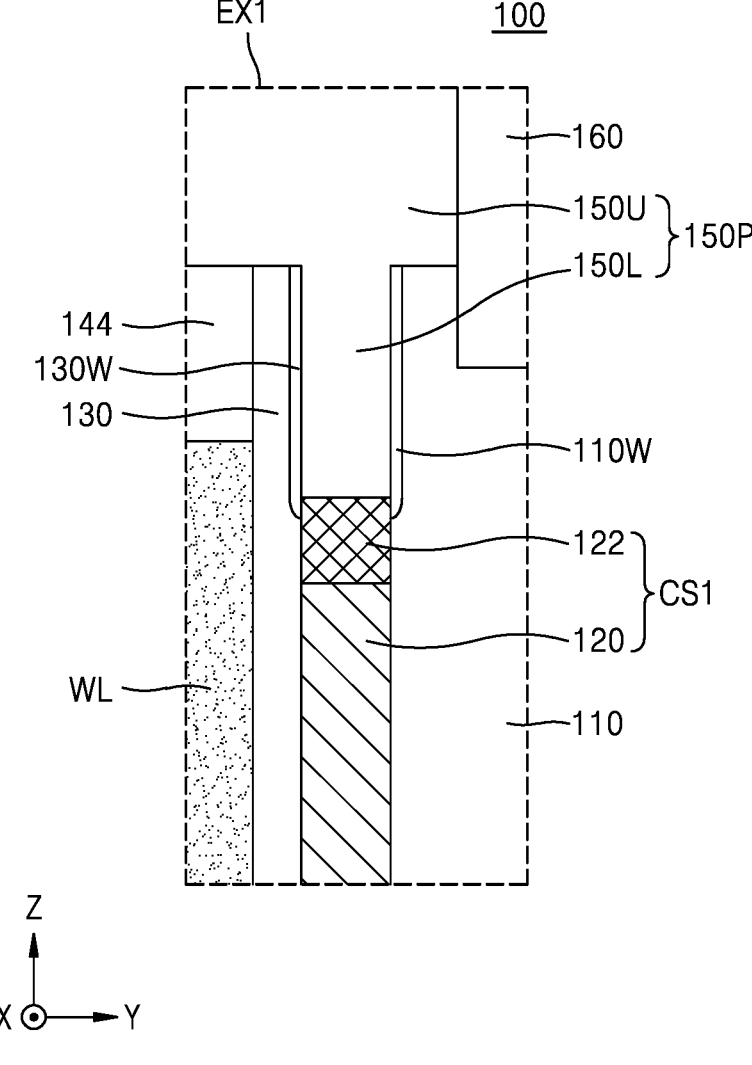
FIG. 2C is an enlarged cross-sectional view of portion "EX1" of FIG. 2A.

FIG. 1 is a plan layout diagram of some components of a semiconductor device 100 according to embodiments. FIG. 2A is a cross-sectional view taken along line A-A' of FIG. 1, and FIG. 2B is a cross-sectional view taken along line B-B' of FIG. 1. FIG. 2C is an enlarged cross-sectional view of portion "EX1" of FIG. 2A.

Referring to FIGS. 1 and 2A to 2C, the semiconductor device 100 may include a substrate 102, a peripheral circuit structure PCA including a plurality of peripheral circuits on the substrate 102, and a plurality of bit lines BL and a plurality of shielding structures SL on the peripheral circuit structure PCA.

In embodiments, the substrate 102 may include silicon, for example, single crystalline silicon, polycrystalline silicon, or amorphous silicon. In other embodiments, the substrate 102 may include at least one selected from germanium (Ge), silicon germanium (SiGe), silicon carbide (SiC), gallium arsenide (GaAs), indium arsenide (InAs), and indium phosphide (InP). In embodiments, the substrate 102 may include a conductive region, for example, a doped well or a doped structure.

Each of the plurality of bit lines BL may be connected to at least one of the plurality of peripheral circuits included in the peripheral circuit structure PCA. Elements referred to herein as "connected to" may be electrically and/or physically connected. Each of the plurality of shielding structures SL may be floated, that is, in an electrically floating state. The plurality of bit lines BL and the plurality of shielding structures SL may be insulated from each other by an interlayer insulating film 106F. The plurality of shielding structures SL may be covered by an interlayer insulating film 106G, and the plurality of bit lines BL may pass through the interlayer insulating films 106F and 106G in a vertical direction (Z direction). The plurality of bit lines BL may be connected to the peripheral circuits included in the peripheral circuit structure PCA through a plurality of conductive plugs (e.g., P1, P2, and P3) included in the peripheral circuit structure PCA and some selected from a plurality of wiring layers (e.g., M1 and M2).

The peripheral circuit structure PCA may include a plurality of core circuits 104. The plurality of core circuits 104 may include a first conductive pattern C1 and a second conductive pattern C2, which are sequentially on the substrate 102. The terms "first," "second," etc., may be used herein merely to distinguish one element or layer from another. The first conductive pattern C1 and the second conductive pattern C2 may constitute various circuit elements, which are on the peripheral circuit structure PCA to control the functions of the semiconductor device 100. In embodiments, the peripheral circuit structure PCA may further include various active elements (e.g., transistors) and various passive elements (e.g., capacitors, resistors, and inductors). The terms "comprises," "comprising," "includes" and/or "including," when used herein, specify the presence of stated elements, but do not preclude the presence of additional elements.

In embodiments, the plurality of peripheral circuits in the peripheral circuit structure PCA may include a sub-word line driver block SWD, a sense amplifier block S/A, and/or a control logic, without being limited thereto. The term "and/or" includes any and all combinations of one or more of the associated listed items. The plurality of peripheral circuits in the peripheral circuit structure PCA may include an NMOS transistor and a PMOS transistor. The plurality of peripheral circuits may be electrically connected to conductive lines (e.g., a plurality of bit lines BL), which are on the peripheral circuit structure PCA, through the plurality of conductive plugs (e.g., P1, P2, and P3), and the plurality of wiring layers (e.g., M1 and M2).

In the peripheral circuit structure PCA, of the plurality of core circuits 104, the plurality of conductive plugs (e.g., P1, P2, and P3), and the plurality of wiring layers (e.g., M1 and M2), portions that need to be insulated from each other may maintain a required insulation distance apart from each other by a plurality of interlayer insulating films (e.g., 106A, 106B, 106C, 106D, and 106E). Each of the plurality of interlayer insulating films (e.g., 106A, 106B, 106C, 106D, and 106E) may include an oxide film, a nitride film, or a combination thereof, without being limited thereto.

In embodiments, the peripheral circuit structure PCA on the substrate 102 may be omitted. In this case, the peripheral circuit structure PCA may be in another region apart from the region shown in FIGS. 2A and 2B on the substrate 102. In other embodiments, the peripheral circuit structure PCA may be in a region that is spaced apart from a cell array region including a transistor region or a boundary thereof (refer to TRR in FIG. 1) in a lateral direction.

The plurality of bit lines BL and the plurality of shielding structures SL may be spaced apart from each other in a first lateral direction (X direction) on the substrate 102 and extend long in a second lateral direction (Y direction) that is perpendicular to the first lateral direction (X direction). The plurality of bit lines BL and the plurality of shielding structures SL may extend parallel to each other in the second lateral direction (Y direction). In embodiments, each of the plurality of bit lines BL may include titanium (Ti), titanium nitride (TiN), tantalum (Ta), tantalum nitride (TaN), molybdenum (Mo), ruthenium (Ru), tungsten (W), tungsten nitride (WN), cobalt (Co), nickel (Ni), titanium silicide (TiSi), titanium silicon nitride (TiSiN), tungsten silicide (WSi), tungsten silicon nitride (WSiN), tantalum silicide (TaSi), tantalum silicon nitride (TaSiN), ruthenium titanium nitride (RuTiN), cobalt silicide (CoSi), nickel silicide (NiSi), polysilicon, or a combination thereof, without being limited thereto. As used herein, the bit line BL may be referred to as a lower conductive line. In embodiments, each of the plurality of shielding structures SL may include tungsten (W), aluminum (Al), copper (Cu), or a combination thereof, without being limited thereto. In embodiments, each of the plurality of shielding structures SL may include a conductive film and an air gap or a void in the conductive film. The conductive film may include W, Al, Cu, or a combination thereof.

A mold insulating pattern 110 may be on the plurality of bit lines BL and the plurality of shielding structures SL. The mold insulating pattern 110 may have a sidewall 110S defining the transistor region (refer to TRR in FIG. 1). Each of the mold insulating pattern 110 and the transistor region TRR, which is defined by the sidewall 110S in the mold insulating pattern 110, may extend long in the first lateral direction (X direction). The mold insulating pattern 110 may include a silicon oxide film, a silicon nitride film, or a combination thereof.

As shown in FIGS. 1 and 2A, in the transistor region TRR, a plurality of channel structures CS1 may be arranged in a line in or aligned along the first lateral direction (X direction). Each of the plurality of channel structures CS1 may include a vertical channel portion VC facing the sidewall 110S of the mold insulating pattern 110 and a lateral channel portion HC in contact with a top surface of the bit line BL. When elements or layers are referred to herein as being "directly on" or "in direct contact with" one another, no intervening elements or layers are present.

In each of the plurality of channel structures CS1, the vertical channel portion VC may be in contact with the sidewall 110S of the mold insulating pattern 110 and extend long from the lateral channel portion HC in the vertical direction (Z direction).

Each of the plurality of channel structures CS1 may include a main channel portion 120 and a channel contact portion 122 on an uppermost surface of the main channel portion 120. In the channel structure CS1, a portion of the vertical channel portion VC and the lateral channel portion HC may include the main channel portion 120. In the channel structure CS1, an end portion of the vertical channel portion VC, which is farthest from the substrate 102, may include the channel contact portion 122. The channel contact portion 122 may be at an uppermost portion of the vertical channel portion VC.

A plurality of transistors including the plurality of channel structures CS1 may be in the transistor region TRR. The plurality of transistors may include two transistors, which face each other in the second lateral direction that is perpendicular to the first lateral direction (X direction). The two transistors may share a selected one of the plurality of channel structures CS1 therebetween.

In each of the plurality of channel structures CS1, the main channel portion 120 may be in contact with a top surface of a selected one of the plurality of bit lines BL. The main channel portion 120 may include an oxide semiconductor layer having a first composition, and the channel contact portion 122 may include a material having a second composition. The second composition may be different from the first composition.

In embodiments, the oxide semiconductor layer included in the main channel portion 120 may include indium gallium zinc oxide (InGaZnO or IGZO), tin-doped IGZO (Sn-IGZO), indium tungsten oxide (InWO or IWO), indium zinc oxide (InZnO or IZO), zinc tin oxide (ZnSnO or ZTO), zinc oxide (ZnO), yttrium-doped zinc oxide (YZO), indium gallium silicon oxide (InGaSiO or IGSO), indium (InO), tin oxide (SnO), titanium oxide (TiO), zinc oxynitride (ZnON), magnesium zinc oxide (MgZnO), zirconium indium zinc oxide (ZrInZnO), hafnium indium zinc oxide (HfInZnO), tin indium zinc oxide (SnInZnO), silicon indium zinc oxide (SiInZnO), gallium zinc tin oxide (GaZnSnO), zirconium zinc tin oxide (ZrZnSnO), or a combination thereof. For example, the main channel portion 120 may include IGZO.

In embodiments, the channel contact portion 122 may include the same elements as those of the oxide semiconductor layer included in the main channel portion 120, and further includes at least one dopant selected from aluminum (Al), boron (B), arsenic (As), fluorine (F), and hydrogen (H).

In other embodiments, the channel contact portion 122 may include a second oxide semiconductor material, which has a different composition from a first oxide semiconductor material included in the main channel portion 120, and further includes at least one dopant selected from aluminum (Al), boron (B), arsenic (As), fluorine (F), and hydrogen (H). Each of the first oxide semiconductor material and the second oxide semiconductor material may include IGZO, Sn-IGZO, IWO, IZO, ZTO, ZnO, YZO, IGSO, InO, SnO, TiO, ZnON, MgZnO, ZrInZnO, HfInZnO, SnInZnO, SiInZnO, GaZnSnO, ZrZnSnO, or a combination thereof. In embodiments, the first oxide semiconductor material and the second oxide semiconductor material may include respectively different materials, each of which is selected from the materials described above. In other embodiments, the main channel portion 120 may include IGZO, and the channel contact portion 122 may include indium aluminum zinc oxide (IAZO).

As shown in FIGS. 1 and 2A, a gate dielectric film 130 covering the channel structure CS1 and a plurality of word lines WL covering the gate dielectric film 130 may be in the transistor region TRR. The plurality of word lines WL may extend long and parallel to each other in the first lateral direction (X direction). FIGS. 1 and 2A illustrate a configuration in which two word lines WL are in one transistor region TRR. As used herein, the word line WL may be referred to as an upper conductive line. In the transistor region TRR, the one word line WL may be in contact with the one gate dielectric film 130, and the one word line WL may face the plurality of channel structures CS1 with the one gate dielectric film 130 therebetween.

As shown in FIG. 1, each of the plurality of word lines WL may include a first portion and a second portion. The first portion may face the channel structure CS1 with the gate dielectric film 130 therebetween. The second portion may face the mold insulating pattern 110 with only the gate dielectric film 130 therebetween without the channel structure CS1. In each of the plurality of word lines WL, the second portion may be closer to the mold insulating pattern 110 than the first portion in the second lateral direction (Y direction).

As shown in FIG. 2A, the bit line BL may be spaced apart from the word line WL with the channel structure CS1 and the gate dielectric film 130 therebetween in the vertical direction (Z direction). The bit line BL may have a top surface in contact with the main channel portion 120 of the channel structure CS1.

In the transistor region TRR, the channel structure CS1 may face one surface of each of each of two word lines WL in the transistor region TRR. The gate dielectric film 130 may include portions in contact with the plurality of channel structures CS1 and portions in contact with a sidewall 110S of the mold insulating pattern 110. The gate dielectric film 130 may include portions between the one surface of each of the two word lines WL and the vertical channel portion VC of the channel structure CS1 and portions between a bottom surface of each of the two word lines WL and the lateral channel portion HC of the channel structure CS1.

The gate dielectric film 130 may be between the channel structure CS1 and the word line WL. An uppermost surface of the channel structure CS1 may be closer to the substrate 102 than an uppermost surface of each of the gate dielectric film 130, the plurality of word lines WL, and the mold insulating pattern 110.

In embodiments, the gate dielectric film 130 may have a high-k dielectric film having a higher dielectric constant than a silicon oxide film. In embodiments, the gate dielectric film 130 may include at least one material selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconate titanate (PZT), strontium bismuth tantalate (STB), bismuth iron oxide (BFO), strontium titanium oxide (SrTiO), yttrium oxide (YO), aluminum oxide (AlO), and lead scandium tantalum oxide (PbScTaO). Each of the plurality of word lines WL may include Ti, TiN, Ta, TaN, Mo, Ru, W, WN, TiSiN, WSiN, polysilicon, or a combination thereof.

A lower insulating partition wall 142 may be on the channel structure CS1 between the two word lines WL located in the one transistor region TRR. A top surface of each of the two word lines WL and a top surface of the lower insulating partition wall 142 may be covered by an upper insulating partition wall 144. In the second lateral direction (Y direction), a width of the upper insulating partition wall 144 may be greater than a width of the lower insulating partition wall 142. Each of the lower insulating partition wall 142 and the upper insulating partition wall 144 may include a silicon oxide film, a silicon nitride film, or a combination thereof.

A plurality of conductive contact patterns 150P may be on the plurality of channel structures CS1. Each of the plurality of conductive contact patterns 150P may be connected to a selected one of the plurality of channel structures CS1.

As shown in FIG. 1, the plurality of conductive contact patterns 150P may be regularly arranged a predetermined distance apart from each other in the first lateral direction (X direction) and the second lateral direction (Y direction). FIG. 1 illustrates an example in which the plurality of conductive contact patterns 150P are arranged in a matrix or array form on a plane (e.g., X-Y plane) on the substrate 102, but the inventive concept is not limited thereto. For example, the plurality of conductive contact patterns 150P may be arranged in a honeycomb structure or pattern on the plane (e.g., X-Y plane) on the substrate 102. The plurality of conductive contact patterns 150P may be insulated from each other by an isolation insulating film 160.

The main channel portion 120 of the channel structure CS1 may be spaced apart from the conductive contact pattern 150P. The channel contact portion 122 may be between the main channel portion 120 and the conductive contact pattern 150P. Each of the plurality of conductive contact patterns 150P may be spaced apart from the main channel portion 120 in the vertical direction (Z direction). Each of the plurality of conductive contact patterns 150P may have a surface in contact with the channel contact portion 122.

The plurality of conductive contact patterns 150P may be spaced apart from the word line WL by the gate dielectric film 130. As shown in FIG. 2C, each of the plurality of conductive contact patterns 150P may include a lower contact portion 150L and an upper pad portion 150U. The lower contact portion 150L may be between the gate dielectric film 130 and the mold insulating pattern 110. The upper pad portion 150U may be on the lower contact portion 150L and integrally connected to the lower contact portion 150L. The lower contact portion 150L of each of the plurality of conductive contact patterns 150P may have a sidewall facing the gate dielectric film 130, a sidewall facing the mold insulating pattern 110, and a bottom surface in contact with a top surface of the channel contact portion 122. The upper pad portion 150U of each of the plurality of conductive contact patterns 150P may cover a top surface of each of the gate dielectric film 130, the mold insulating pattern 110, and the upper insulating partition wall 144.

Each of the plurality of conductive contact patterns 150P may include a metal-containing film. In embodiments, each of the plurality of conductive contact patterns 150P may include Ti, TiN, Ta, TaN, Mo, Ru, W, WN, TiSiN, WSiN, or a combination thereof. For example, each of the plurality of conductive contact patterns 150P may have a stack structure of a conductive barrier including TiN and a conductive film including W.

The gate dielectric film 130 may include a dielectric film barrier liner 130W in contact with the lower contact portion 150L of the conductive contact pattern 150P. The dielectric film barrier liner 130W may include a material constituting the gate dielectric film 130 and further include a dopant selected from aluminum (Al), boron (B), arsenic (As), fluorine (F), and hydrogen (H). In embodiments, the dielectric film barrier liner 130W may include a metal oxide film including a dopant selected from aluminum (Al), boron (B), arsenic (As), fluorine (F), and hydrogen (H). The dielectric film barrier liner 130W may act as a barrier capable of suppressing an undesired reaction of a metal (e.g., tungsten) included in the conductive contact pattern 150P with a material (e.g., oxygen atoms) included in the gate dielectric film 130.

The mold insulating pattern 110 may include a mold barrier liner 110W in contact with the lower contact portion 150L of the conductive contact pattern 150P. The mold barrier liner 110W may include a material constituting the mold insulating pattern 110 and further include a dopant selected from aluminum (Al), boron (B), arsenic (As), fluorine (F), and hydrogen (H). In embodiments, the mold barrier liner 110W may include a silicon oxide film including the dopant, a silicon nitride film including the dopant, or a combination thereof. The mold barrier liner 110W may act as a barrier capable of suppressing an undesired reaction of a metal (e.g., tungsten) included in the conductive contact pattern 150P with a material (e.g., oxygen atoms) included in the mold barrier liner 110W or in the mold insulating pattern 110.

The semiconductor device 100 may further include a plurality of capacitor structures CAP on the plurality of conductive contact patterns 150P. An etch stop film 162 and an interlayer insulating film 170 may be sequentially stacked on the plurality of conductive contact patterns 150P and the isolation insulating film 160. Each of the plurality of capacitor structures CAP may be connected to a selected one of the plurality of conductive contact patterns 150P by passing through the interlayer insulating film 170 and the etch stop film 162 in the vertical direction (Z direction). The etch stop film 162 may include a silicon nitride film, and the interlayer insulating film 170 may include a silicon oxide film.

Figure 3A:
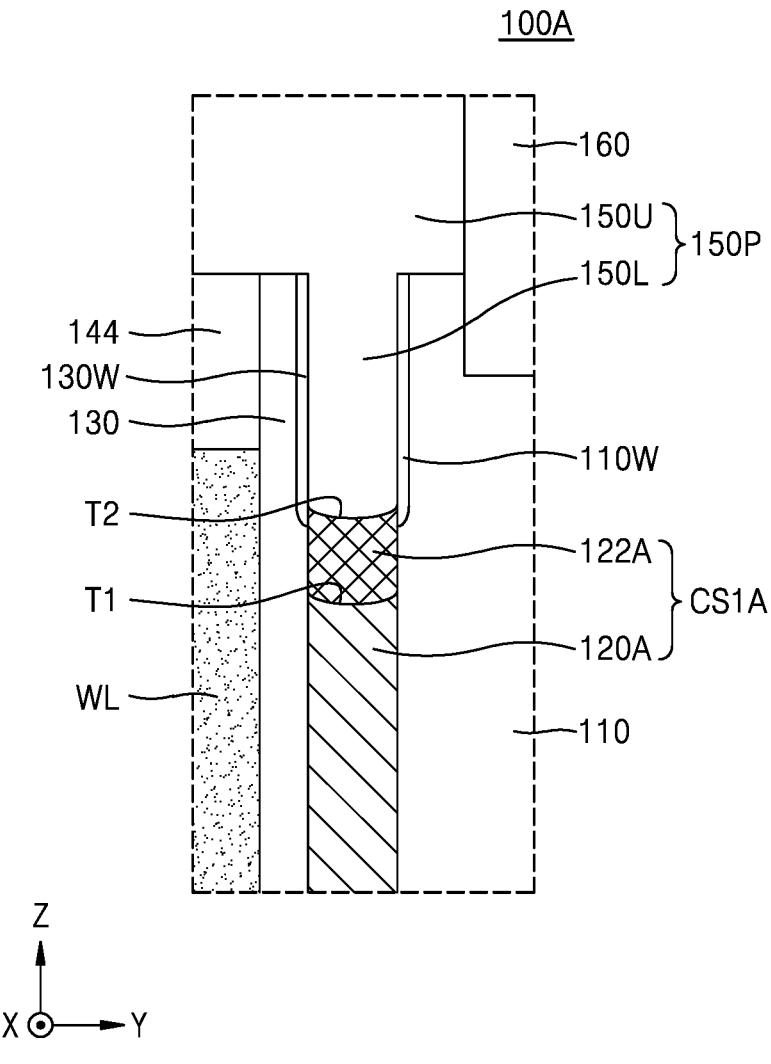
FIG. 3A is a cross-sectional view of a semiconductor device according to embodiments.

FIG. 3A is a cross-sectional view of a semiconductor device 100A according to embodiments. FIG. 3A illustrates an enlarged cross-sectional configuration of a portion corresponding to portion "EX1" of FIG. 2A. In FIG. 3A, the same reference numerals are used to denote the same elements as in FIGS. 1 and 2A to 2C, and repeated descriptions thereof are omitted here.

Referring to FIG. 3A, the semiconductor device 100A may substantially have the same configuration as the semiconductor device 100 described with reference to FIGS. 1 and 2A to 2C. However, the semiconductor device 100A may include a channel structure CS1A between a gate dielectric film 130 and a mold insulating pattern 110. The channel structure CS1A may include a main channel portion 120A and a channel contact portion 122A on an uppermost surface of the main channel portion 120A. The main channel portion 120A and the channel contact portion 122A may respectively have concave top surfaces T1 and T2, which are concave toward a conductive contact pattern 150P. Details of the main channel portion 120A and the channel contact portion 122A may substantially be the same as those of the main channel portion 120 and the channel contact portion 122, which have been described with reference to FIGS. 1 and 2A to 2C.

Figure 3B:
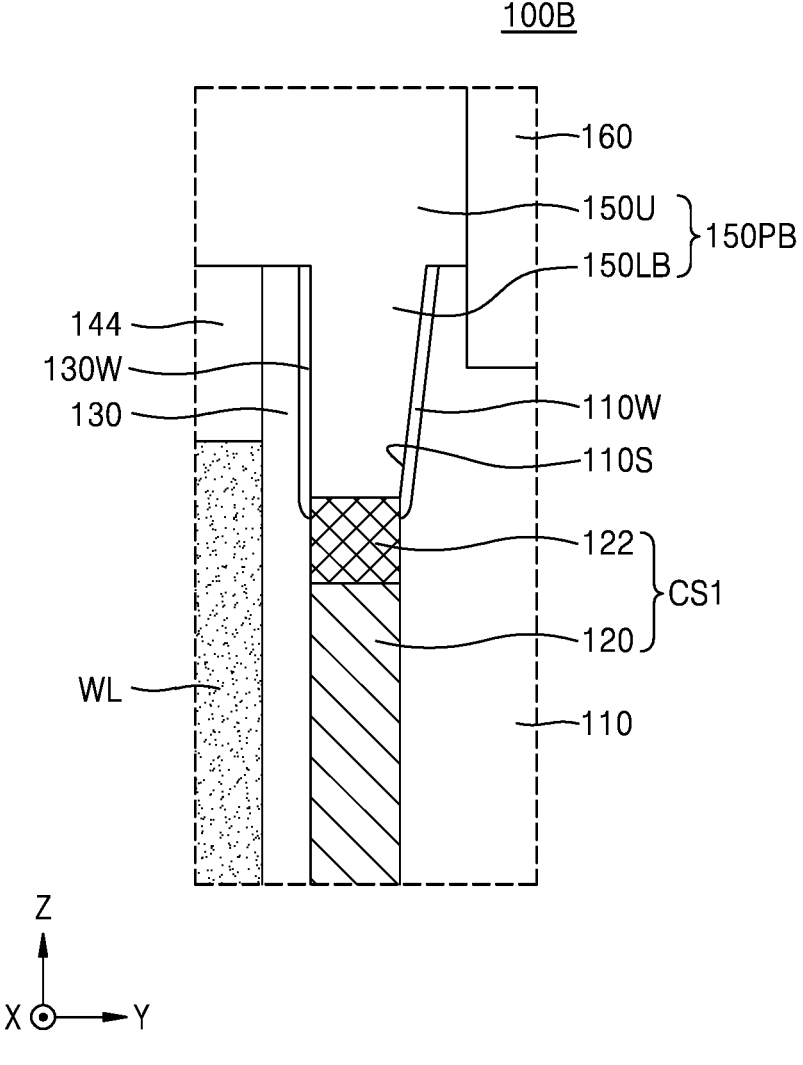
FIG. 3B is a cross-sectional view of a semiconductor device according to embodiments.

FIG. 3B is a cross-sectional view of a semiconductor device 100B according to embodiments. FIG. 3B illustrates an enlarged cross-sectional configuration of a portion corresponding to portion "EX1" of FIG. 2A. In FIG. 3B, the same reference numerals are used to denote the same elements as in FIGS. 1 and 2A to 2C, and repeated descriptions thereof are omitted here.

Referring to FIG. 3B, the semiconductor device 100B may substantially have the same configuration as the semiconductor device 100 described with reference to FIGS. 1 and 2A to 2C. However, the semiconductor device 100B may include a conductive contact pattern 150PB. The conductive contact pattern 150PB may include a lower contact portion 150LB and an upper pad portion 150U. The lower contact portion 150LB may be between a gate dielectric film 130 and a mold insulating pattern 110. The upper pad portion 150 may be on the lower contact portion 150LB and integrally connected to the lower contact portion 150LB.

The mold insulating pattern 110 may have a sidewall 110S in contact with the conductive contact pattern 150PB, and the sidewall 110S may include an inclined surface such that a distance between the sidewall 110S of the mold insulating pattern 110 and the gate dielectric film 130 gradually increases in a direction away from the substrate (refer to 102 in FIG. 2A). The mold barrier liner 110W included in the mold insulating pattern 110 may extend along the inclined surface of the sidewall 110S. Because the sidewall 110S of the mold insulating pattern 110 includes the inclined surface, when the conductive contact pattern 150PB is formed in the process of manufacturing the semiconductor device 100B, excellent gap-fill characteristics may be provided during a deposition process for filling a relatively narrow space between the gate dielectric film 130 and the mold insulating pattern 110 with a conductive material.

The lower contact portion 150LB of the conductive contact pattern 150PB may have a contact surface facing the sidewall 110S including the inclined surface, and the contact surface may include an inclined surface having a shape corresponding to the inclined surface of the sidewall 110S. Details of the conductive contact pattern 150PB may substantially be the same as those of the conductive contact pattern 150P described with reference to FIGS. 1, 2A, and 2C.

Figure 4:
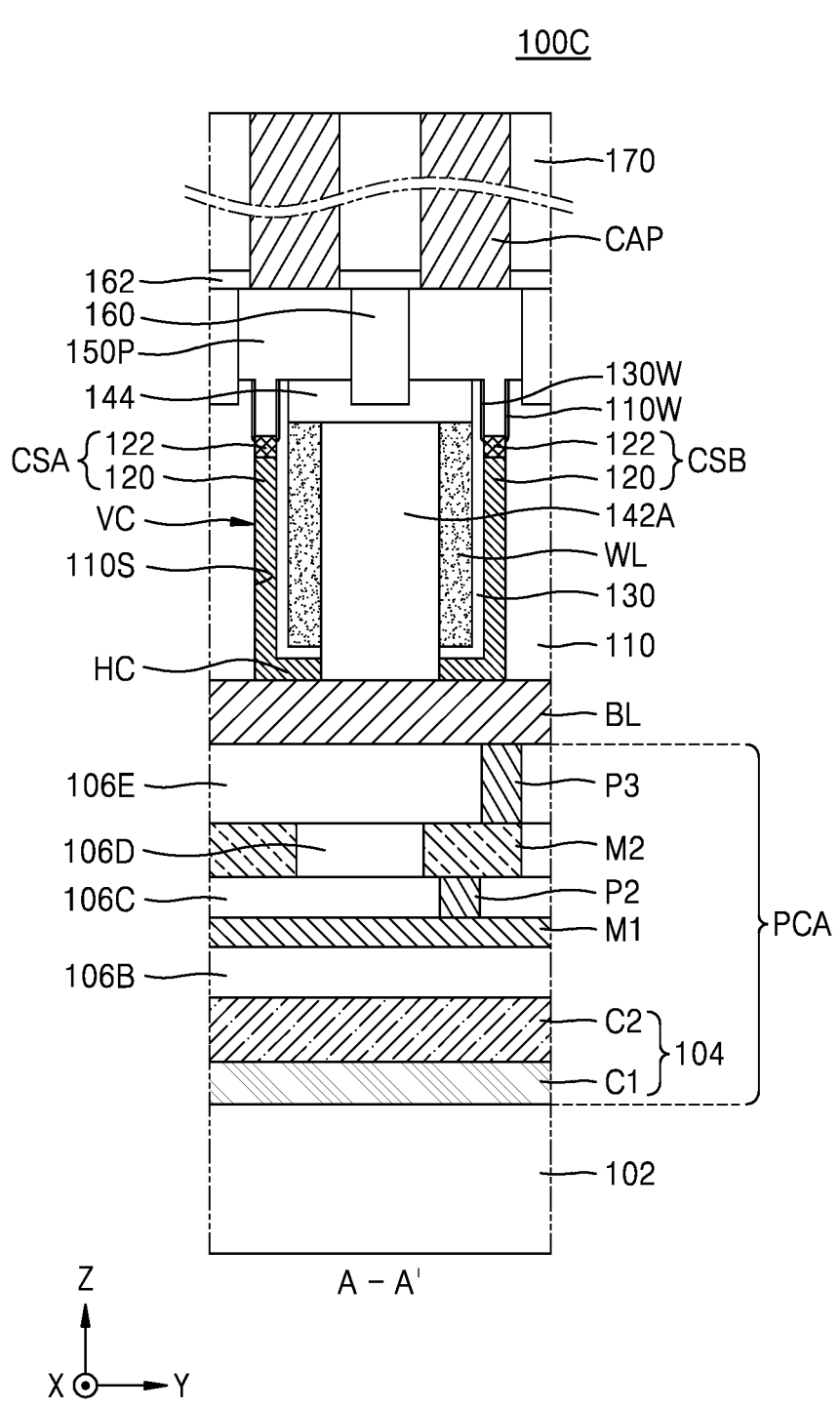
FIG. 4 is a cross-sectional view of a semiconductor device according to embodiments.

FIG. 4 is a cross-sectional view of a semiconductor device 100C according to embodiments. FIG. 4 illustrates a cross-sectional configuration of a portion corresponding to a cross-section taken along line A-A' of FIG. 1 in the semiconductor device 100C. In FIG. 4, the same reference numerals are used to denote the same elements as in FIGS. 1 and 2A to 2C, and repeated descriptions thereof are omitted here.

Referring to FIG. 4, the semiconductor device 100C may substantially have the same configuration as the semiconductor device 100 described with reference to FIGS. 1 and 2A to 2C. However, the semiconductor device 100C may include a pair of channel structures CSA and CSB, which are spaced apart from each other in a first lateral direction (X direction) and/or in a second lateral direction (Y direction), instead of the channel structure CS1.

The pair of channel structures CSA and CSB may each have an L-shaped vertical cross-sectional shape. The pair of channel structures CSA and CSB may each include a vertical channel portion VC and a lateral channel portion HC in contact with a top surface of the bit line BL. The pair of channel structures CSA and CSB may each include a main channel portion 120 and a channel contact portion 122 on an uppermost surface of the main channel portion 120. In each of the pair of channel structures CSA and CSB, a portion of the vertical channel portion VC and the lateral channel portion HC may include the main channel portion 120.

The lateral channel portions HC of the pair of channel structures CSA and CSB may be spaced apart from each other with the lower insulating partition wall 142A therebetween in the second lateral direction (Y direction). The lower insulating partition wall 142A may be in contact with the top surface of the bit line BL. Details of the pair of channel structures CSA and CSB and the lower insulating partition wall 142A may substantially be the same as those of the channel structure CS1 and the lower insulating partition wall 142, which have been described with reference to FIGS. 1 and 2A to 2C.

Figure 5:
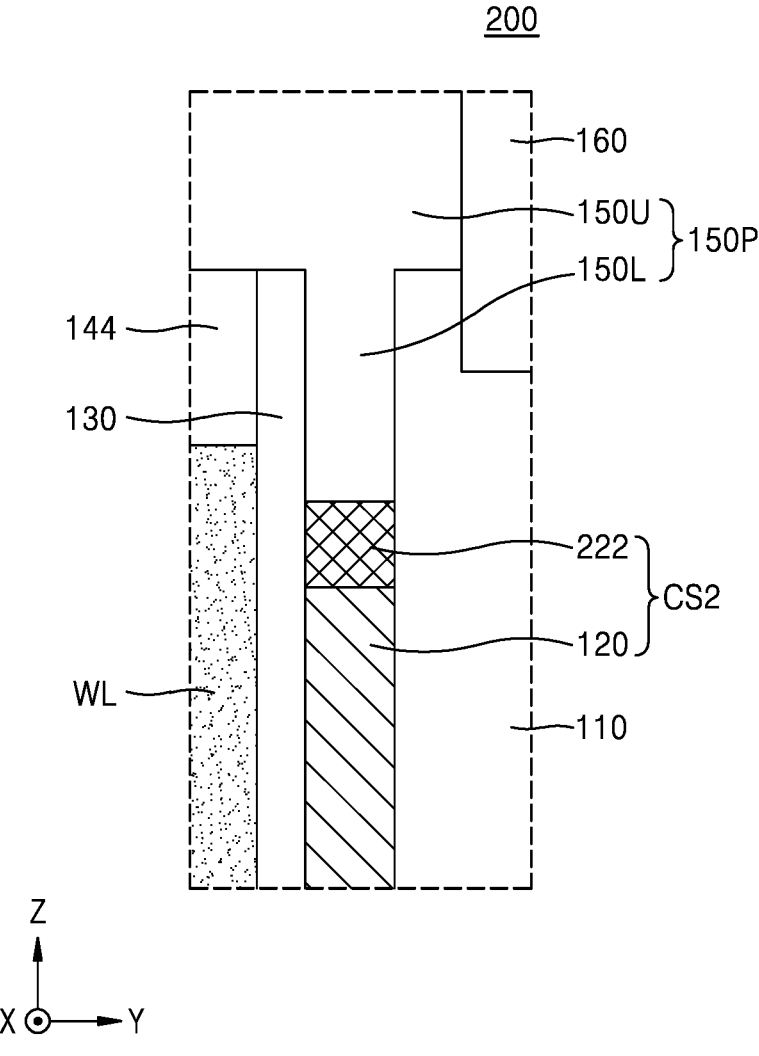
FIG. 5 is a cross-sectional view of a semiconductor device according to embodiments.

FIG. 5 is a cross-sectional view of a semiconductor device 200 according to embodiments. FIG. 5 illustrates an enlarged cross-sectional configuration of a portion corresponding to portion "EX1" of FIG. 2A. In FIG. 5, the same reference numerals are used to denote the same elements as in FIGS. 1 and 2A to 2C, and repeated descriptions thereof are omitted here.

Referring to FIG. 5, the semiconductor device 200 may substantially have the same configuration as the semiconductor device 100 described with reference to FIGS. 1 and 2A to 2C. However, the semiconductor device 200 may include a channel structure CS2 between a gate dielectric film 130 and a mold insulating pattern 110. The channel structure CS2 may include a main channel portion 120 and a channel contact portion 222 on an uppermost surface of the main channel portion 120. In the channel structure CS2, the main channel portion 120 may include a first oxide semiconductor material, and the channel contact portion 222 may include a second oxide semiconductor material having a different composition from the first oxide semiconductor material. In embodiments, the main channel portion 120 may include IGZO, and the channel contact portion 222 may include IAZO, without being limited thereto.

In the semiconductor device 200, the gate dielectric film 130 may not include a dielectric film barrier liner 130W. The mold insulating pattern 110 may not include a mold barrier liner 110W.

Figure 6:
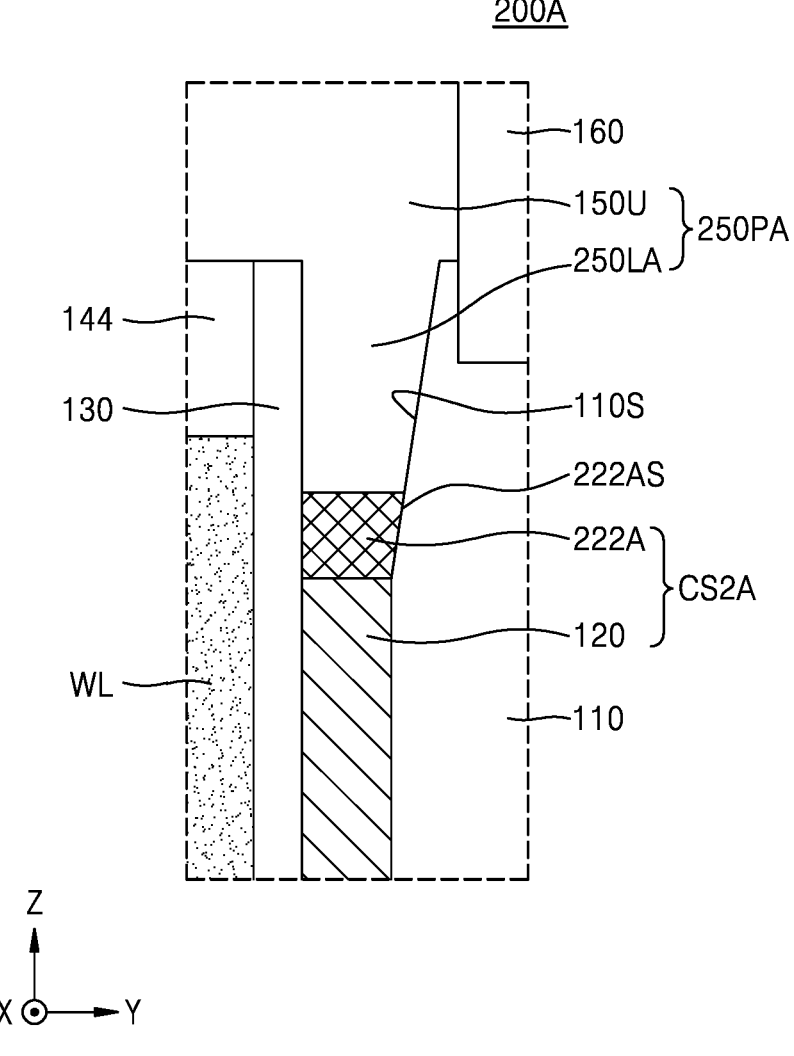
FIG. 6 is a cross-sectional view of a semiconductor device according to embodiments.

FIG. 6 is a cross-sectional view of a semiconductor device 200A according to embodiments. FIG. 6 illustrates an enlarged cross-sectional configuration of a portion corresponding to portion "EX1" of FIG. 2A. In FIG. 6, the same reference numerals are used to denote the same elements as in FIGS. 1 and 2A to 2C, and repeated descriptions thereof are omitted here.

Referring to FIG. 6, the semiconductor device 200A may substantially have the same configuration as the semiconductor device 200 described with reference to FIG. 5. However, the semiconductor device 200A may include a channel structure CS2A and a conductive contact pattern 250PA connected to the channel structure CS2A.

The channel structure CS2A may include a main channel portion 120 and a channel contact portion 222A on an uppermost surface of the main channel portion 120. The conductive contact pattern 250PA may be in contact with the channel contact portion 222A, and the main channel portion 120 may be spaced apart from the conductive contact pattern 250PA with the channel contact portion 222A therebetween.

The conductive contact pattern 250PA may include a lower contact portion 250LA and an upper pad portion 150U. The lower contact portion 250LA may be between a gate dielectric film 130 and a mold insulating pattern 110. The upper pad portion 150U may be on the lower contact portion 250LA and integrally connected to the lower contact portion 250LA.

The mold insulating pattern 110 may have a sidewall 110S in contact with the conductive contact pattern 250PA, and the sidewall 110S may include an inclined surface such that a distance between the sidewall 110S of the mold insulating pattern 110 and the gate dielectric film 130 gradually increases in a direction away from the substrate (refer to 102 in FIG. 2A). The lower contact portion 250LA of the conductive contact pattern 250PA may have a contact surface facing the sidewall 110S of the mold insulating pattern 110, and the contact surface may include an inclined surface having a shape corresponding to the inclined surface of the sidewall 110S.

Because the sidewall 110S of the mold insulating pattern 110 includes the inclined surface, when the conductive contact pattern 250PA is formed in the process of manufacturing the semiconductor device 200A, excellent gap-fill characteristics may be provided during a deposition process for filling a relatively narrow space between the gate dielectric film 130 and the mold insulating pattern 110 with a conductive material.

The channel contact portion 222A of the channel structure CS2A may have a channel surface 222AS facing the sidewall 110S of the mold insulating pattern 110, and the channel surface 222AS may include an inclined surface having a shape corresponding to the inclined surface of the sidewall 110S.

Details of the conductive contact pattern 250PA and the channel structure CS2A may substantially be the same as those of the conductive contact pattern 150P and the channel structure CS1, which have been described with reference to FIGS. 1 and 2A to 2C.

Figure 7A:
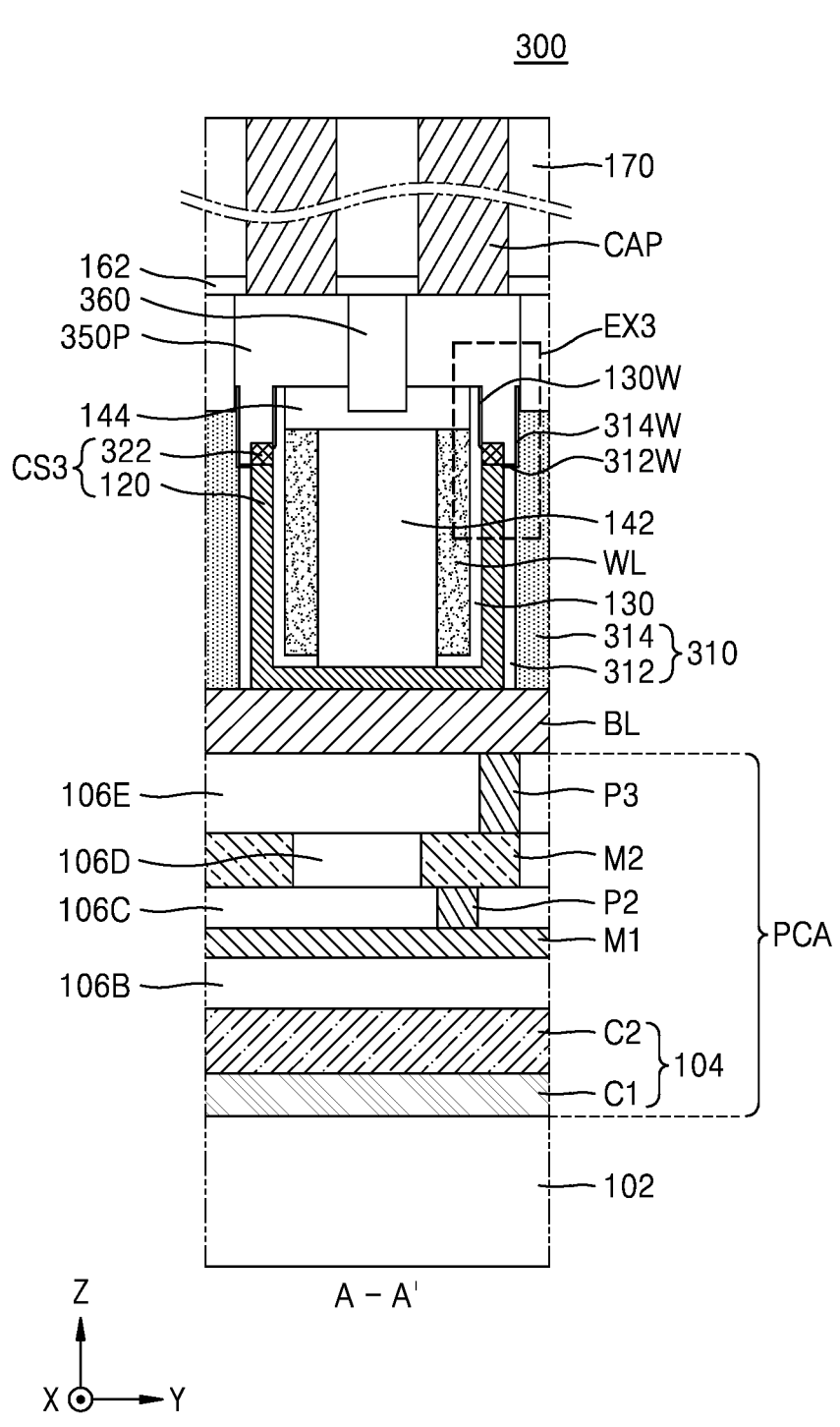
FIG. 7A is a cross-sectional view of a semiconductor device according to embodiments.
Figure 7B:
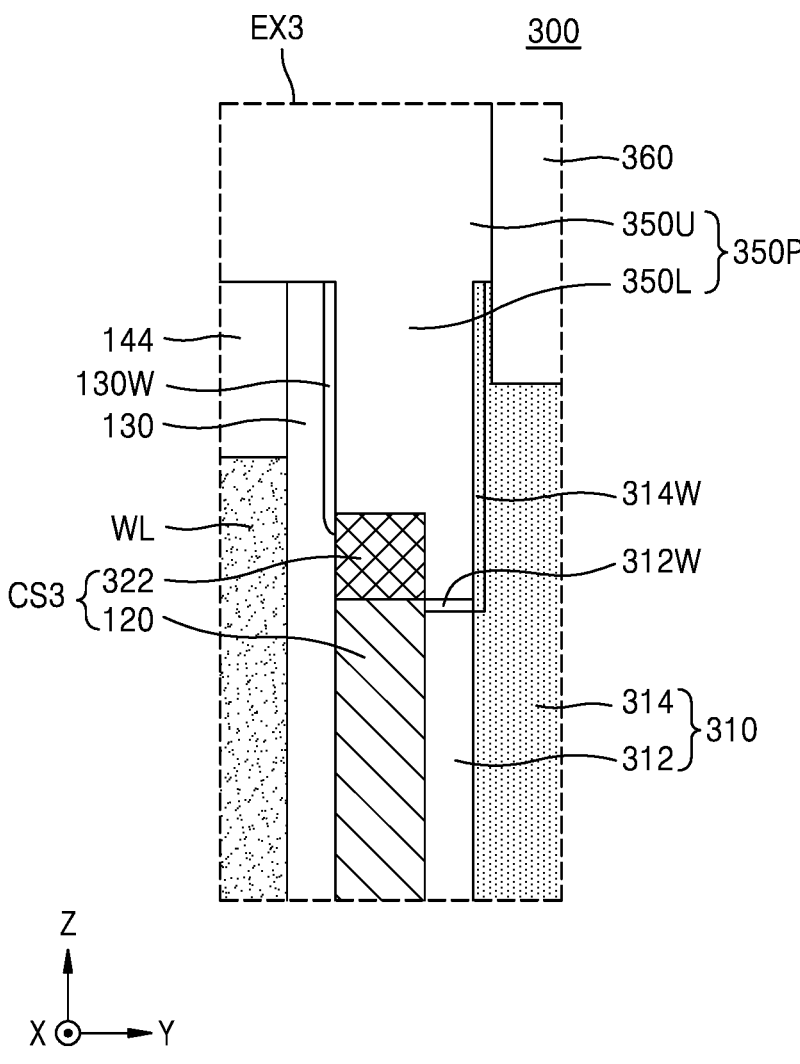
FIG. 7B is an enlarged cross-sectional view of portion "EX3" of FIG. 7A.

FIG. 7A is a cross-sectional view of a semiconductor device 300 according to embodiments, and FIG. 7B is an enlarged cross-sectional view of portion "EX3" of FIG. 7A. FIG. 7A illustrates a cross-sectional configuration of a portion corresponding to the cross-section taken along line A-A' of FIG. 1 in the semiconductor device 300. In FIGS. 7A and 7B, the same reference numerals are used to denote the same elements as in FIGS. 1 and 2A to 2C, and repeated descriptions thereof are omitted here.

Referring to FIGS. 7A and 7B, the semiconductor device 300 may substantially have the same configuration as the semiconductor device 100 described with reference to FIGS. 1 and 2A to 2C. However, the semiconductor device 300 may include a mold insulating pattern 310, a channel structure CS3 in contact with a sidewall of the mold insulating pattern 310, and a plurality of conductive contact patterns 350P connected to the channel structure CS3. The plurality of conductive contact patterns 350P may be insulated from each other by an isolation insulating film 360. The isolation insulating film 360 may substantially have the same configuration as the isolation insulating film 160 described with reference to FIGS. 2A to 2C.

The mold insulating pattern 310 may include a first mold insulating pattern 312 and a second mold insulating pattern 314, which include different materials from each other. The first mold insulating pattern 312 and the second mold insulating pattern 314 may have different etch selectivities with respect to a predetermined etchant. In embodiments, the first mold insulating pattern 312 may include a silicon oxide film, and the second mold insulating pattern 314 may include a silicon nitride film, without being limited thereto.

In the mold insulating pattern 310, an uppermost surface of the first mold insulating pattern 312 may be at a lower vertical level than an uppermost surface of the channel structure CS3, and an uppermost surface of the second mold insulating pattern 314 may be at a higher vertical level than the uppermost surface of the channel structure CS3. As used herein, the term "vertical level" may refer to a vertical distance from a substrate (refer to 102 in FIG. 2A). As used herein, a high(er) vertical level may refer to a relatively great vertical distance from the substrate 102.

The conductive contact pattern 350P may include a lower contact portion 350L and an upper pad portion 350U. The lower contact portion 350L may be between a gate dielectric film 130 and the mold insulating pattern 310. The upper pad portion 350U may be on the lower contact portion 350L and integrally connected to the lower contact portion 350L.

The channel structure CS3 may include a main channel portion 120 and a channel contact portion 322 on an uppermost surface of the main channel portion 120. Details of the channel contact portion 322 may substantially be the same as those of the channel contact portion 122, which has been described with reference to FIGS. 1 and 2A to 2C.

The lower contact portion 350L of the conductive contact pattern 350P may have a sidewall facing the gate dielectric film 130, surfaces in contact with a top surface and a sidewall of the channel contact portion 322, a surface in contact with an uppermost surface of the first mold insulating pattern 312, and a surface in contact with a sidewall of the second mold insulating pattern 314. The lower contact portion 350L of the conductive contact pattern 350P may include a portion between the sidewall of the channel contact portion 322 and the sidewall of the second mold insulating pattern 314 included in the mold insulating pattern 310.

The first mold insulating pattern 312 of the mold insulating pattern 310 may include a mold barrier liner 312W in contact with the conductive contact pattern 350P, and the second mold insulating pattern 314 of the mold insulating pattern 310 may include a mold barrier liner 314W in contact with the conductive contact pattern 350P. Also, the gate dielectric film 130 may include a dielectric film barrier liner 130W in contact with the conductive contact pattern 350P. The mold barrier liner 312W may include the same elements as those of the first mold insulating pattern 312 and further includes at least one dopant selected from aluminum (Al), boron (B), arsenic (As), fluorine (F), and hydrogen (H). The mold barrier liner 314W may include the same elements as those of the second mold insulating pattern 314 and further includes at least one dopant selected from aluminum (Al), boron (B), arsenic (As), fluorine (F), and hydrogen (H).

Details of the mold insulating pattern 310, the channel structure CS3, and the conductive contact pattern 350P may substantially be the same as those of the mold insulating pattern 110, the channel structure C Sl, and the conductive contact pattern 150P, which have been described with reference to FIGS. 1 and 2A to 2C.

Figure 8:
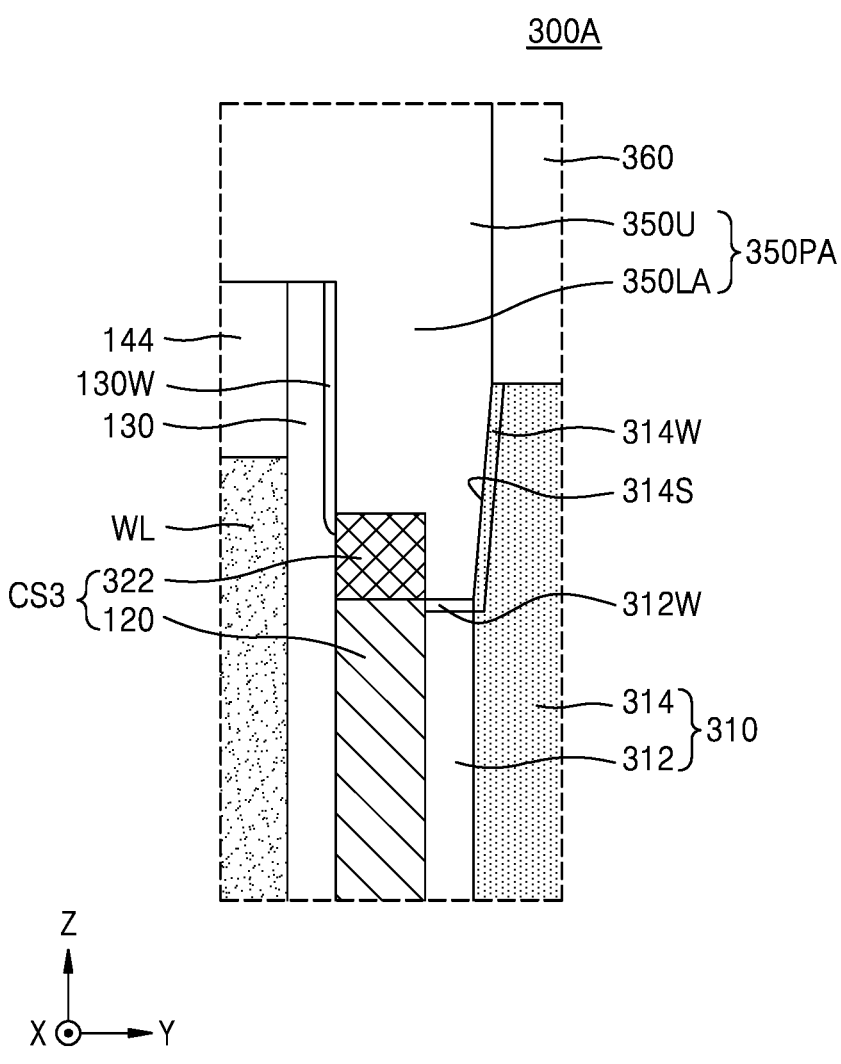
FIG. 8 is a cross-sectional view of a semiconductor device according to embodiments.

FIG. 8 is a cross-sectional view of a semiconductor device 300A according to embodiments. FIG. 8 illustrates an enlarged cross-sectional configuration of a portion corresponding to portion "EX3" of FIG. 7A. In FIG. 8, the same reference numerals are used to denote the same elements as in FIGS. 1, 2A to 2C, 7A, and 7B, and repeated descriptions thereof are omitted here.

Referring to FIG. 8, the semiconductor device 300A may substantially have the same configuration as the semiconductor device 300 described with reference to FIGS. 7A and 7B. However, the semiconductor device 300A may include a conductive contact pattern 350PA. The conductive contact pattern 350PA may be insulated from conductors adjacent thereto by an isolation insulating film 360. The conductive contact pattern 350PA may include a lower contact portion 350LA and an upper pad portion 350U. The lower contact portion 350LA may be between the gate dielectric film 130 and the mold insulating pattern 310. The upper pad portion 350U may be on the lower contact portion 350LA and integrally connected to the lower contact portion 350LA.

The second mold insulating pattern 314 included in the mold insulating pattern 310 may have a sidewall 314S in contact with the conductive contact pattern 350PA, and the sidewall 314S may include an inclined surface such that a distance between the sidewall 314S of the second mold insulating pattern 314 and the gate dielectric film 130 gradually increases in a direction away from the substrate (refer to 102 in FIG. 7A). The mold barrier liner 314W included in the second mold insulating pattern 314 may extend along the inclined surface of the sidewall 314S.

The lower contact portion 350LA of the conductive contact pattern 350PA may have a contact surface facing the inclined surface of the sidewall 314S, and the contact surface may include an inclined surface having a shape corresponding to the inclined surface of the sidewall 314S. Details of the conductive contact pattern 350PA may substantially be the same as those of the conductive contact pattern 350P, which has been described with reference to FIGS. 7A and 7B.

Figure 9A:
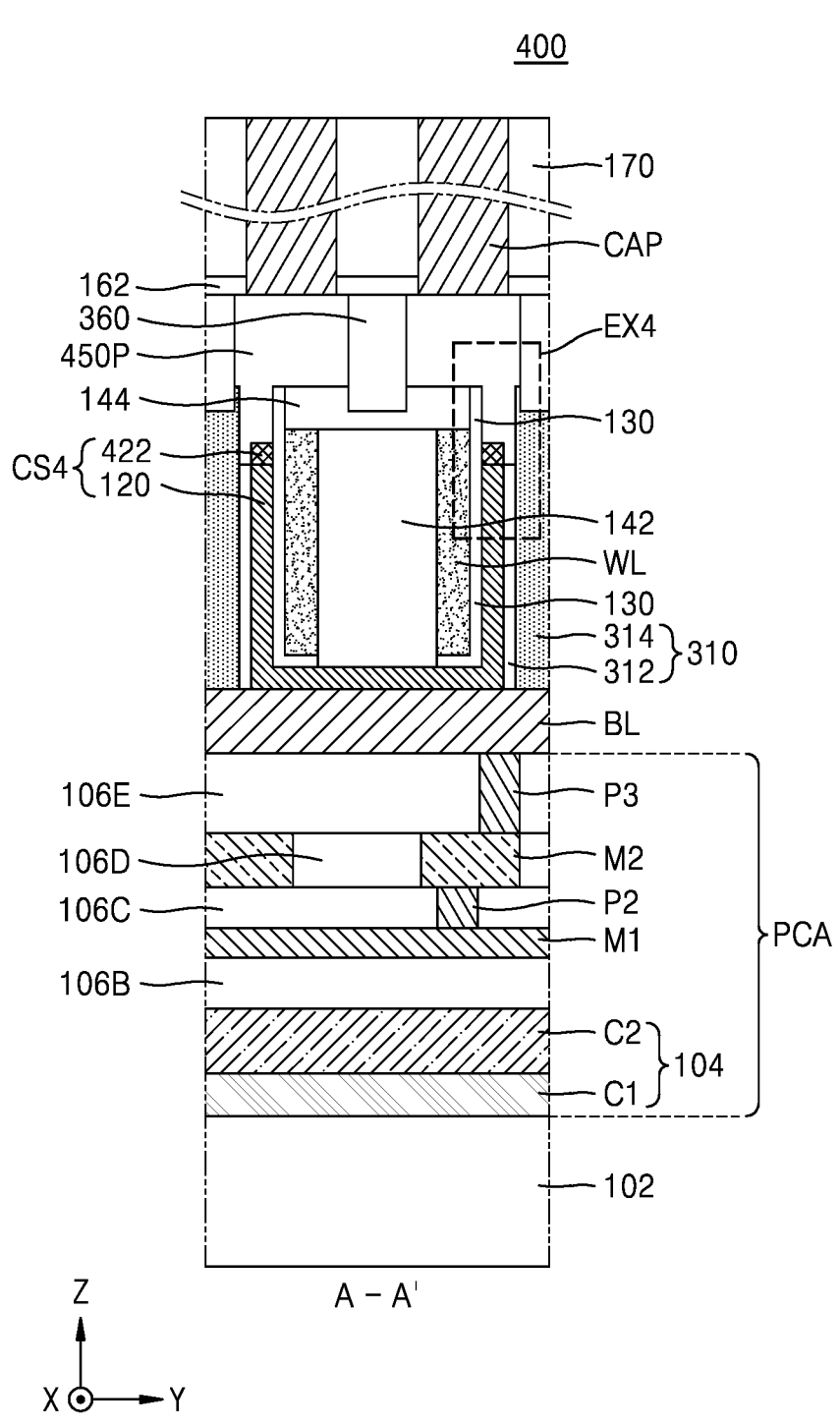
FIG. 9A is a cross-sectional view of a semiconductor device according to embodiments.
Figure 9B:
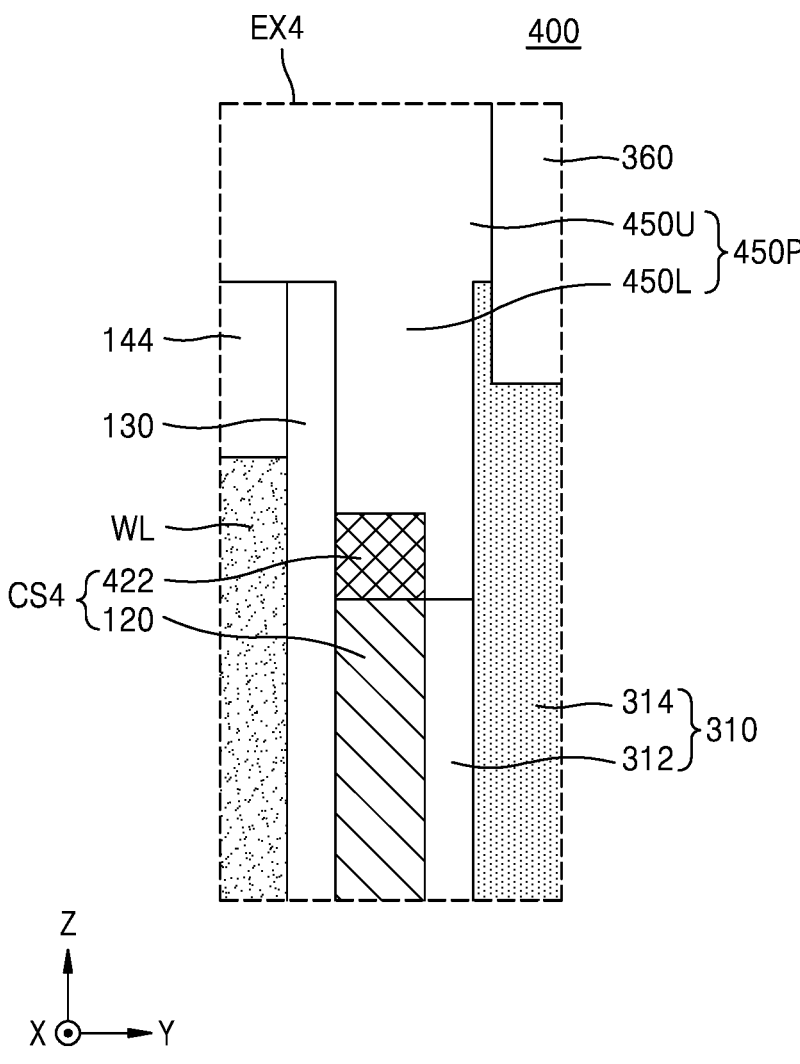
FIG. 9B is an enlarged cross-sectional view of portion "EX4" of FIG. 9A.

FIG. 9A is a cross-sectional view of a semiconductor device 400 according to embodiments, and FIG. 9B is an enlarged cross-sectional view of portion "EX4" of FIG. 9A. FIG. 9A illustrates a cross-sectional configuration of a portion corresponding to the cross-section taken along line A-A' of FIG. 1 in the semiconductor device 400. In FIGS. 9A and 9B, the same reference numerals are used to denote the same elements as in FIGS. 1, 2A to 2C, 7A, and 7B, and repeated descriptions thereof are omitted here.

Referring to FIGS. 9A and 9B, the semiconductor device 400 may substantially have the same configuration as the semiconductor device 300 described with reference to FIGS. 7A and 7B. However, the semiconductor device 400 may include a channel structure CS4 in contact with a sidewall of a mold insulating pattern 310 and a plurality of conductive contact patterns 450P connected to the channel structure CS4. The plurality of conductive contact patterns 450P may be insulated from each other by an isolation insulating film 360.

In the semiconductor device 400, a gate dielectric film 130 may not include the dielectric film barrier liner 130W shown in FIGS. 7A and 7B. The mold insulating pattern 310 may not include the mold barrier liners 312W and 314W shown in FIGS. 7A and 7B.

In the mold insulating pattern 310, an uppermost surface of a first mold insulating pattern 312 may be at a lower vertical level than an uppermost surface of the channel structure CS4, and an uppermost surface of a second mold insulating pattern 314 may be at a higher vertical level than the uppermost surface of the channel structure CS4.

The conductive contact pattern 450P may include a lower contact portion 450L and an upper pad portion 450U. The lower contact portion 450L may be between the gate dielectric film 130 and the mold insulating pattern 310. The upper pad portion 450U may be on the lower contact portion 450L and integrally connected to the lower contact portion 450L.

The channel structure CS4 may include a main channel portion 120 and a channel contact portion 422 on an uppermost surface of the main channel portion 120. Details of the channel contact portion 422 may substantially be the same as that of the channel contact portion 122, which has been described with reference to FIGS. 1 and 2A to 2C.

The lower contact portion 450L of the conductive contact pattern 450P may include a sidewall facing the gate dielectric film 130, a sidewall facing the mold insulating pattern 310, surfaces in contact with a top surface and a sidewall of the channel contact portion 422, and an uppermost surface of the first mold insulating pattern 312. The lower contact portion 450L of the conductive contact pattern 450P may include a portion between the sidewall of the channel contact portion 422 and a sidewall of the second mold insulating pattern 314 included in the mold insulating pattern 310.

Figure 10:
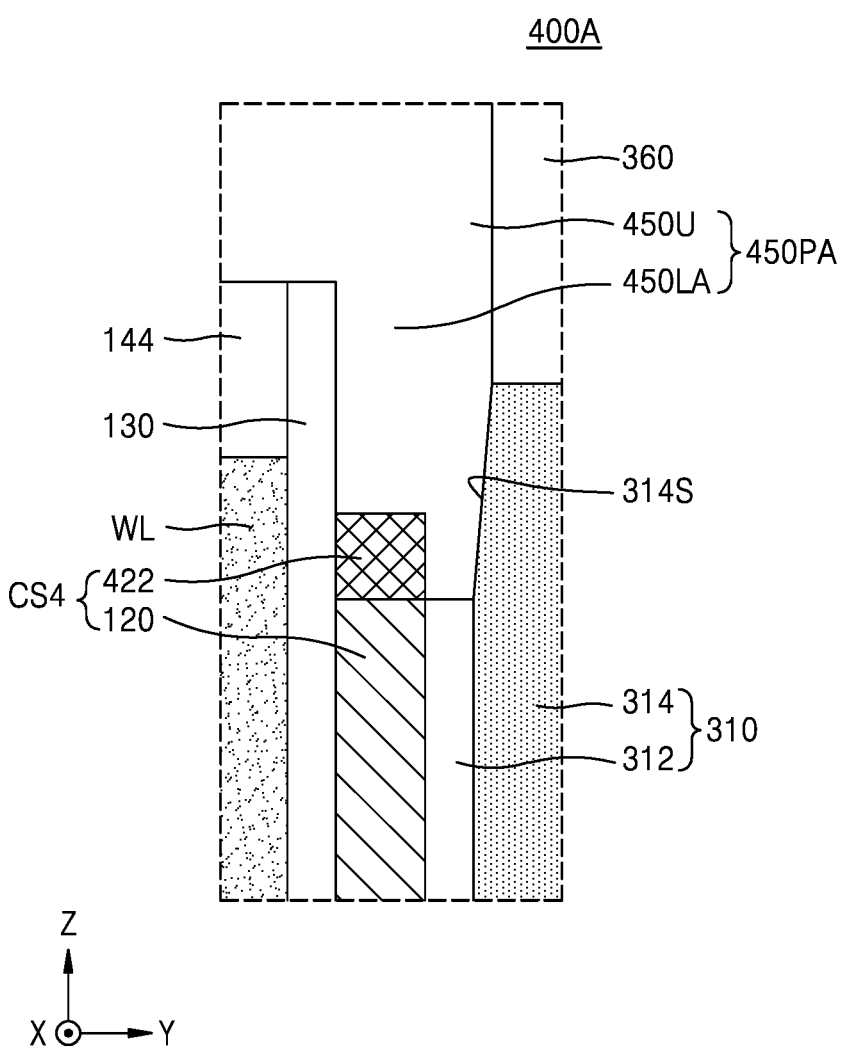
FIG. 10 is a cross-sectional view of a semiconductor device according to embodiments.

FIG. 10 is a cross-sectional view of a semiconductor device 400A according to embodiments. FIG. 10 illustrates an enlarged cross-sectional configuration of a portion corresponding to portion "EX4" of FIG. 9A. In FIG. 10, the same reference numerals are used to denote the same elements as in FIGS. 1, 2A to 2C, 9A, and 9B, and repeated descriptions thereof are omitted here.

Referring to FIG. 10, the semiconductor device 400A may substantially have the same configuration as the semiconductor device 400 described with reference to FIGS. 9A and 9B. However, the semiconductor device 400A may include a conductive contact pattern 450PA connected to a channel structure CS4. The conductive contact pattern 450PA may be insulated from conductors adjacent thereto by an isolation insulating film 360.

The conductive contact pattern 450PA may be in contact with a channel contact portion 422 of the channel structure CS4, and the main channel portion 120 may be spaced apart from the conductive contact pattern 450PA with the channel contact portion 422 therebetween.

The conductive contact pattern 450PA may include a portion between a sidewall of a gate dielectric film 130 and a sidewall of a second mold insulating pattern 314 of a mold insulating pattern 310.

The second mold insulating pattern 314 of the mold insulating pattern 310 may have a sidewall 314S in contact with the conductive contact pattern 450PA, and the sidewall 314S may include an inclined surface such that a distance between the sidewall 314S of the second mold insulating pattern 314 and the gate dielectric film 130 gradually increases in a direction away from the substrate (refer to 102 in FIG. 7A). The lower contact portion 450LA of the conductive contact pattern 450PA may have a contact surface facing the sidewall 314S of the second mold insulating pattern 314, and the contact surface may include an inclined surface having a shape corresponding to the inclined surface of the sidewall 314S.

The semiconductor devices 100, 100A, 100B, 100C, 200, 200A, 300, 300A, 400, and 400A described with reference to FIGS. 1 to 10 may include the channel structures CS1, CSA, CSB, CS1A, CS2, CS2A, CS3, and CS4, which adopt an oxide semiconductor material. In the channel structures CS1, CSA, CSB, CS1A, CS2, CS2A, CS3, and CS4, the channel contact portions 122, 122A, 222, 222A, 322, and 422 in contact with the conductive contact patterns 150P, 150PB, 250PA, 350P, 350PA, 450P, and 450PA may have different compositions from the main channel portions 120 and 120A of the channel structures CS1, CSA, CSB, CS1A, CS2, CS2A, CS3, and CS4. In embodiments, the channel contact portions 122, 122A, 222, 222A, 322, and 422 may include the same elements as those of an oxide semiconductor layer included in the main channel portions 120 and 120A, and further include at least one dopant selected from aluminum (Al), boron (B), arsenic (As), fluorine (F), and hydrogen (H). Accordingly, because oxygen atoms included in the channel contact portions 122, 122A, 222, 222A, 322, and 422 are bonded with other elements included in the channel contact portions 122, 122A, 222, 222A, 322, and 422 with relatively high bond dissociation energy, the oxygen atoms included in the channel contact portions 122, 122A, 222, 222A, 322, and 422 may be inhibited from reacting with metal atoms included in the conductive contact patterns 150P, 150PB, 250PA, 350P, 350PA, 450P, and 450PA to form a metal oxide. As a result, contact resistance between the channel structures CS1, CSA, CSB, CS1A, CS2, CS2A, CS3, and CS4 and the conductive contact patterns 150P, 150PB, 250PA, 350P, 350PA, 450P, and 450PA may be reduced. That is, an interface between the channel contact portions and the conductive contact patterns may have a lower contact resistance than an interface between the main channel portions and the conductive contact patterns.

Furthermore, the conductive contact patterns 150PB, 250PA, 350PA, and 450PA, which are in contact with the sidewalls 110S and 314S including the inclined surfaces, may be provided as in the semiconductor devices 100B, 200A, 300A, and 400A shown in FIGS. 3B, 6, 8, and 10. Alternatively, as shown in FIGS. 7A to 10, the conductive contact patterns 350P, 350PA, 450P, and 450PA, which are in contact with the top surfaces and the sidewalls of the channel contact portions 322 and 422 included in the channel structures CS3 and CS4 and are between the sidewalls of the channel contact portions 322 and 422 and the sidewall of the mold insulating pattern 310, may be provided. Thus, an increased contact area may be ensured between a channel structure and a conductive contact pattern. Therefore, the reliability of semiconductor devices may be improved.

Next, a specific example of a method of manufacturing a semiconductor device, according to embodiments, will be described.

FIGS. 11A to 19B are diagrams of a process sequence of a method of manufacturing a semiconductor device, according to embodiments. More specifically, FIGS. 11A, 12A, 13A, 14A, and 15A are plan layout diagrams of some components, which illustrate a process sequence of the method of manufacturing the semiconductor device. FIGS. 11B, 12B, 13B, 14B, and 15B are cross-sectional views taken along lines A-A' of FIGS. 11A, 12A, 13A, 14A, and 15A, respectively. FIGS. 11C, 12C, 13C, 14C, and 15C are cross-sectional views taken along lines B-B' of FIGS. 11A, 12A, 13A, 14A, and 15A, respectively. FIGS. 16A, 17A, 18A, and 19A are cross-sectional views of a region corresponding to the cross-section taken along line A-A' of FIG. 1, according to the process sequence. FIGS. 16B, 17B, 18B, and 19B are respectively enlarged cross-sectional views of portions "EX1" of FIGS. 16A, 17A, 18A, and 19A. An example of a method of manufacturing the semiconductor device 100 shown in FIGS. 1 and 2A to 2C will be described with reference to FIGS. 11A to 19B. In FIGS. 11A to 19B, the same reference numerals are used to denote the same elements as in FIGS. 1 and 2A to 2C, and repeated descriptions thereof are omitted here.

Figure 11A:
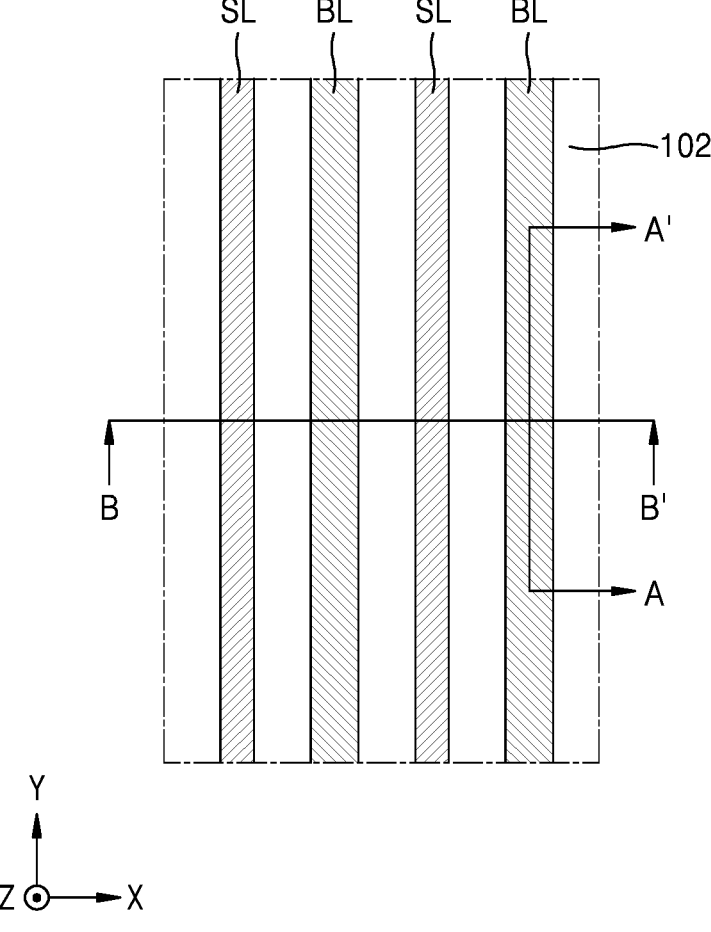
Figure 11B:
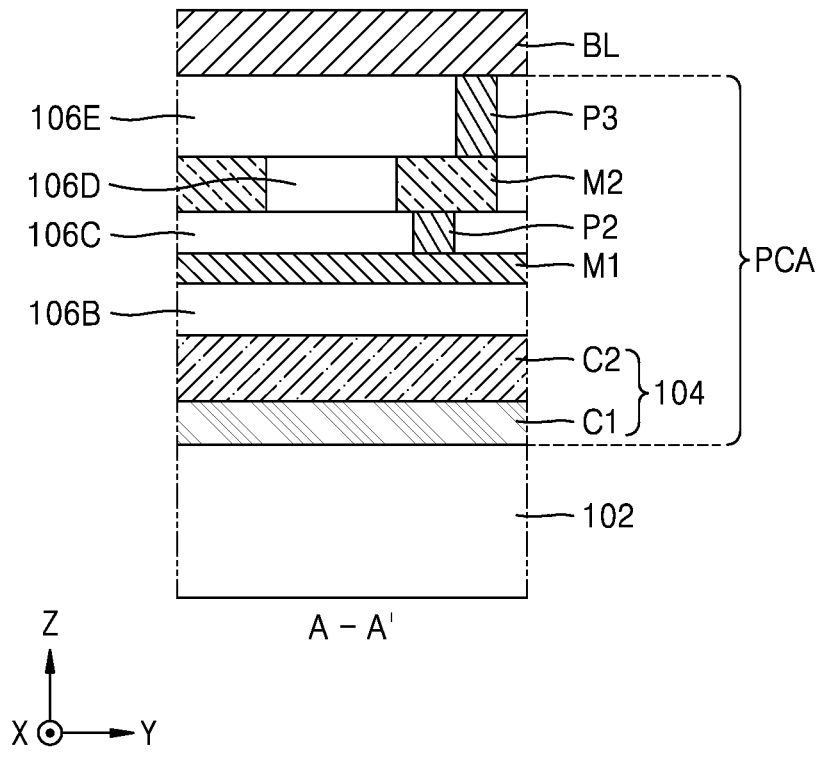
FIGS. 11B, 12B, 13B, 14B, and 15B are cross-sectional views taken along lines A-A' of FIGS. 11A, 12A, 13A, 14A, and 15A, respectively.
Figure 11C:
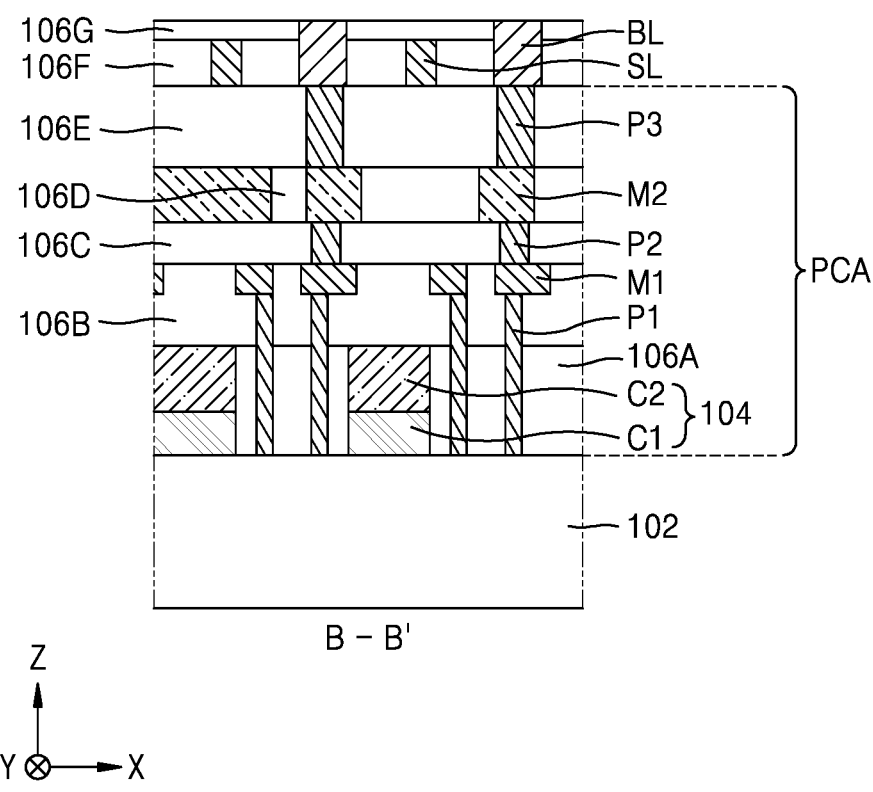
FIGS. 11C, 12C, 13C, 14C, and 15C are cross-sectional views taken along lines B-B' of FIGS. 11A, 12A, 13A, 14A, and 15A, respectively.

Referring to FIGS. 11A, 11B, and 11C, a plurality of core circuits 104 and a plurality of peripheral circuits including a plurality of conductive plugs (e.g., P1, P2, and P3) and a plurality of wiring layers (e.g., M1 and M2) may be formed on a substrate 102. Thus, a peripheral circuit structure PCA may be formed on the substrate 102. Thereafter, a plurality of shielding structures SL and a plurality of bit lines BL may be formed on the peripheral circuit structure PCA. The plurality of shielding structures SL may pass through an interlayer insulating film 106F, and the plurality of bit lines BL may pass through the interlayer insulating film 106F and an interlayer insulating film 106G.

Figure 12A:
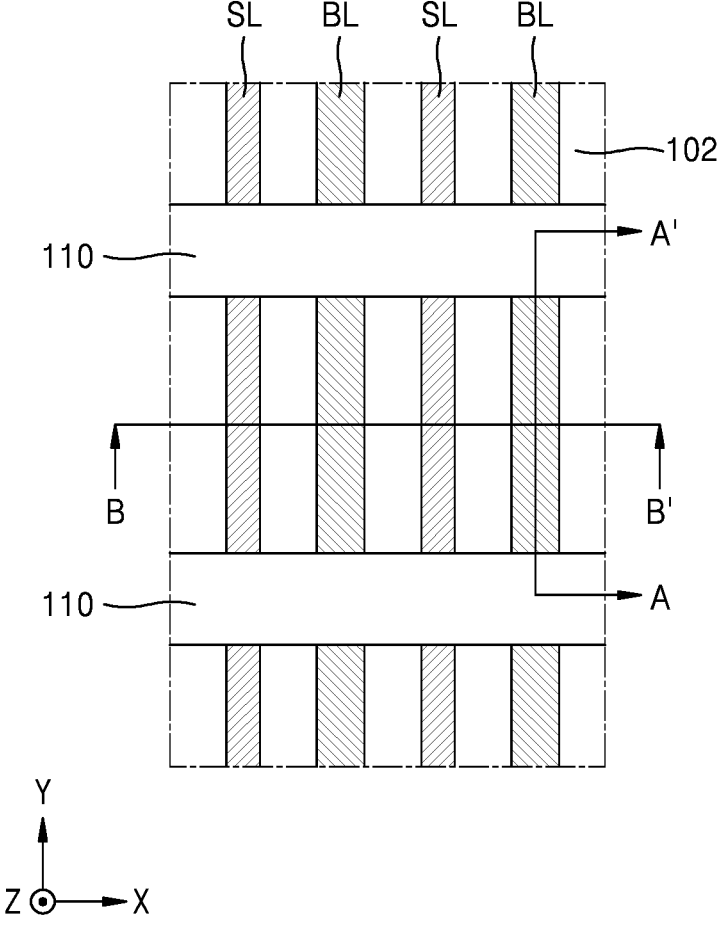
Figure 12B:
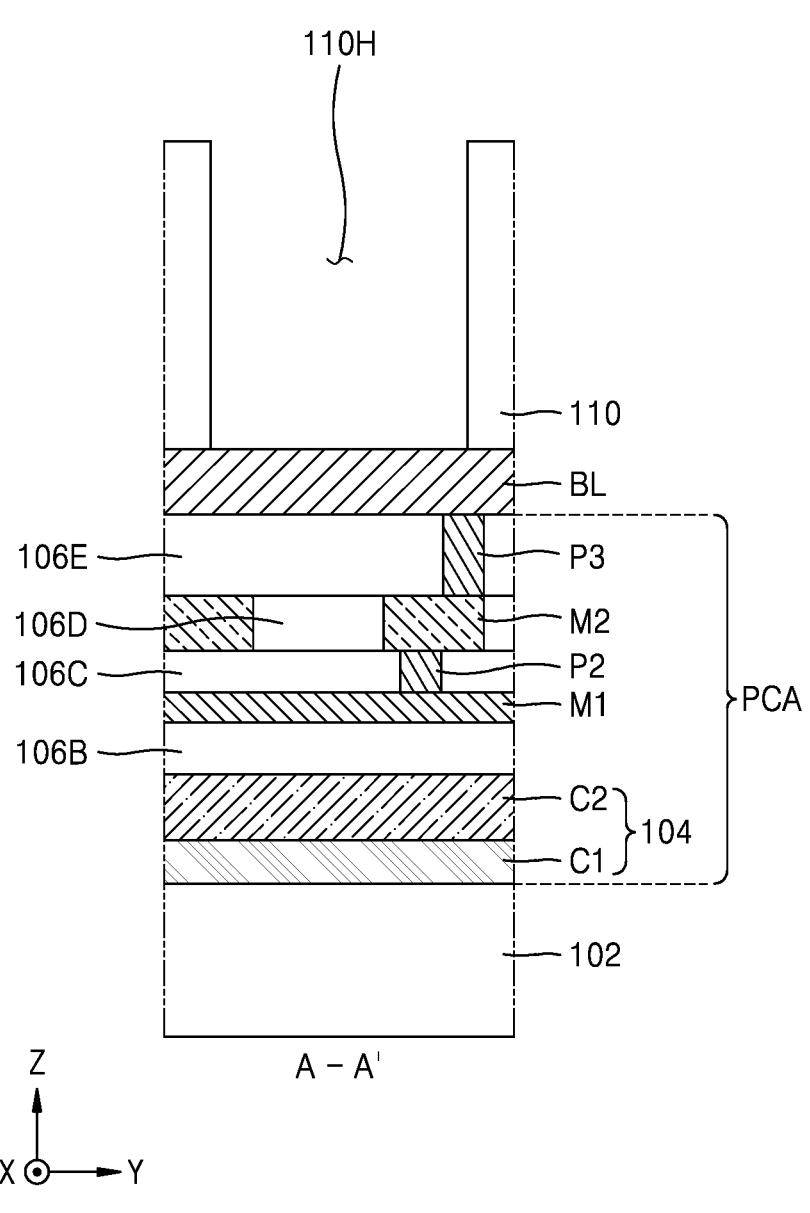
Figure 12C:
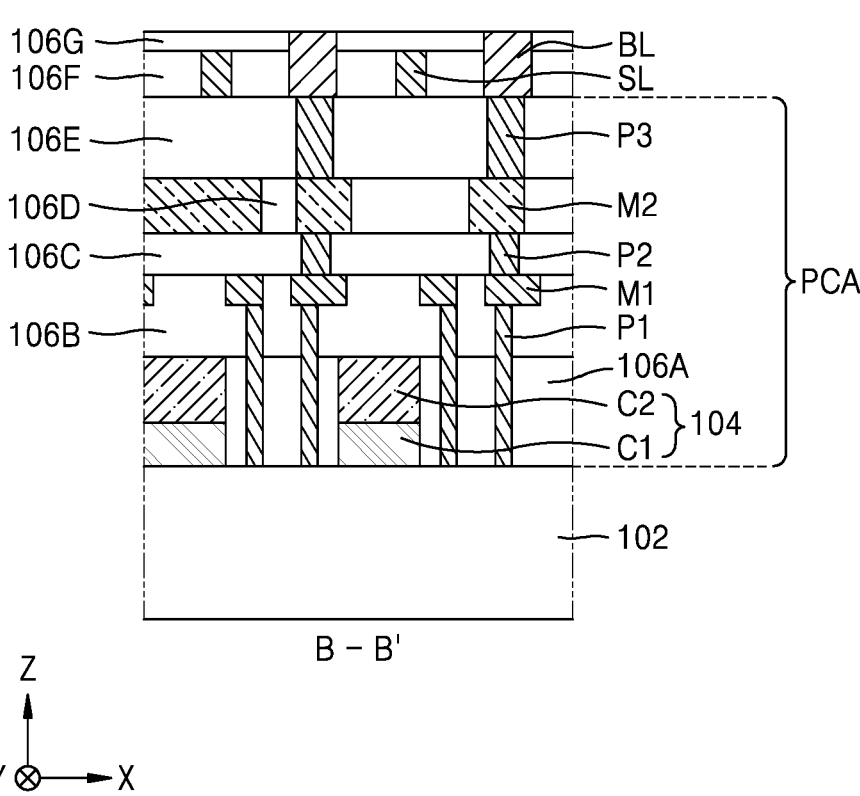

Referring to FIGS. 12A, 12B, and 12C, a mold insulating pattern 110 having a plurality of openings 110H may be formed on the resultant structure of FIGS. 11A, 11B, and 11C in which the plurality of bit lines BL are formed. Partial regions of the plurality of bit lines BL may be respectively exposed through the plurality of openings 110H. Each of the plurality of openings 110H formed in the mold insulating pattern 110 may provide a transistor region TRR.

Figure 13A:
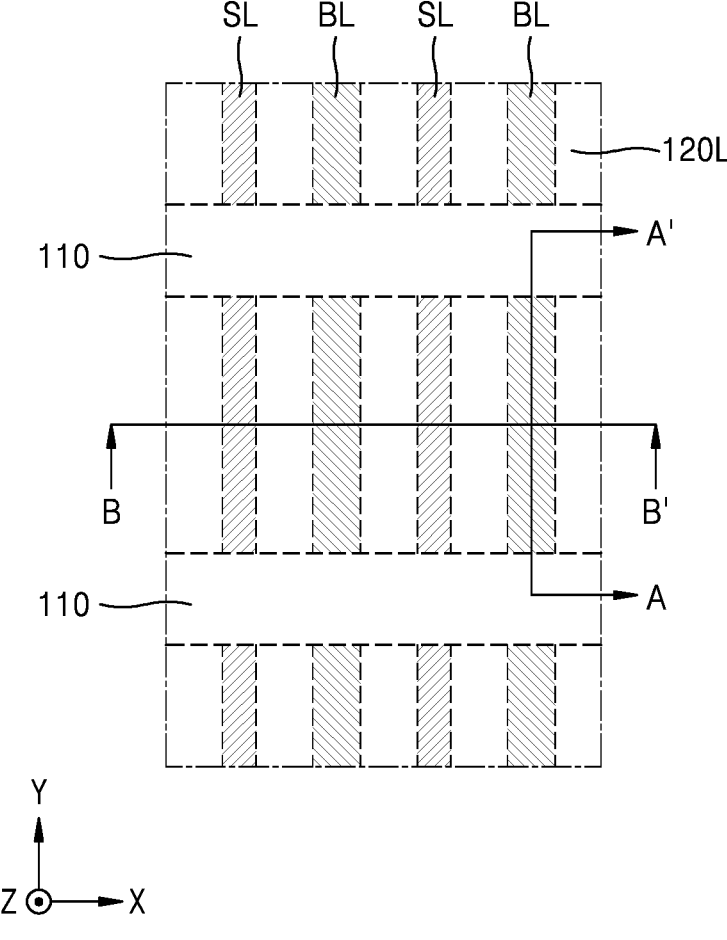
Figure 13B:
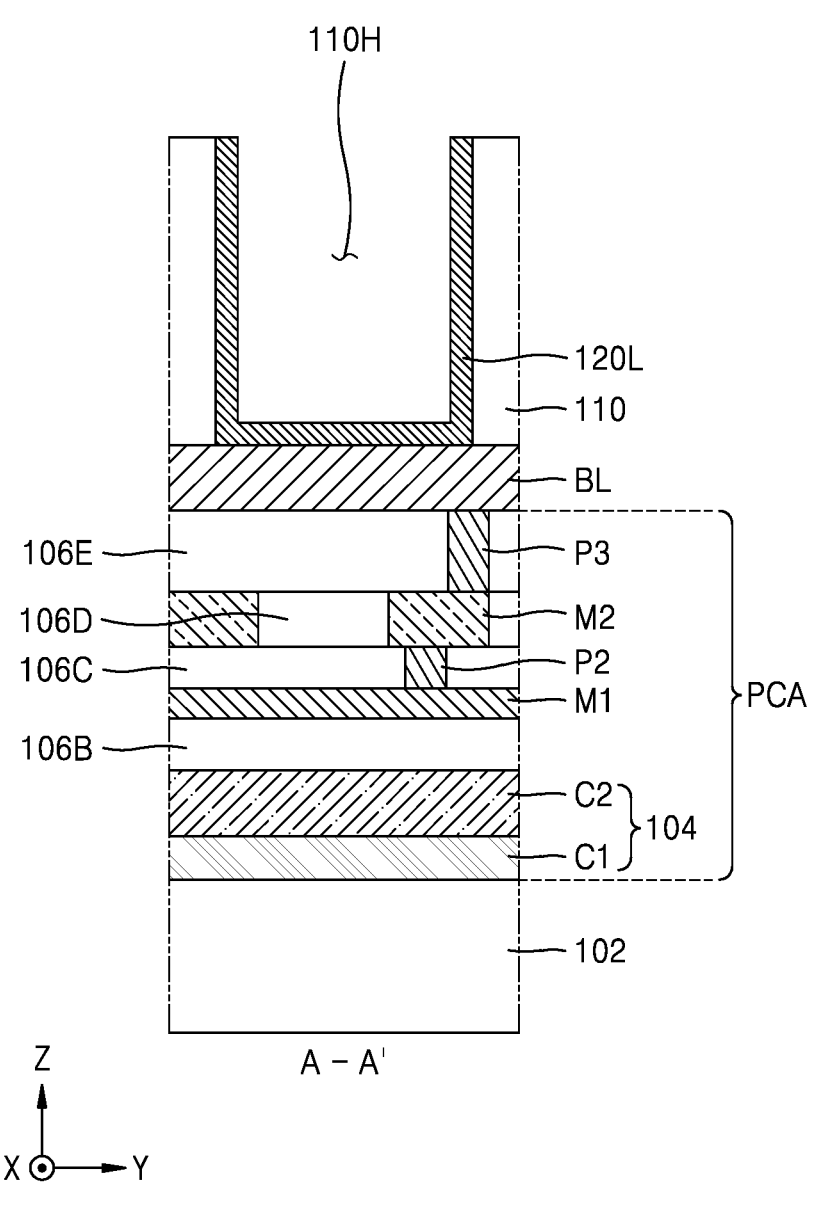
Figure 13C:
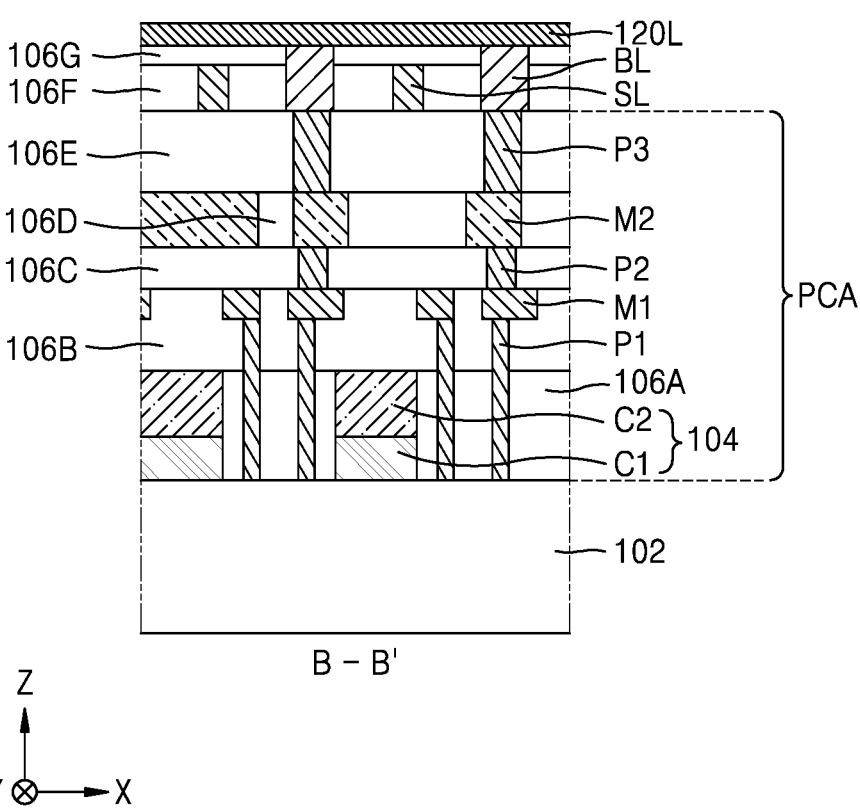

Referring to FIGS. 13A, 13B, and 13C, a channel layer 120L may be formed to conformally cover surfaces exposed at the plurality of openings 110H formed in the mold insulating pattern 110. The channel layer 120L may include an oxide semiconductor layer. The oxide semiconductor layer may include IGZO, Sn-IGZO, IWO, IZO, ZTO, ZnO, YZO, IGSO, InO, SnO, TiO, ZnON, MgZnO, ZrInZnO, HfInZnO, SnInZnO, SiInZnO, GaZnSnO, ZrZnSnO, or a combination thereof. For example, the channel layer 120L may include IGZO.

In embodiments, the channel layer 120L may be formed by using at least one of a chemical vapor deposition (CVD) process, a low-pressure CVD (LPCVD) process, a plasma-enhanced CVD (PECVD) process, a metal-organic CVD (MOCVD) process, and an atomic layer deposition (ALD) process. In embodiments, the channel layer 120L may be formed to a thickness of about 1 nm to about 50 nm, without being limited thereto.

Figure 14A:
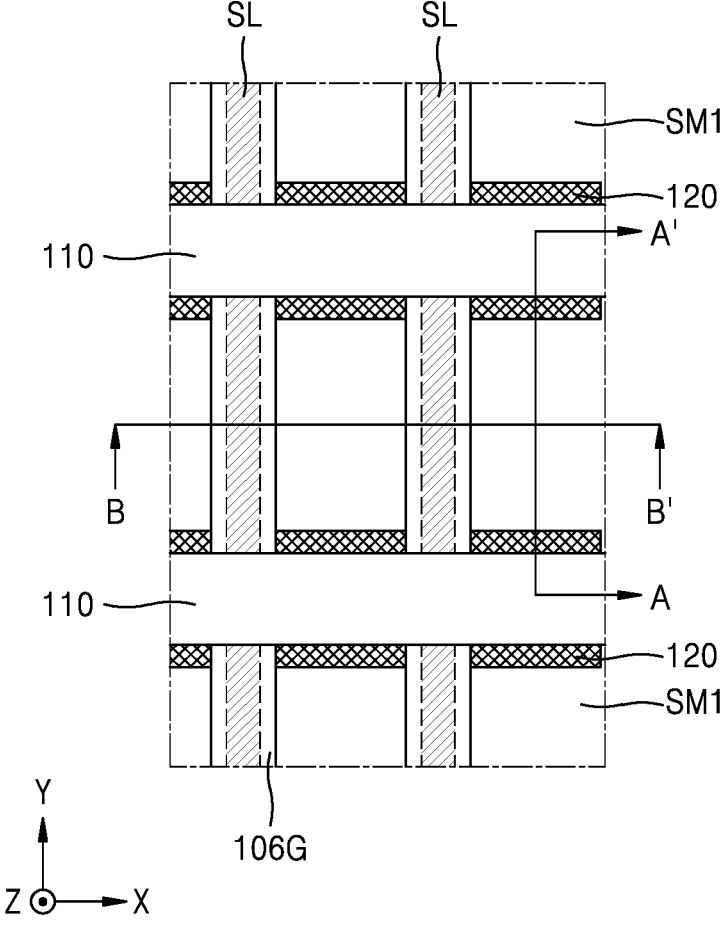
Figure 14B:
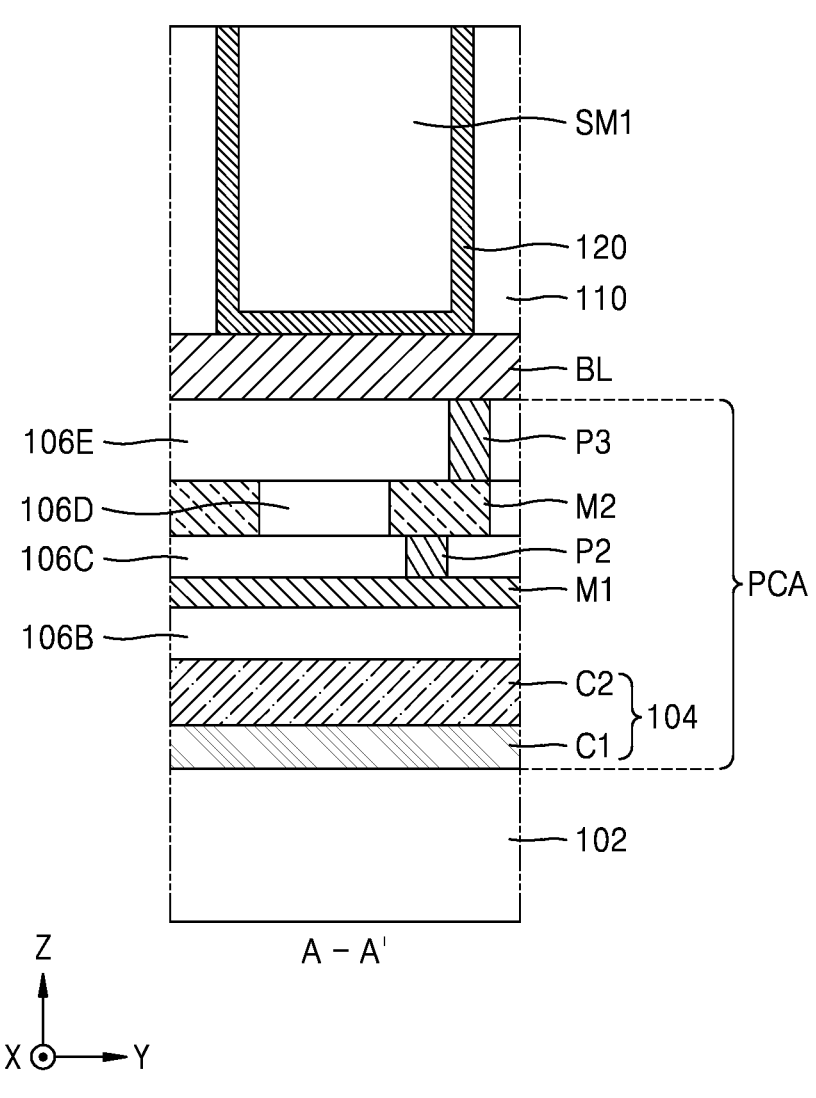
Figure 14C:
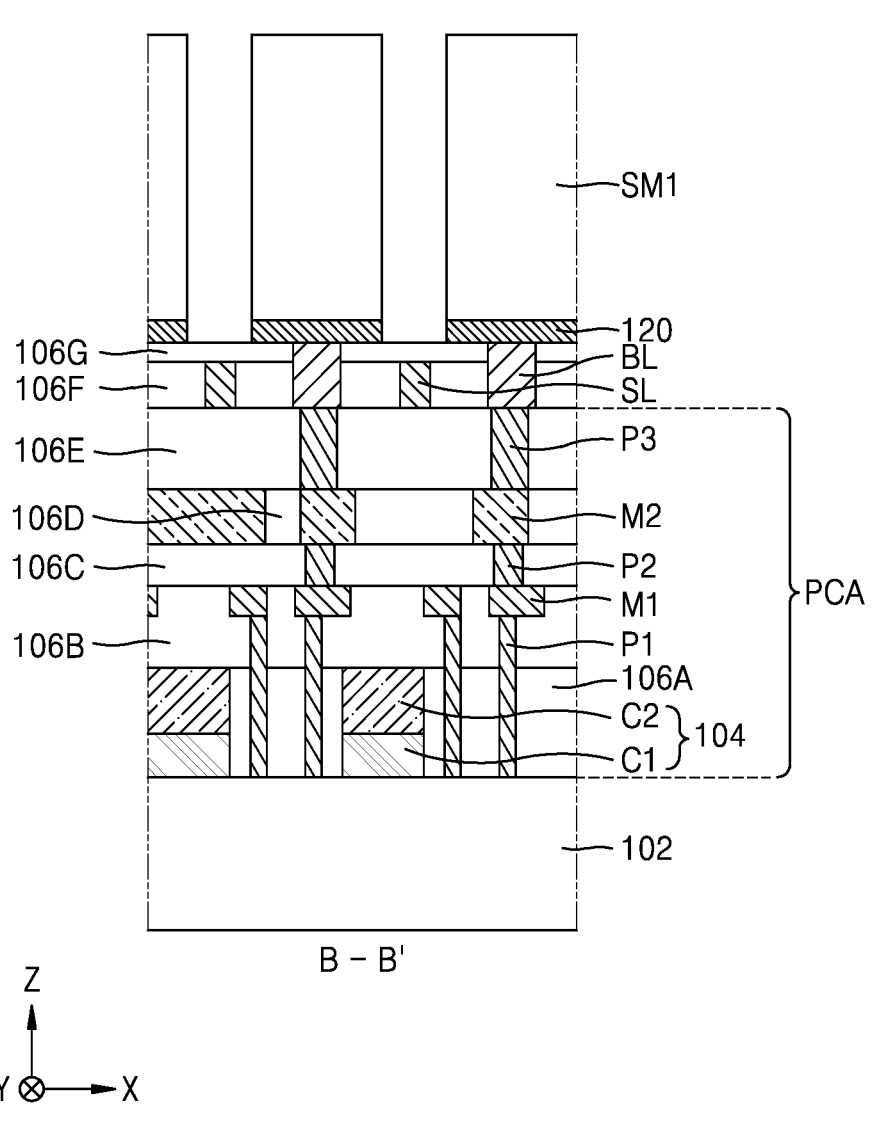

Referring to FIGS. 14A, 14B, and 14C, a sacrificial pattern SM1 covering the channel layer 120L may be formed in the resultant structure of FIGS. 13A, 13B, and 13C, and the channel layer 120L may be etched by using the sacrificial pattern SM1 as an etch mask. Thus, the channel layer 120L may be divided into a plurality of main channel portions 120. The interlayer insulating film 106G may be exposed between every two adjacent ones of the plurality of main channel portions 120 inside the plurality of openings 110H.

Figure 15A:
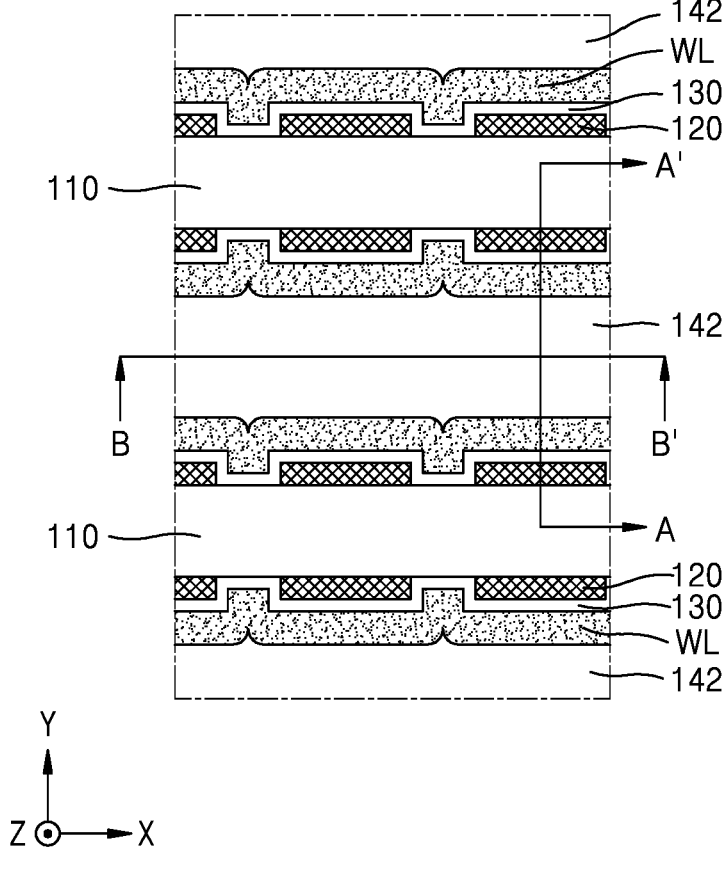
Figure 15B:
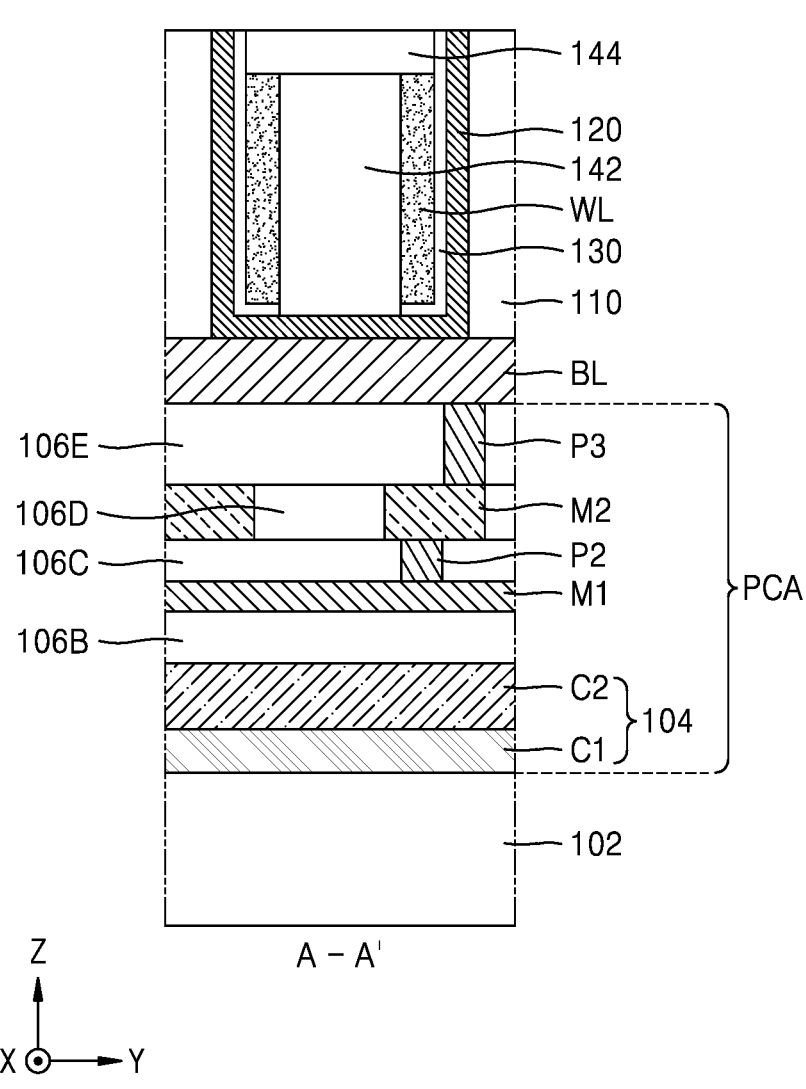
Figure 15C:
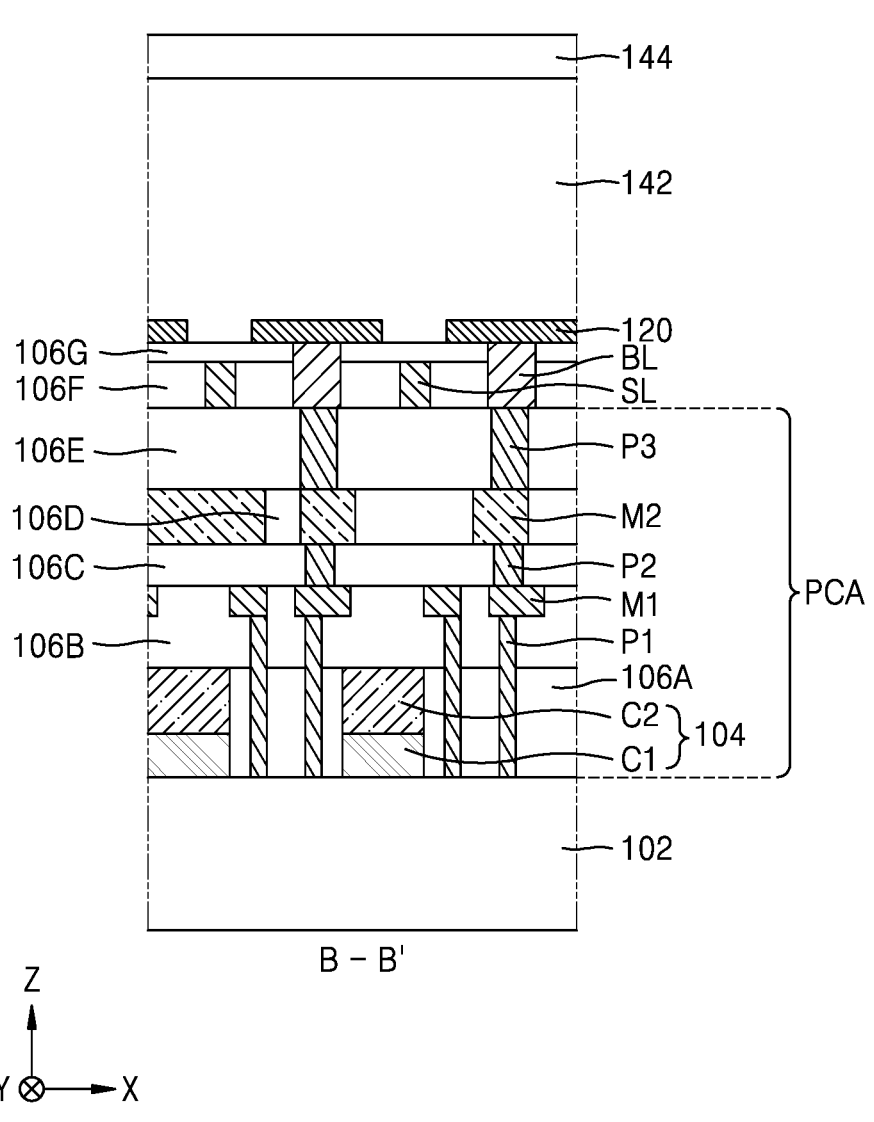

Referring to FIGS. 15A, 15B, and 15C, the sacrificial pattern SM1 may be removed from the resultant structure of FIGS. 14A, 14B, and 14C to expose a top surface of each of the plurality of main channel portions 120. Thereafter, a plurality of gate dielectric films 130 and a plurality of word lines WL may be formed to sequentially cover the plurality of main channel portions 120 inside the mold insulating pattern 110.

In embodiments, to form the plurality of gate dielectric films 130 and the plurality of word lines WL, after the top surface of each of the plurality of main channel portions 120 is exposed, the gate dielectric film 130 may be firstly formed to conformally cover the respective exposed surfaces of the plurality of main channel portions 120 and the interlayer insulating film 106G. Thereafter, the plurality of word lines WL may be formed on the gate dielectric film 130. In a patterning process for forming the plurality of word lines WL, a portion of the gate dielectric film 130 between two word lines WL inside the opening 110H may be removed. The top surface of the main channel portion 120 may be exposed between the two word lines WL located inside the opening 110H.

Subsequently, a lower insulating partition wall 142 may be formed to fill a space between the two word lines WL inside the opening 110H, and an upper insulating partition wall 144 may be formed to cover a top surface of each of the two word lines WL and the lower insulating partition wall 142 inside the opening 110H. Respective top surfaces of the upper insulating partition wall 144, the gate dielectric film 130, the word line WL, and the mold insulating pattern 110 may form one planar surface.

Figure 16A:
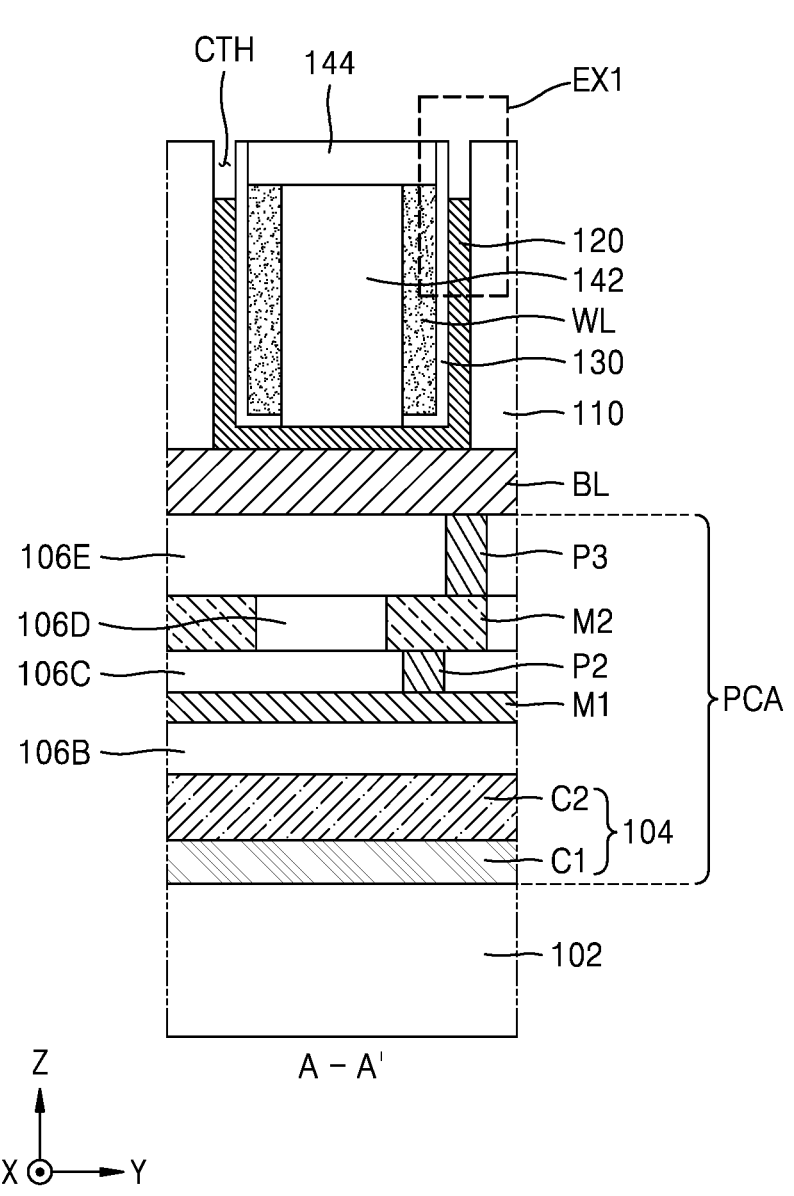
FIGS. 16A, 17A, 18A, and 19A are cross-sectional views of a region corresponding to the cross-section taken along line A-A' of FIG. 1, according to the process sequence.
Figure 16B:
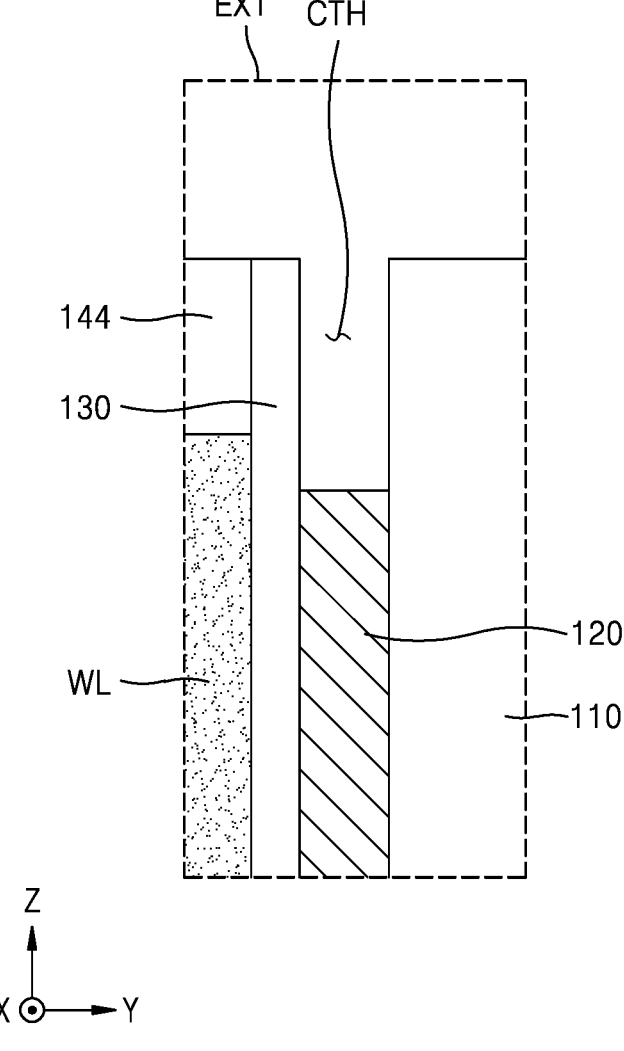

Referring to FIGS. 16A and 16B, portions may be removed from the respective top surfaces of the plurality of main channel portions 120, which are exposed in the resultant structure of FIGS. 15A, 15B, and 15Ca, and thus, heights of the plurality of main channel portions 120 may be reduced. As a result, a plurality of contact spaces CTH, which are defined by a sidewall of the gate dielectric film 130 and a sidewall of the mold insulating pattern 110, may be formed on the plurality of main channel portions 120. The process of removing the portions from the respective top surfaces of the plurality of main channel portions 120 may be performed by using a wet process, a dry process, or a combination thereof.

Figure 17A:
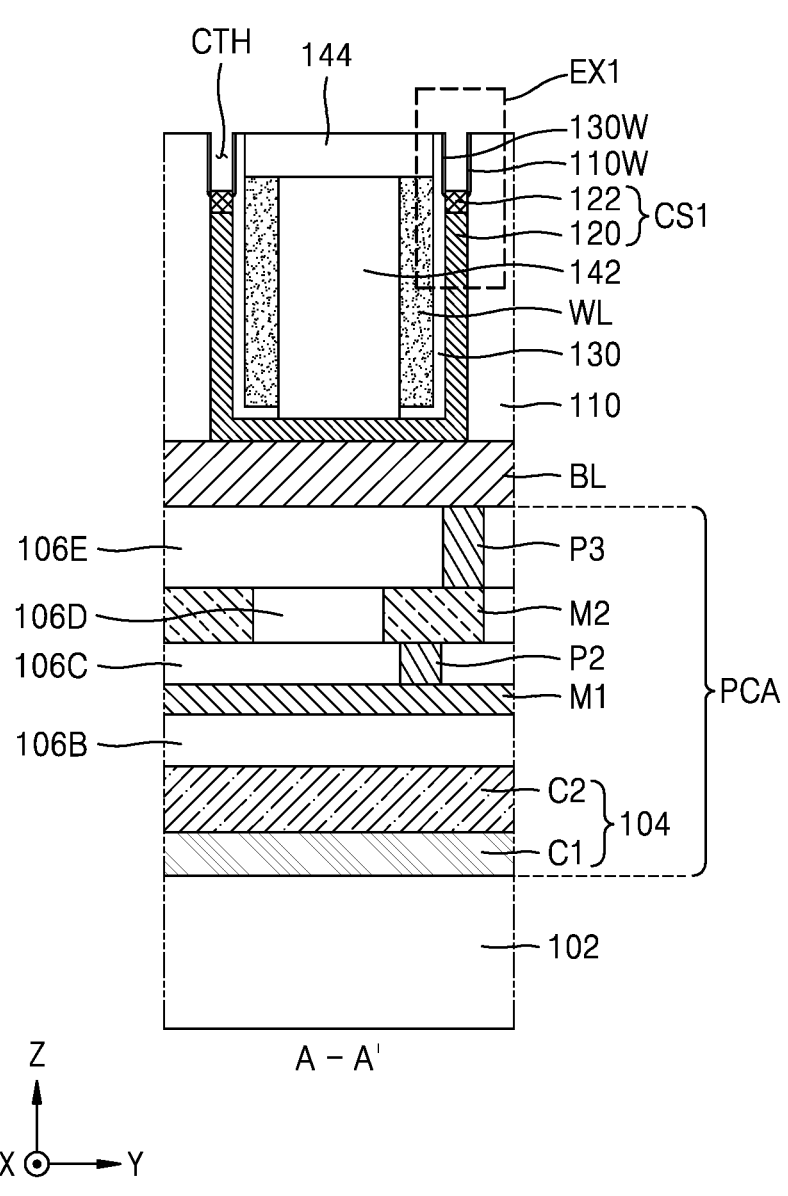
Figure 17B:
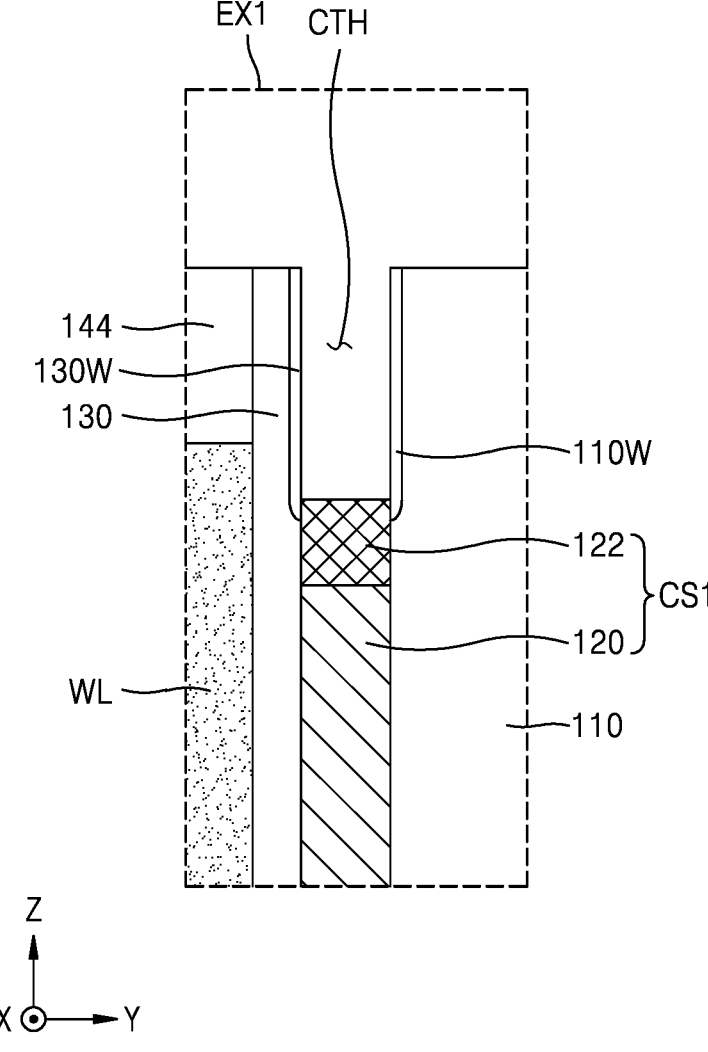

Referring to FIGS. 17A and 17B, in the resultant structure of FIGS. 16A and 16B, an ion implantation process of implanting a dopant selected from aluminum (Al), boron (B), arsenic (As), fluorine (F), and hydrogen (H) may be performed on the plurality of main channel portions 120 through the plurality of contact spaces CTH. As a result, a composition of a partial upper region of each of the plurality of main channel portions 120 may be changed, and thus, a channel contact portion 122 including an oxide semiconductor layer including the dopant may be formed.

During the formation of the channel contact portion 122, the dopant may be implanted into an exposed sidewall of the gate dielectric film 130 and an exposed sidewall of the mold insulating pattern 110. Thus, a dielectric film barrier liner 130W may be formed on the exposed sidewall of the gate dielectric film 130, and a mold barrier liner 110W may be formed on the exposed sidewall of the mold insulating pattern 110.

Figure 18A:
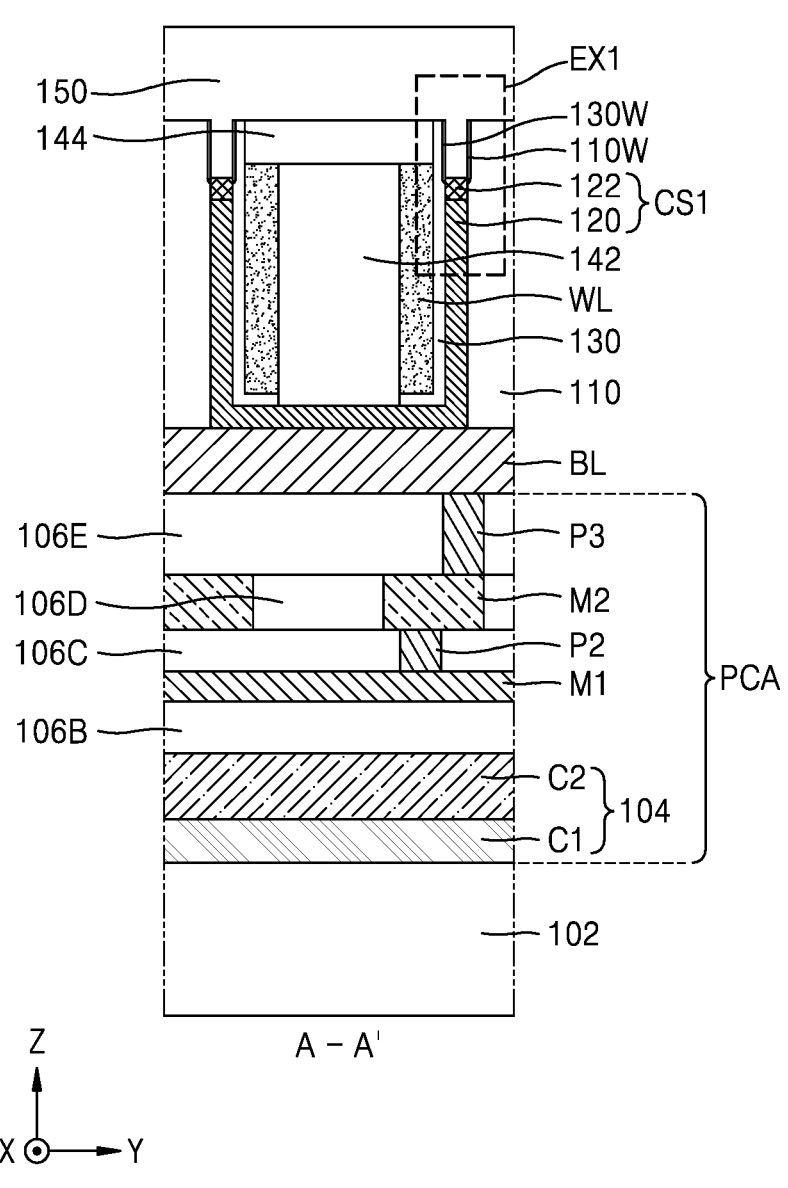
Figure 18B:
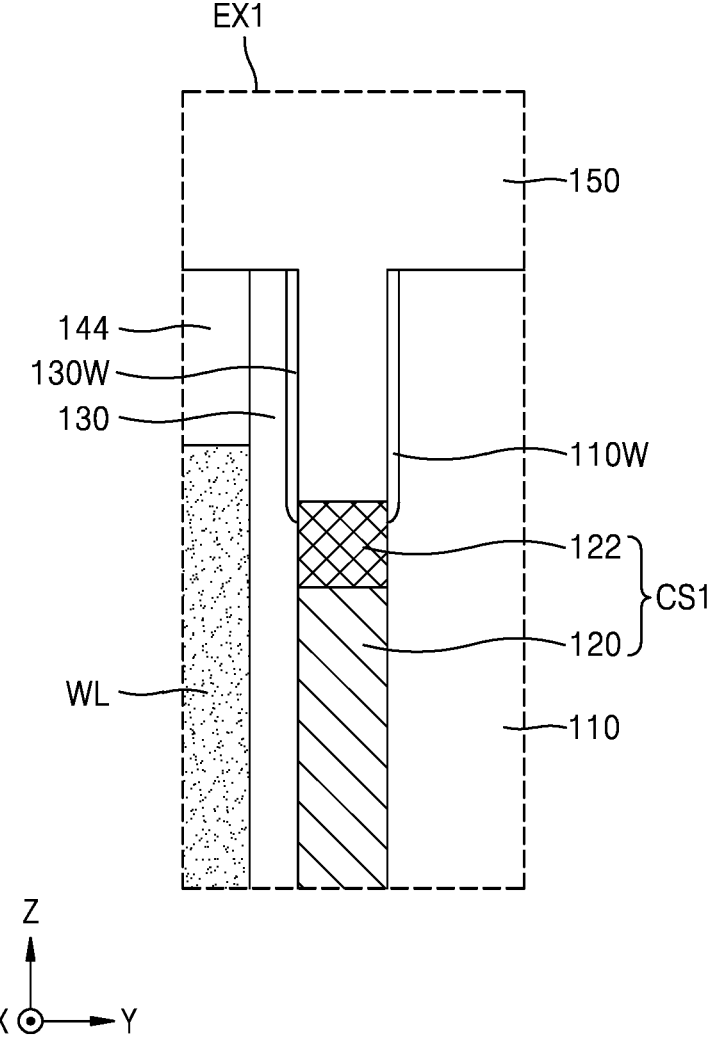

Referring to FIGS. 18A and 18B, in the resultant structure of FIGS. 17A and 17B, a conductive layer 150 may be formed to fill the plurality of contact spaces CTH and cover the top surface of each of the mold insulating pattern 110, the gate dielectric film 130, and the upper insulating partition wall 144. The conductive layer 150 may include Ti, TiN, Ta, TaN, Mo, Ru, W, WN, TiSiN, WSiN, or a combination thereof. For example, the conductive layer 150 may have a stack structure of a conductive barrier film including TiN and a conductive film including W.

Figure 19A:
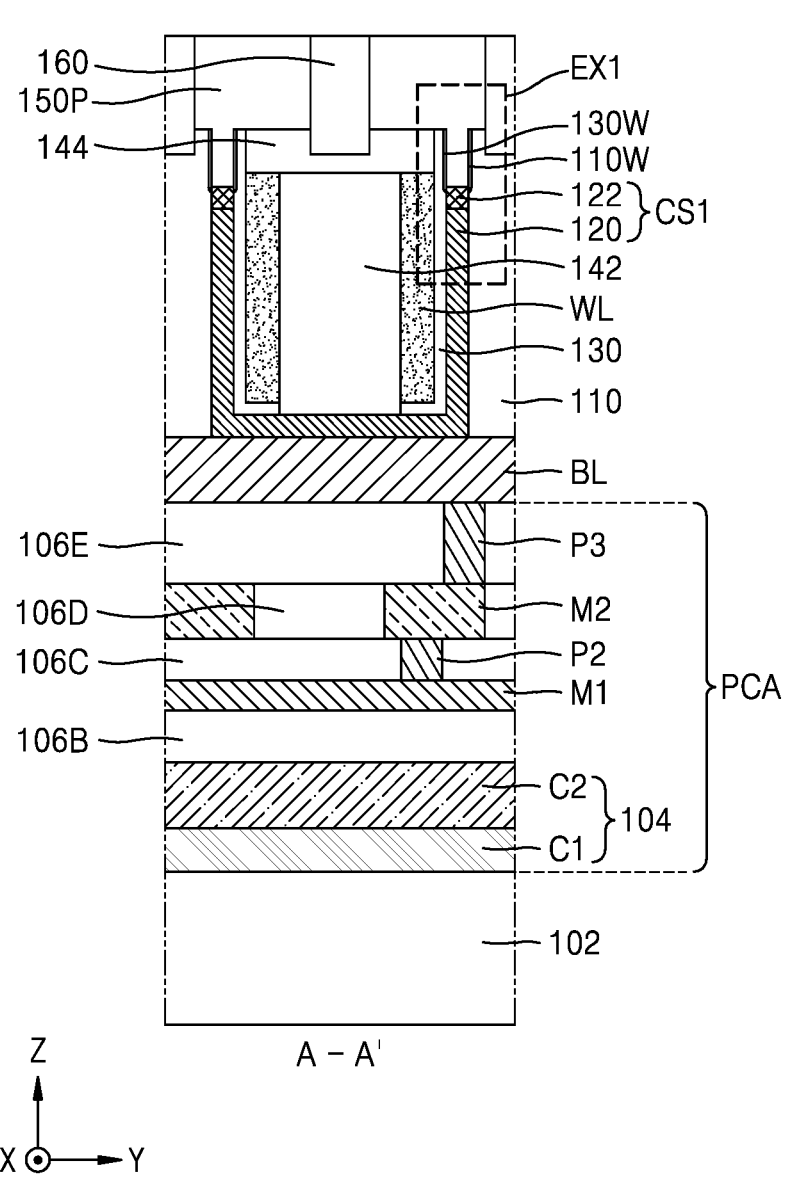
Figure 19B:
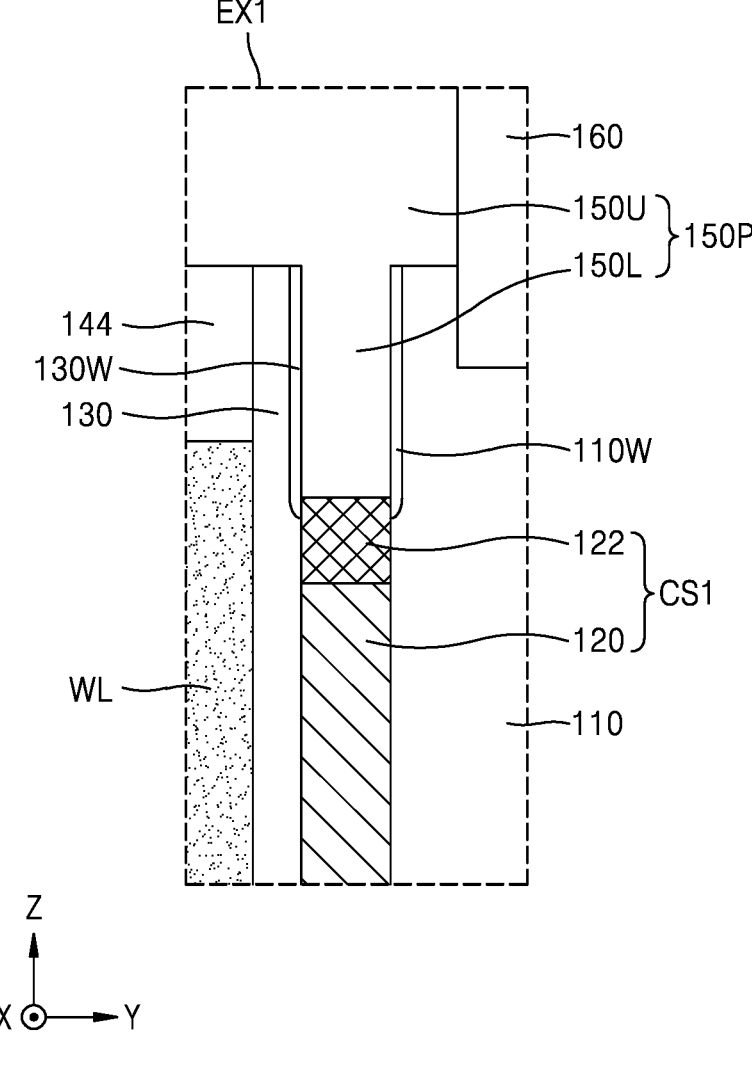

Referring to FIGS. 19A and 19B, in the resultant structure of FIGS. 18A and 18B, partial regions of the conductive layer 150 may be etched to form an isolation space exposing the upper insulating partition wall 144, and a plurality of conductive contact patterns 150P may be formed from the conductive layer 150. Thereafter, an isolation insulating film 160 may be formed to fill the isolation space.

Afterwards, as shown in FIGS. 2A and 2B, an etch stop film 162 and an interlayer insulating film 170 may be formed on the resultant structure including the plurality of conductive contact patterns 150P. A plurality of capacitor structures CAP may be formed to pass through the etch stop film 162 and the interlayer insulating film 170 and be connected to the plurality of conductive contact patterns 150P.

Although an example of the method of manufacturing the semiconductor device 100 shown in FIGS. 1 and 2A to 2C has been described with reference to FIGS. 11A to 19B, it will be understood that semiconductor devices having various structures may be manufactured by making various modifications and changes within the scope of the inventive concept.

For example, to manufacture the semiconductor device 100A shown in FIG. 3A, in the process described with reference to FIGS. 16A and 16B, a portion may be removed from the top surface of each of the main channel portions 120 may be removed by using a wet etching process, and thus, a concave top surface T2 may be formed in the main channel portion 120. Afterwards, in a similar manner to that described with reference to FIGS. 17A and 17B, a dopant selected from aluminum (Al), boron (B), arsenic (As), fluorine (F), and hydrogen (H) may be implanted from the concave top surface T2 of the main channel portion 120 into the main channel portion 120. Thus, as shown in FIG. 3A, a main channel portion 120A having a concave top surface T1 and a channel contact portion 122A having the contact top surface T2 may be formed from the main channel portion 120.

To manufacture the semiconductor device 100B shown in FIG. 3B, while a portion is being removed from the top surface of each of the main channel portions 120 as described with reference to FIGS. 16A and 16B, a portion of the mold insulating pattern 110 may be etched together with the main channel portion 120 by controlling an etching atmosphere (e.g., a change in the composition of an etchant or an etching gas). Thus, a sidewall 110S including an inclined surface may be formed on the mold insulating pattern 110. Thereafter, while a dopant selected from aluminum (Al), boron (B), arsenic (As), fluorine (F), and hydrogen (H) is being implanted into the main channel portion 120 in a similar manner to that described with reference to FIGS. 17A and 17B, a mold barrier liner 110W, which extends slantwise along the sidewall 110S, may be formed.

To manufacture the semiconductor device 100C shown in FIG. 4, the sacrificial pattern SM1 may be removed from the resultant structure of FIGS. 14A, 14B, and 14C to expose the top surface of each of the plurality of main channel portions 120. Thereafter, similarly to the descriptions of FIGS. 15A, 15B, and 15C, a gate dielectric film 130 may be firstly formed to conformally cover the exposed surface of each of the plurality of main channel portions 120 and the interlayer insulating film 106G, and a plurality of word lines WL may be then formed on the gate dielectric film 130. In the process of patterning the plurality of word lines WL, a portion of the gate dielectric film 130 between the two word lines WL inside the opening 110H may be removed, and thus, the top surface of the main channel portion 120 may be exposed between the two word lines WL inside the opening 110H. Thereafter, the main channel portion 120 exposed inside the opening 110H may be etched to divide the main channel portion 120 into two portions and expose a top surface of the bit line BL. Subsequently, a lower insulating partition wall 142A may be formed to fill a space between the two word lines WL located inside the opening 110H and a space between the two main channel portions 120, and an upper insulating partition wall 144 may be formed to cover a top surface of the two word lines WL and the lower insulating partition wall 142A inside the opening 110H.

To manufacture the semiconductor device 200 shown in FIG. 5, a portion may be removed from the top surface of each of the main channel portions 120 in a similar manner to that described with reference to FIGS. 16A and 16B. Afterwards, the dopant implantation process described with reference to FIGS. 17A and 17B may be omitted, and a channel contact portion 222 may be formed on the main channel portion 120 in the contact space (refer to CTH in FIGS. 16A and 16B) before a process of forming the conductive layer 150 is performed as described with reference to FIGS. 18A and 18B. In embodiments, to form the channel contact portion 222, a second oxide semiconductor material having a different composition from a first oxide semiconductor material included in the main channel portion 120 may be deposited on the main channel portion 120 exposed in the contact space CTH. Thereafter, a portion of a deposition film including the second oxide semiconductor material may be removed by using an etchback process, and thus, the channel contact portion 222 may remain on the main channel portion 120.

To manufacture the semiconductor device 200A shown in FIG. 6, a method similar to the above-described method of manufacturing the semiconductor device 100B shown in FIG. 3B may be used. However, while each of the main channel portions 120 is partially removed from the top surface thereof in a similar manner to that described with reference to FIGS. 16A and 16B, a sidewall 110S including an inclined surface may be formed on the mold insulating pattern 110. The ion implantation process described with reference to FIGS. 17A and 17B may be omitted, and a channel contact portion 222A may be formed on the main channel portion 120 inside the contact space (refer to CTH in FIGS. 16A and 16B) before performing the process of forming the conductive layer 150 as described with reference to FIGS. 18A and 18B. To form the channel contact portion 222A, processes similar to the above-described process of forming the channel contact portion 222 shown in FIG. 5 may be performed.

Figure 20A:
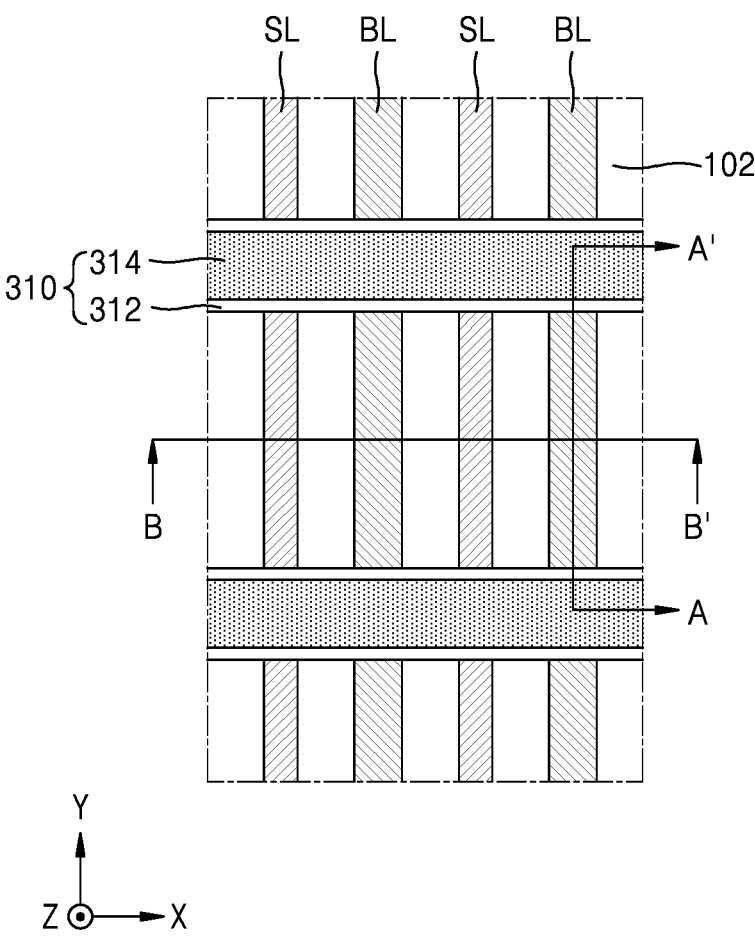

FIGS. 20A to 24B are diagrams of a process sequence of a method of manufacturing a semiconductor device, according to embodiments. More specifically, FIG. 20A is a plan layout diagram of the method of manufacturing the semiconductor device. FIGS. 20B, 21A, 22A, 23A, and 24A are cross-sectional views of a region corresponding to the cross-section taken along line A-A' of FIG. 1, according to the process sequence; FIGS. 21B, 22B, 23B, and 24B are respectively enlarged cross-sectional views of portions "EX3" of FIGS. 21A, 22A, 23A, and 24A. An example of a method of manufacturing the semiconductor device 300 shown in FIGS. 7A and 7B will be described with reference to FIGS. 20A to 24B. In FIGS. 20A to 24B, the same reference numerals are used to denote the same elements as in FIGS. 1, 2A to 2C, 7A, and 7B, and repeated descriptions thereof are omitted here.

Figure 20B:
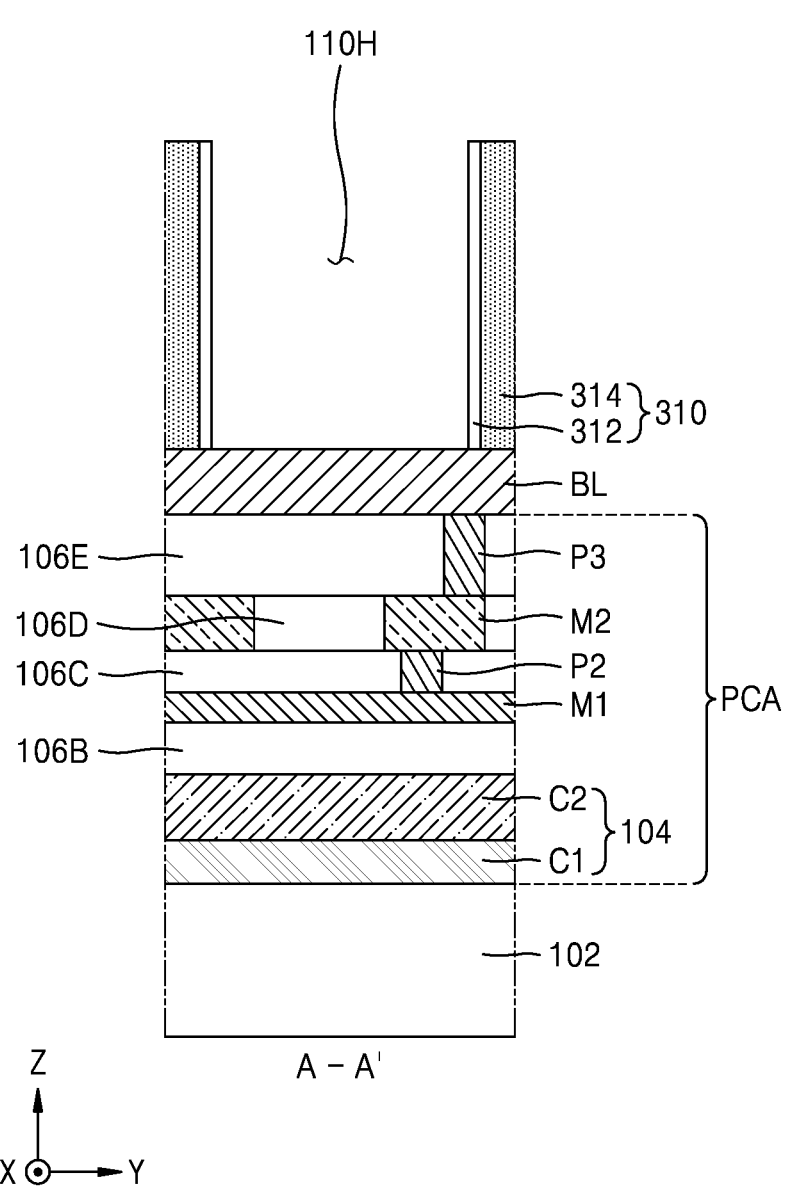
FIGS. 20B, 21A, 22A, 23A, and 24A are cross-sectional views of a region corresponding to the cross-section taken along line A-A' of FIG. 1, according to the process sequence.

Referring to FIGS. 20A and 20B, a peripheral circuit structure PCA, a plurality of shielding structures SL, and the plurality of bit lines BL may be formed on a substrate 102 in the same manner as described with reference to FIGS. 11A, 11B, and 11C. Thereafter, a mold insulating pattern 310 having a plurality of openings 110H may be formed in a similar manner to the process of forming the mold insulating pattern 110, which has been described with reference to FIGS. 12A, 12B, and 12C. The mold insulating pattern 310 may be formed to include a first mold insulating pattern 312 and a second mold insulating pattern 314, which include different materials from each other.

Figure 21A:
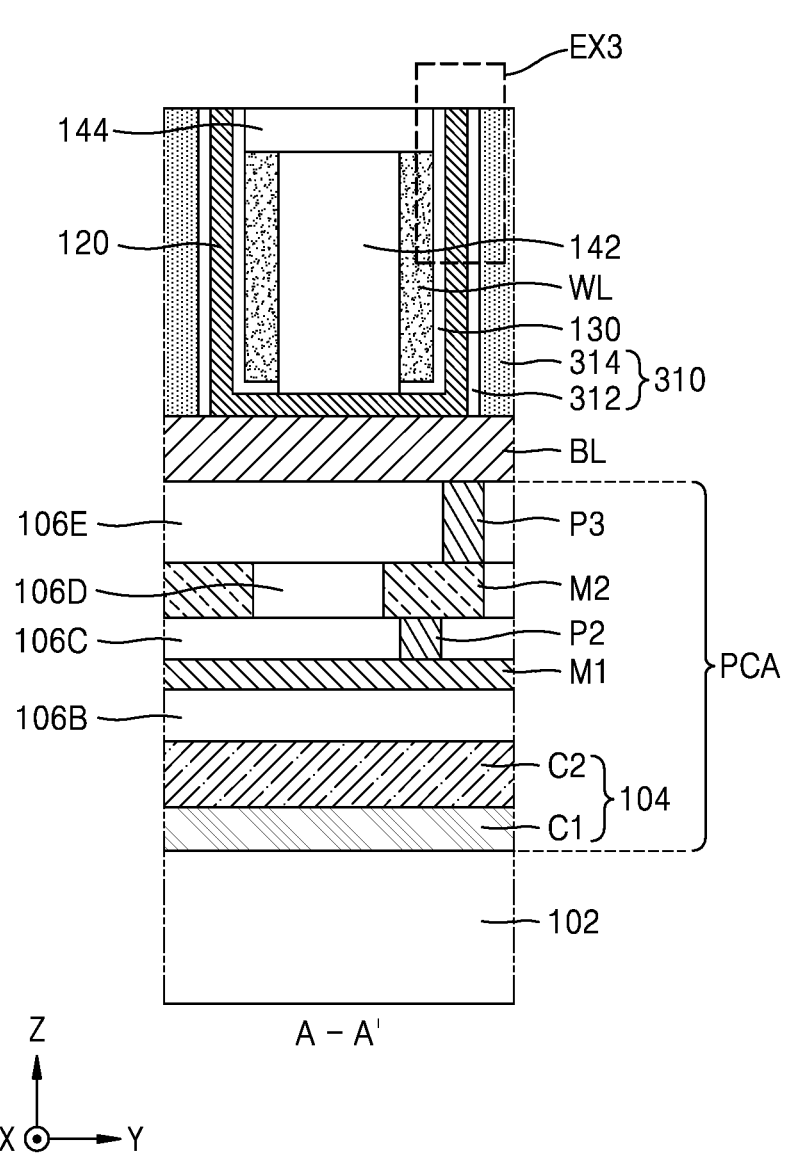
Figure 21B:
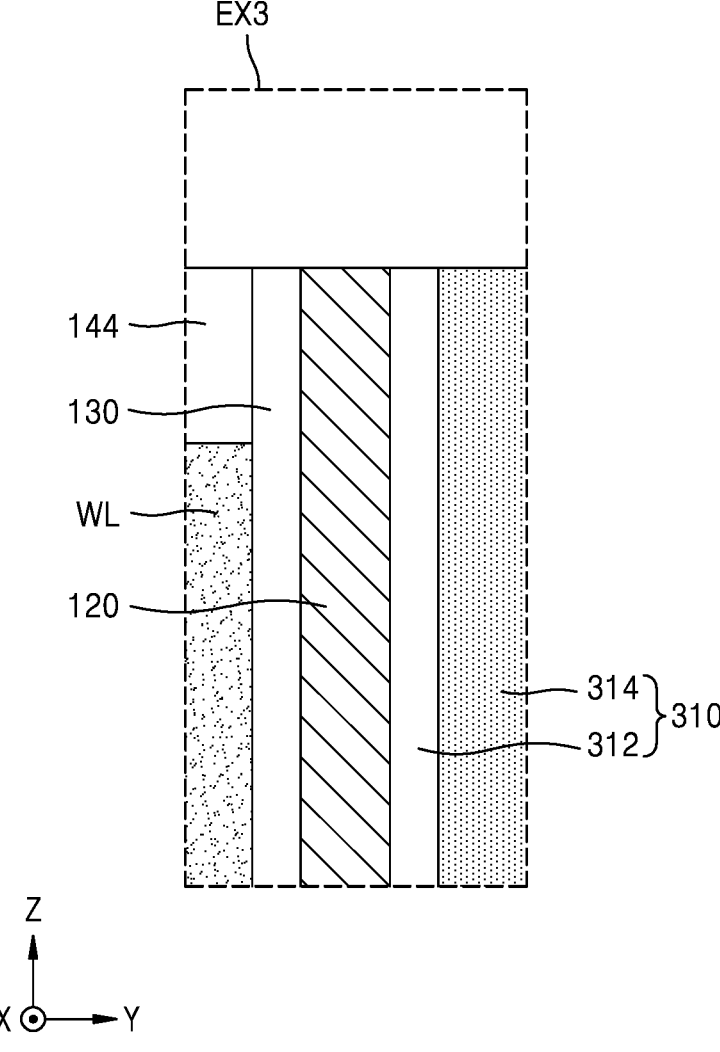

Referring to FIGS. 21A and 21B, in a similar manner to that described with reference to FIGS. 13A to 15C, a main channel portion 120, a plurality of gate dielectric films 130, a plurality of word lines WL, a lower insulating partition wall 142, and an upper insulating partition wall 144 may be formed inside the opening 110H of the mold insulating pattern 310 in the resultant structure of FIGS. 20A and 20B.

Figure 22A:
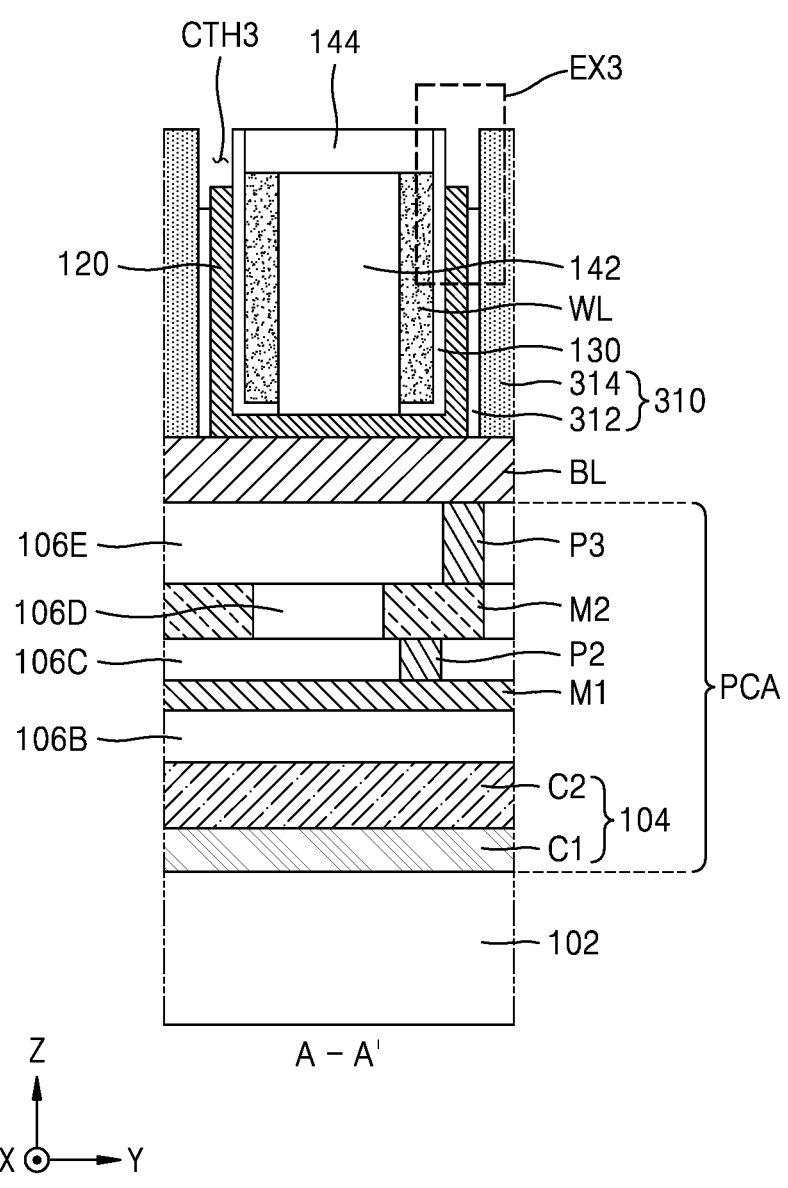
Figure 22B:
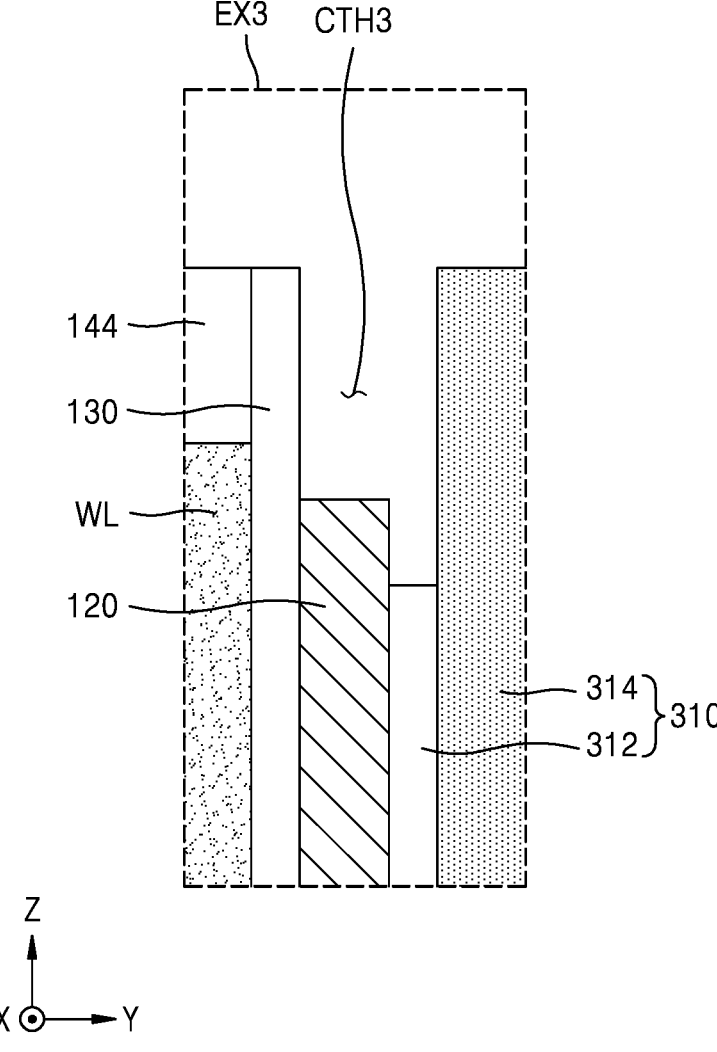

Referring to FIGS. 22A and 22B, a portion may be removed by etching from a top surface of the main channel portion 120 in a similar manner to that described with reference to FIGS. 16A and 16B. Thus, a height of the main channel portion 120 may be removed, and a contact space CTH3 may be formed on the main channel portion 120. In this case, by controlling etching conditions of the main channel portion 120, the first mold insulating pattern 312 of the mold insulating pattern 310 may be partially etched from a top surface thereof during the etching of the main channel portion 120. As a result, in the contact space CTH3 prepared on the main channel portion 120, the top surface and a sidewall of the main channel portion 120, the sidewall of the gate dielectric film 130, and a sidewall of the second mold insulating pattern 314 may be exposed.

Figure 23A:
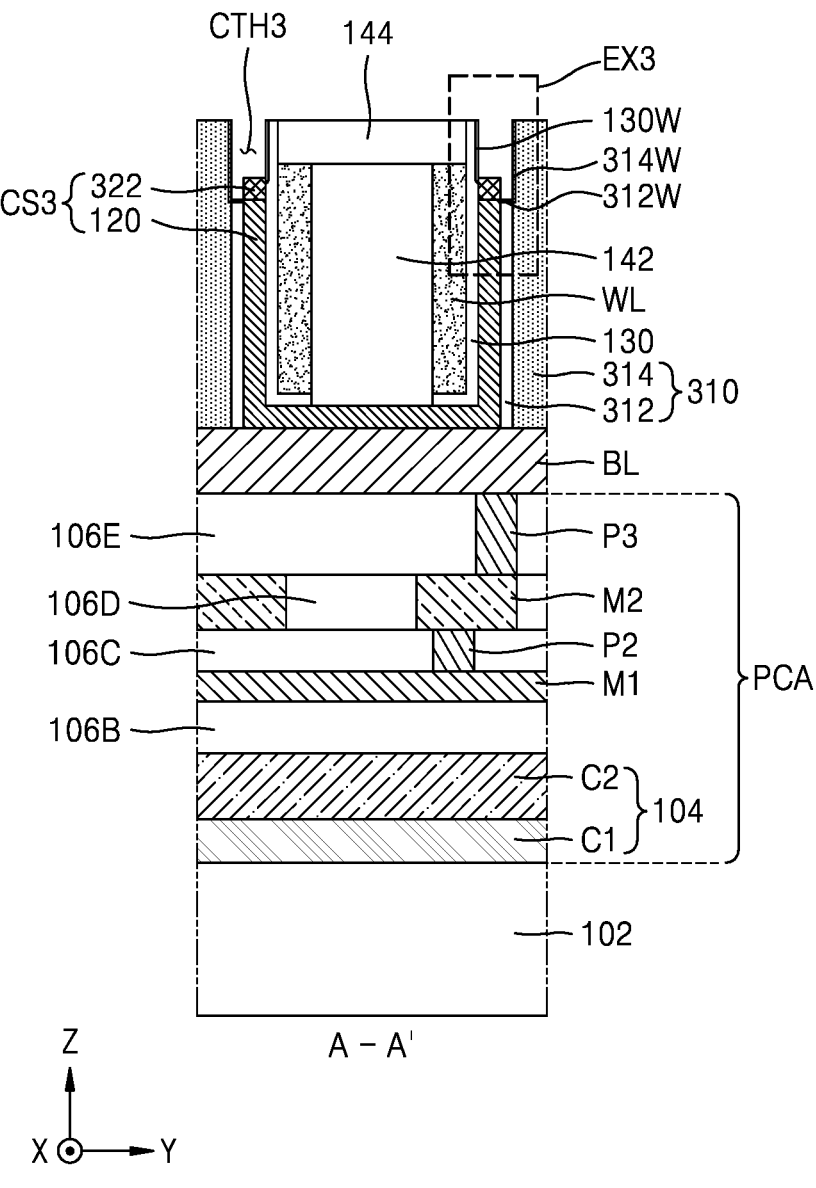
Figure 23B:
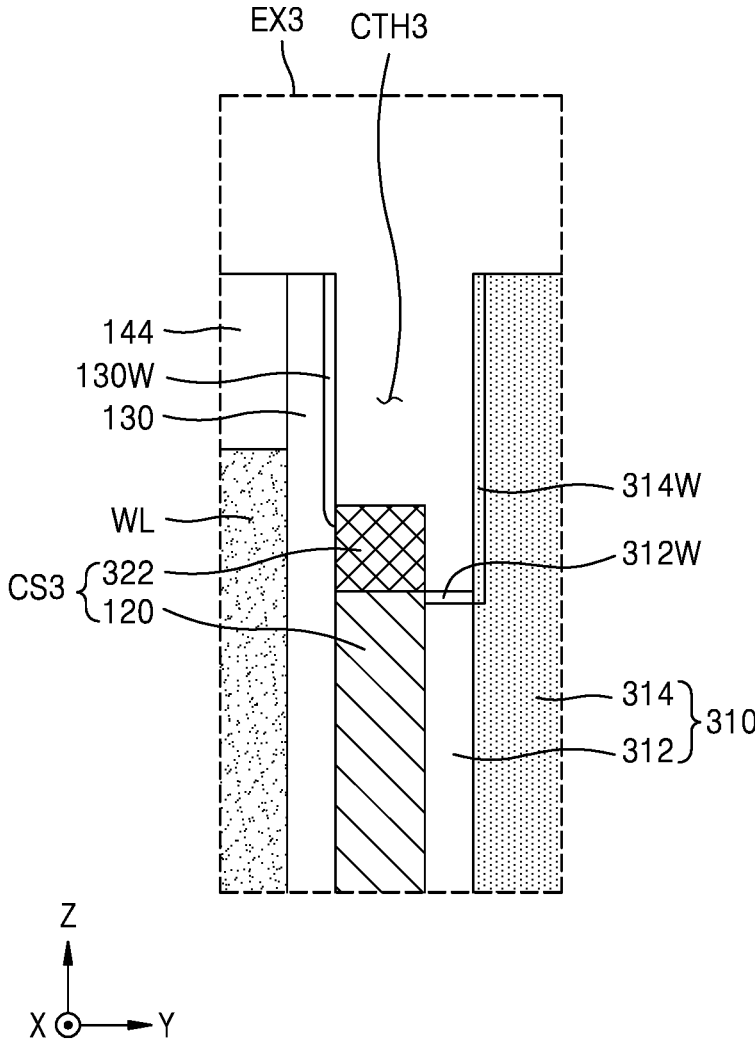

Referring to FIGS. 23A and 23B, in a similar manner to that described with reference to FIGS. 17A and 17B, in the resultant structure of FIGS. 22A and 22B, an ion implantation process of implanting a dopant selected from aluminum (Al), boron (B), arsenic (As), fluorine (F), and hydrogen (H) may be performed on the main channel portion 120 through the contact space CTH3. As a result, a composition of an upper partial region of each of the plurality of main channel portions 120 may be changed, and thus, a channel contact portion 322 including an oxide semiconductor layer including a dopant may be formed.

During the formation of the channel contact portion 322, the dopant may also be implanted into the exposed sidewall of the gate dielectric film 130 and the exposed surface of the mold insulating pattern 310. Thus, a dielectric film barrier liner 130W may be formed on the exposed sidewall of the gate dielectric film 130, a mold barrier liner 312W may be formed on a top surface of the first mold insulating pattern 312, and a mold barrier liner 314W may be formed on the sidewall of the second mold insulating pattern 314.

Figure 24A:
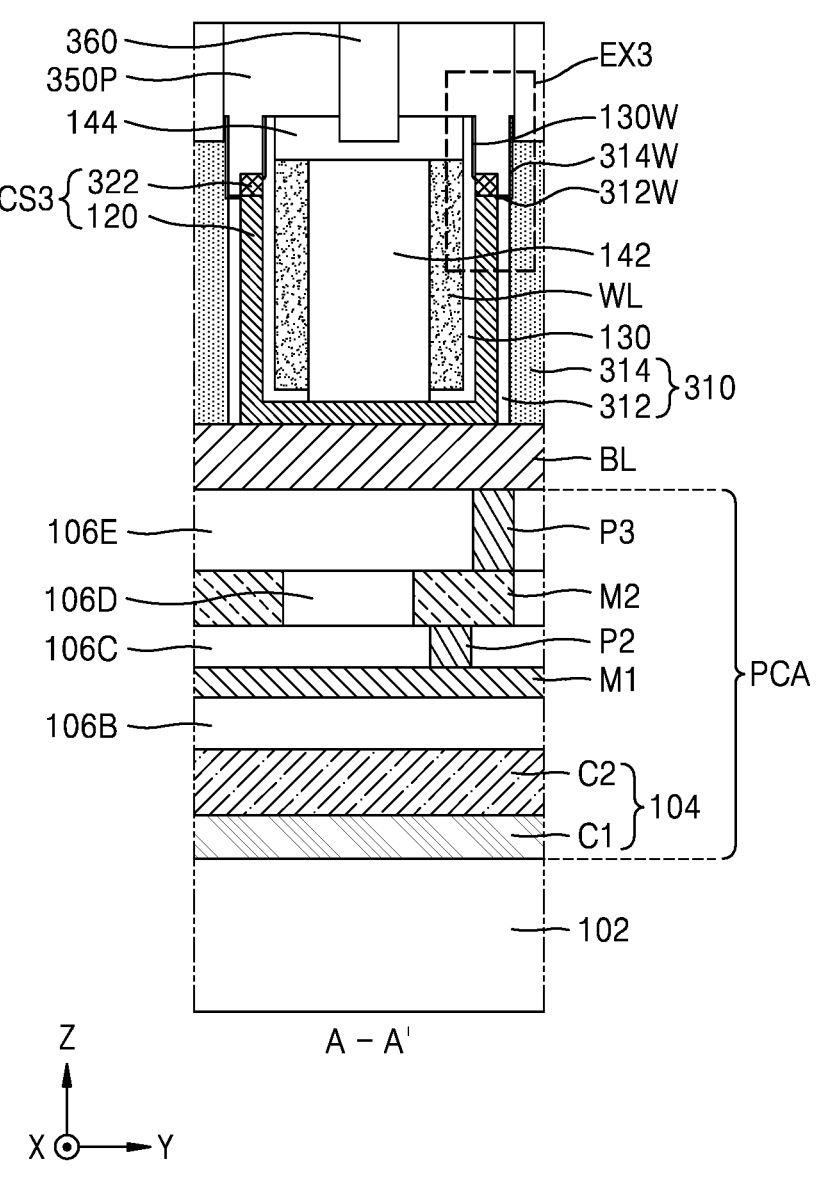
Figure 24B:
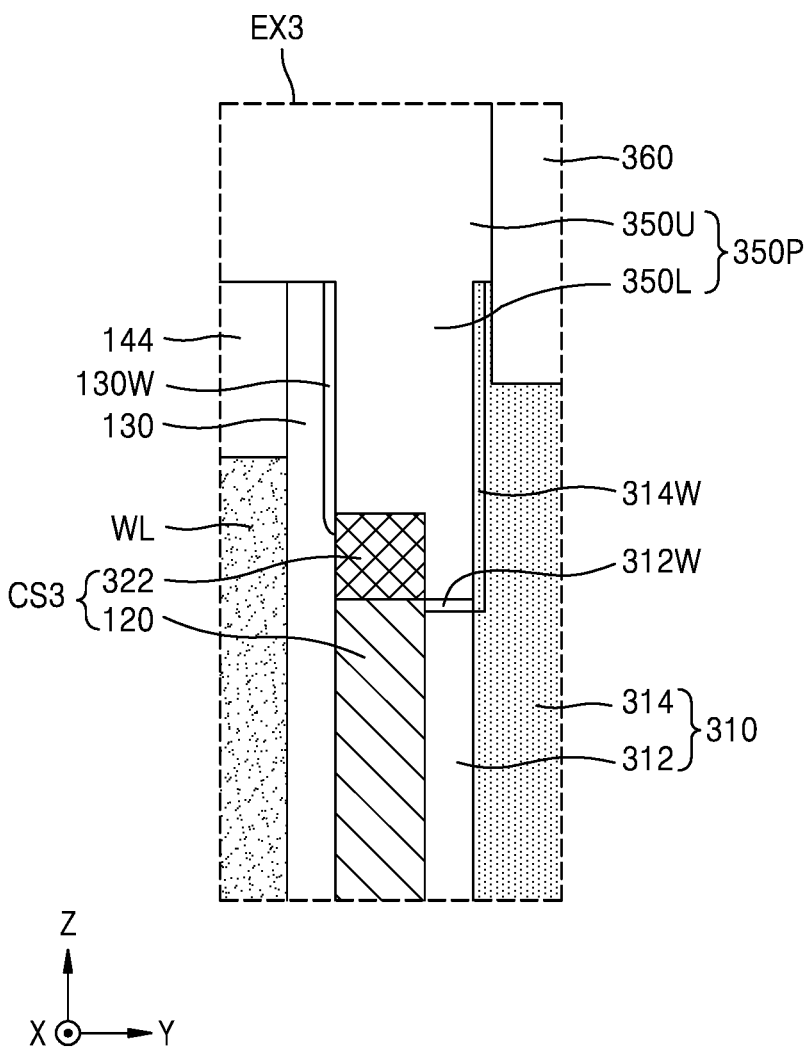

Referring to FIGS. 24A and 24B, in a similar manner to the process of forming the plurality of conductive contact patterns 150P and an isolation insulating film 160 as described with reference to FIGS. 18A to 19B, a plurality of conductive contact patterns 350P and an isolation insulating film 360 may be formed on the resultant structure of FIGS. 23A and 23B.

Figure 25A:
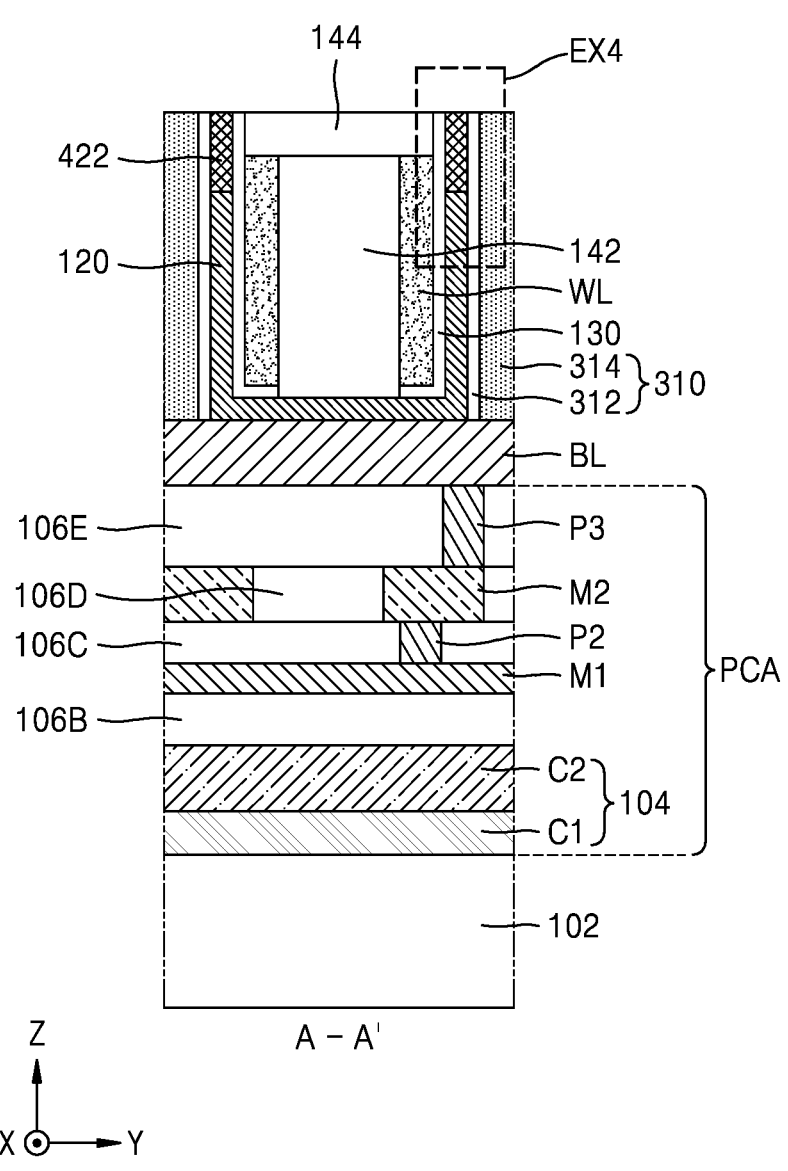
Figure 25B:
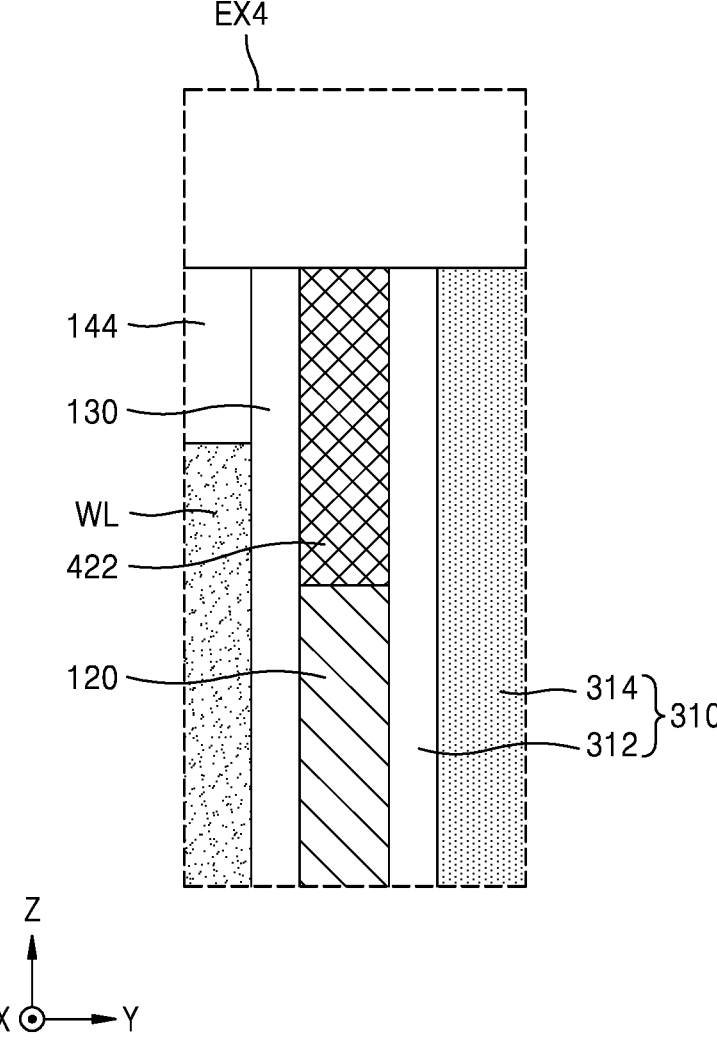
Figure 26A:
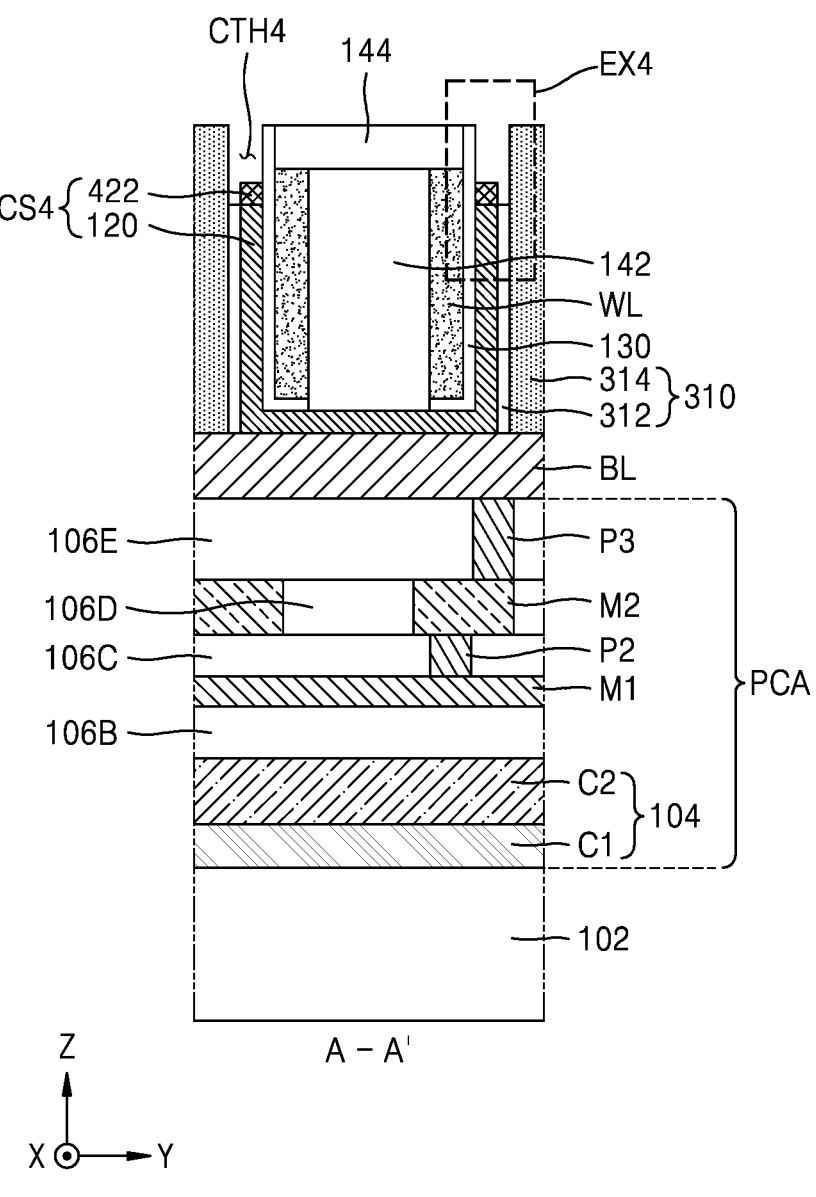
Figure 26B:
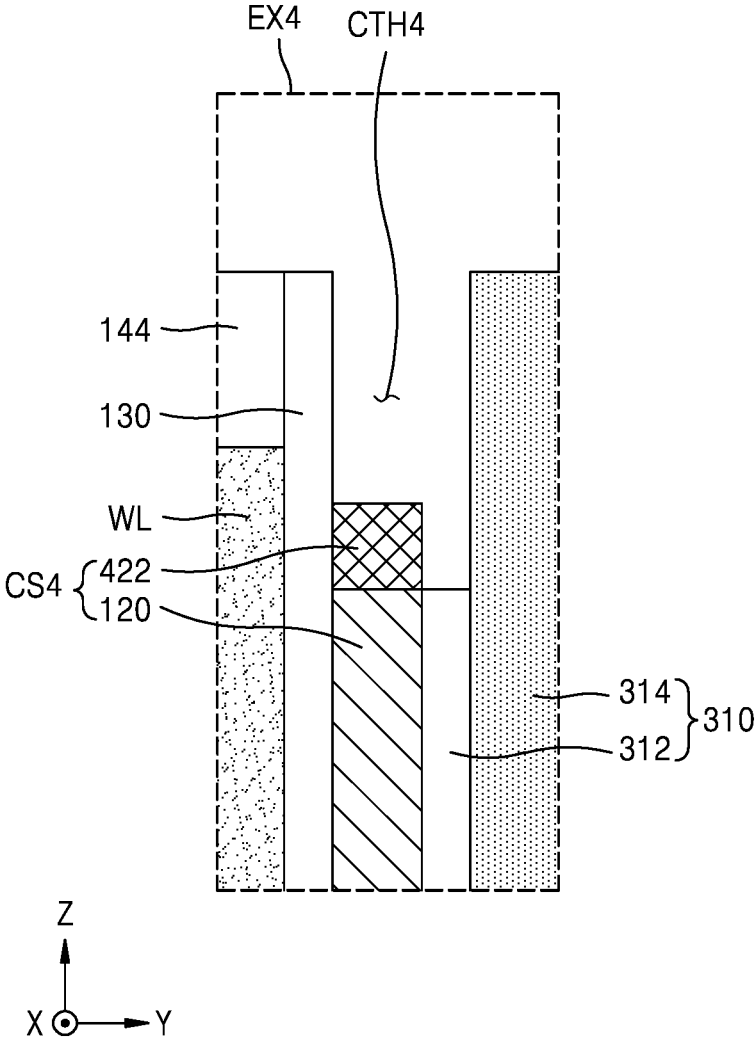

FIGS. 25A to 26B are diagrams of a process sequence of a method of manufacturing a semiconductor device, according to embodiments. More specifically, FIGS. 25A and 26A are cross-sectional views of a region corresponding to the cross-section taken along line A-A' of FIG. 1, according to the process sequence. FIGS. 25B and 26B are respectively enlarged cross-sectional views of portions "EX4" of FIGS. 25A and 26A. An example of a method of manufacturing the semiconductor device 400 shown in FIGS. 9A and 9B will be described with reference to FIGS. 9A and 9B. In FIGS. 25A to 26B, the same reference numerals are used to denote the same elements as in FIGS. 1, 2A to 2C, 7A, 7B, 9A, and 9B, and repeated descriptions thereof are omitted here.

Referring to FIGS. 25A and 25B, after the processes described with reference to FIGS. 20A to 21B are formed, a portion of a main channel portion 120 may be removed from the resultant structure of FIGS. 21A and 21B. Thus, a height of the main channel portion 120 may be reduced, and a contact space (not shown) may be formed on the main channel portion 120. Thereafter, a channel contact portion 422 may be formed in the contact space. The channel contact portion 422 may be formed by using a CVD process or an ALD process.

Referring to FIGS. 26A and 26B, the channel contact portion 422 may be partially removed from a top surface thereof in the resultant structure of FIGS. 25A and 25B, and thus, a height of the channel contact portion 422 may be reduced. In this case, in a manner to the process of etching the main channel portion 120 as described with reference to FIGS. 22A to 22B, the channel contact portion 422 may be partially removed by etching from the top surface thereof, and thus, a height of the channel contact portion 422 may be reduced, and a contact space CTH4 may be formed on the channel contact portion 422. While a portion of the channel contact portion 422 is being etched, a first mold insulating pattern 312 of a mold insulating pattern 310 may also be partially etched from a top surface thereof by controlling etching conditions. As a result, in the contact space CTH4 prepared on the channel contact portion 422, the top surface and a sidewall of the channel contact portion 422, a sidewall of a gate dielectric film 130, and a sidewall of a second mold insulating pattern 314 may be exposed.

Thereafter, the semiconductor device 400 shown in FIGS. 9A and 9B may be manufactured by performing the processes described with reference to FIGS. 24A and 24B.

Although examples of the methods of manufacturing the semiconductor device 300 shown in FIGS. 7A and 7B and the semiconductor device 400 shown in FIGS. 9A and 9B has been described with reference to FIGS. 20A to 26B, it will be understood that the semiconductor devices 300A and 400A shown in FIGS. 8 and 10 and semiconductor devices having variously changed structures may be manufactured by applying various modifications and changes to the processes described with reference to FIGS. 20A to 26B within the scope of the inventive concept.

While the inventive concept has been particularly shown and described with reference to embodiments thereof, it will be understood that various changes in form and details may be made therein without departing from the scope of the following claims.

What is claimed is:

1. A semiconductor device comprising:
an upper conductive line on a substrate;
a channel structure adjacent the upper conductive line;
a gate dielectric film between the channel structure and the upper conductive line; and
a conductive contact pattern electrically connected to the channel structure,
wherein the channel structure comprises:
a main channel portion comprising an oxide semiconductor layer having a first composition; and
a channel contact portion between the main channel portion and the conductive contact pattern, wherein the channel contact portion is in contact with the conductive contact pattern and comprises a material having a second composition that is different from the first composition.

2. The semiconductor device of claim 1, wherein the channel contact portion and the oxide semiconductor layer respectively comprise one or more same elements, and the channel contact portion further comprises at least one dopant, wherein the at least one dopant comprises aluminum (Al), boron (B), arsenic (As), fluorine (F), or hydrogen (H).

3. The semiconductor device of claim 1, wherein an uppermost surface of the channel structure is closer to the substrate than an uppermost surface of the gate dielectric film, and wherein the gate dielectric film extends along a sidewall of conductive contact pattern.

4. The semiconductor device of claim 1, wherein the gate dielectric film comprises a dielectric film barrier liner in contact with the conductive contact pattern, and the dielectric film barrier liner comprises a metal oxide film comprising a dopant, wherein the dopant comprises aluminum (Al), boron (B), arsenic (As), fluorine (F), or hydrogen (H).

5. The semiconductor device of claim 1, wherein the oxide semiconductor layer of the main channel portion comprises indium gallium zinc oxide (InGaZnO or IGZO), tin-doped IGZO (Sn-IGZO), indium tungsten oxide (InWO or IWO), indium zinc oxide (InZnO or IZO), zinc tin oxide (ZnSnO or ZTO), zinc oxide (ZnO), yttrium-doped zinc oxide (YZO), indium gallium silicon oxide (InGaSiO or IGSO), indium (InO), tin oxide (SnO), titanium oxide (TiO), zinc oxynitride (ZnON), magnesium zinc oxide (MgZnO), zirconium indium zinc oxide (ZrInZnO), hafnium indium zinc oxide (HfInZnO), tin indium zinc oxide (SnInZnO), silicon indium zinc oxide (SiInZnO), gallium zinc tin oxide (GaZnSnO), zirconium zinc tin oxide (ZrZnSnO), or a combination thereof.

6. The semiconductor device of claim 1, wherein the conductive contact pattern comprises titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), or a combination thereof.

7. The semiconductor device of claim 1, further comprising:
a mold insulating pattern on the substrate, the mold insulating pattern having a sidewall defining a transistor region,
wherein the channel structure comprises a vertical channel portion extending along a vertical direction and in contact with the sidewall of the mold insulating pattern in the transistor region, and the channel contact portion is at an uppermost portion of the vertical channel portion relative to the substrate.

8. The semiconductor device of claim 1, further comprising:
a mold insulating pattern on the substrate, the mold insulating pattern having a sidewall defining a transistor region,
wherein the conductive contact pattern comprises surfaces in contact with a top surface and a sidewall of the channel contact portion, and a portion between the sidewall of the channel contact portion and the sidewall of the mold insulating pattern.

9. The semiconductor device of claim 1, further comprising:
a mold insulating pattern on the substrate, wherein the mold insulating pattern has a sidewall in contact with the conductive contact pattern, and
the sidewall of the mold insulating pattern comprises an inclined surface such that a distance between the sidewall of the mold insulating pattern and the gate dielectric film increases in a direction away from the substrate.

10. The semiconductor device of claim 1, further comprising:
a mold insulating pattern on the substrate, the mold insulating pattern comprising a sidewall facing the conductive contact pattern,
wherein the sidewall of the mold insulating pattern comprises a mold barrier liner in contact with the conductive contact pattern, and the mold barrier liner comprises an insulating film comprising a dopant, wherein the dopant comprises aluminum (Al), boron (B), arsenic (As), fluorine (F), or hydrogen (H).

11. The semiconductor device of claim 1, further comprising:
a lower conductive line between the substrate and the channel structure,
wherein the lower conductive line is spaced apart from the upper conductive line with the channel structure and the gate dielectric film therebetween in a vertical direction relative to the substrate and has a top surface in contact with the main channel portion,
the upper conductive line extends along a first lateral direction relative to the vertical direction, and
the lower conductive line extends along a second lateral direction that is perpendicular to the first lateral direction.

12. The semiconductor device of claim 1, further comprising:
a capacitor structure electrically connected to the conductive contact pattern.

13. A semiconductor device comprising:
a plurality of lower conductive lines extending in parallel on a substrate;
a mold insulating pattern on the plurality of lower conductive lines, the mold insulating pattern defining a transistor region extending along a first lateral direction;
a plurality of channel structures aligned along the first lateral direction in the transistor region, each of the plurality of channel structures comprising a vertical channel portion extending along a sidewall of the mold insulating pattern;
an upper conductive line on the plurality of channel structures in the transistor region, the upper conductive line having a sidewall facing the vertical channel portion of each of the plurality of channel structures, the upper conductive line extending along the first lateral direction;
a gate dielectric film between the plurality of channel structures and the upper conductive line; and
a plurality of conductive contact patterns electrically connected to the vertical channel portions of the plurality of channel structures, respectively,
wherein the vertical channel portions of the plurality of channel structures respectively comprise:
a main channel portion in contact with a respective lower conductive line among the plurality of lower conductive lines, the main channel portion comprising an oxide semiconductor layer having a first composition; and
a channel contact portion between the main channel portion and a respective conductive contact pattern among the plurality of conductive contact patterns, wherein the channel contact portion is in contact with the respective conductive contact pattern and comprises a material having a second composition that is different from the first composition.

14. The semiconductor device of claim 13, wherein the transistor region includes a plurality of transistors comprising the plurality of channel structures, and
the plurality of transistors comprise first and second transistors adjacent one another in a second lateral direction that is perpendicular to the first lateral direction,
wherein a respective channel structure among the plurality of channel structures is shared between the first and second transistors.

15. The semiconductor device of claim 13, wherein the channel contact portion and the oxide semiconductor layer respectively comprise one or more same elements, and the channel contact portion further comprises at least one dopant, wherein the at least one dopant comprises aluminum (Al), boron (B), arsenic (As), fluorine (F), or hydrogen (H).

16. The semiconductor device of claim 13, wherein an uppermost surface of each of the plurality of channel structures is closer to the substrate than an uppermost surface of the gate dielectric film, and
each of the plurality of conductive contact patterns has a respective sidewall facing the gate dielectric film.

17. The semiconductor device of claim 13, wherein the gate dielectric film comprises a dielectric film barrier liner in contact with the respective conductive contact pattern,
the mold insulating pattern comprises a mold barrier liner in contact with the respective conductive contact pattern, and
each of the channel contact portion, the dielectric film barrier liner, and the mold barrier liner comprises at least one dopant, wherein the at least one dopant comprises aluminum (Al), boron (B), arsenic (As), fluorine (F), or hydrogen (H).

18. The semiconductor device of claim 13, wherein the oxide semiconductor layer of the main channel portion comprises indium gallium zinc oxide (InGaZnO or IGZO), tin-doped IGZO (Sn-IGZO), indium tungsten oxide (InWO or IWO), indium zinc oxide (InZnO or IZO), zinc tin oxide (ZnSnO or ZTO), zinc oxide (ZnO), yttrium-doped zinc oxide (YZO), indium gallium silicon oxide (InGaSiO or IGSO), indium (InO), tin oxide (SnO), titanium oxide (TiO), zinc oxynitride (ZnON), magnesium zinc oxide (MgZnO), zirconium indium zinc oxide (ZrInZnO), hafnium indium zinc oxide (HfInZnO), tin indium zinc oxide (SnInZnO), silicon indium zinc oxide (SiInZnO), gallium zinc tin oxide (GaZnSnO), zirconium zinc tin oxide (ZrZnSnO), or a combination thereof, wherein the channel contact portion and the oxide semiconductor layer respectively comprise one or more same elements, and the channel contact portion further comprises at least one dopant, wherein the at least one dopant comprises aluminum (Al), boron (B), arsenic (As), fluorine (F), or hydrogen (H).

19. A semiconductor device comprising:

a peripheral circuit region on a substrate, the peripheral circuit region comprising a plurality of peripheral circuits;

a lower conductive line on the peripheral circuit region, the lower conductive line being electrically connected to the plurality of peripheral circuits;

a mold insulating pattern on the lower conductive line, the mold insulating pattern having a sidewall defining a transistor region;

a channel structure in the transistor region, the channel structure comprising a bottom surface in contact with a top surface of the lower conductive line and a vertical channel portion adjacent the sidewall of the mold insulating pattern;

a gate dielectric film on the channel structure in the transistor region;

an upper conductive line on the gate dielectric film in the transistor region, the upper conductive line having a sidewall adjacent the vertical channel portion; and a conductive contact pattern electrically connected to the vertical channel portion, wherein the vertical channel portion of the channel structure comprises:

a main channel portion spaced apart from the conductive contact pattern, the main channel portion comprising an oxide semiconductor layer having a first composition; and a channel contact portion in contact with the conductive contact pattern and comprising a material having a second composition that is different from the first composition.

20. The semiconductor device of claim 19, wherein the gate dielectric film comprises a dielectric film barrier liner in contact with the conductive contact pattern, wherein the mold insulating pattern comprises a mold barrier liner in contact with the conductive contact pattern, wherein the oxide semiconductor layer of the main channel portion comprises a first oxide semiconductor material of a first group, wherein the first group comprises indium gallium zinc oxide (InGaZnO or IGZO), tin-doped IGZO (Sn-IGZO), indium tungsten oxide (InWO or IWO), indium zinc oxide (InZnO or IZO), zinc tin oxide (ZnSnO or ZTO), zinc oxide (ZnO), yttrium-doped zinc oxide (YZO), indium gallium silicon oxide (InGaSiO or IGSO), indium (InO), tin oxide (SnO), titanium oxide (TiO), zinc oxynitride (ZnON), magnesium zinc oxide (MgZnO), zirconium indium zinc oxide (ZrInZnO), hafnium indium zinc oxide (HfInZnO), tin indium zinc oxide (SnInZnO), silicon indium zinc oxide (SiInZnO), gallium zinc tin oxide (GaZnSnO), zirconium zinc tin oxide (ZrZnSnO), or a combination thereof, and wherein the channel contact portion comprises a second oxide semiconductor material of the first group and further comprises at least one dopant, wherein the at least one dopant comprises aluminum (Al), boron (B), arsenic (As), fluorine (F), or hydrogen (H), and wherein each of the dielectric film barrier liner and the mold barrier liner comprises the at least one dopant.

\* \* \* \* \*